United States Patent
Misaka

(10) Patent No.: US 7,618,754 B2
(45) Date of Patent: Nov. 17, 2009

(54) PATTERN FORMATION METHOD

(75) Inventor: Akio Misaka, Osaka (JP)

(73) Assignee: Panasonic Corporation, Osaka (JP)

( * ) Notice: Subject to any disclaimer, the term of this patent is extended or adjusted under 35 U.S.C. 154(b) by 160 days.

(21) Appl. No.: 12/003,474

(22) Filed: Dec. 26, 2007

(65) Prior Publication Data

US 2008/0113304 A1    May 15, 2008

Related U.S. Application Data

(62) Division of application No. 10/824,529, filed on Apr. 15, 2004, now Pat. No. 7,332,250.

(30) Foreign Application Priority Data

Jun. 24, 2003    (JP) .............................. 2003-179146

(51) Int. Cl.
    *G03F 9/00*    (2006.01)
(52) U.S. Cl. ......................................................... 430/5
(58) Field of Classification Search ............... 430/5, 430/322
    See application file for complete search history.

(56) References Cited

U.S. PATENT DOCUMENTS

| | | | |
|---|---|---|---|
| 5,478,678 A | 12/1995 | Yang et al. | |
| 7,060,398 B2 | 6/2006 | Misaka | |
| 2003/0027366 A1 | 2/2003 | Dulman et al. | |
| 2003/0203290 A1 | 10/2003 | Misaka | |
| 2003/0203291 A1 | 10/2003 | Misaka | |
| 2004/0121244 A1 | 6/2004 | Misaka | |

FOREIGN PATENT DOCUMENTS

| | | |
|---|---|---|
| JP | 5-165194 | 6/1993 |
| JP | 09-269590 A | 10/1997 |
| JP | 10-048806 A | 2/1998 |
| JP | 11-143047 | 5/1999 |
| JP | 2000-019710 A | 1/2000 |
| JP | 2003-203290 A1 | 10/2003 |
| JP | 2003-203291 A1 | 10/2003 |
| JP | 2004-121244 A1 | 6/2004 |

*Primary Examiner*—Kathleen Duda
*Assistant Examiner*—Brittany Raymond
(74) *Attorney, Agent, or Firm*—McDermott Will & Emery LLP

(57) ABSTRACT

The photomask of this invention includes, on a transparent substrate, a semi-shielding portion having a transmitting property against exposing light, a transparent portion having a transmitting property against the exposing light and surrounded with the semi-shielding portion, and an auxiliary pattern surrounded with the semi-shielding portion and provided around the transparent portion. The semi-shielding portion and the transparent portion transmit the exposing light in an identical phase with respect to each other. The auxiliary pattern transmits the exposing light in an opposite phase with respect to the semi-shielding portion and the transparent portion and is not transferred through exposure.

24 Claims, 32 Drawing Sheets

| Optimization of width of phase shifter | $G < 0.5 \times \lambda/NA$ $d = d0 \times (0.5+G)/(\lambda/NA)$ |

$G = 0.3 \times \lambda/NA$
$d = 0.8 \times d0$ $G = 0.2 \times \lambda/NA$
$d = 0.7 \times d0$ Optimum value of PW0: obtained when $0.4 \times \lambda/NA$ and $G < 0.5 \times \lambda/NA$ with d set to small value Since $P = 2 \times PW0 + G$, $P < 1.3 \times \lambda/NA$ with d set to small value $P < 1.3 \times \lambda/NA$
$d < d0$ $P < 1.3 \times \lambda/NA$
$d1 < 2 \times d0$ $P < 1.3 \times \lambda/NA$
$t2 \times d2 < t \times d0$ $P < 1.3 \times \lambda/NA$
$t3 \times d3 < 2 \times t \times d0$ $P < 1.3 \times \lambda/NA$
$t4 \times d4 < t \times d0$ $P < 1.15 \times \lambda/NA$
$d < d0$ $P < 1.15 \times \lambda/NA$
$d1 < 2 \times d0$ $P < 1.15 \times \lambda/NA$
$TT < \lambda/NA/2$
$d2 \times t/TT < 2 \times d0$ — P=450nm
--- P=390nm
-·- P=300nm $$PW(P) = PW0 + \Delta PW(P) \times PW0$$

— P=450nm
--- P=390nm
-·- P=300nm $$PW(P) = PW0 + \Delta PW(P) \times PW0$$

······ 2 × PWZ = 2 × PW0
——— 2 × PWZ = 1.2 × 2 × PW0

Resist pattern $Z = 270\,nm\,(\approx 0.1 \times \lambda/NA)$

[General exposure light source]

[Annular exposure light source]

[Quadrupole exposure light source]

[Annular/quadrupole exposure light source]

PATTERN FORMATION METHOD

RELATED APPLICATIONS

This application is a Divisional of U.S. application Ser. No. 10/824,529, filed Apr. 15, 2004, claiming priority of Japanese Application No. 10/824,529, filed Jun. 24, 2003 now U.S. Pat. No. 7,332,250, the entire contents of each of which are hereby incorporated by reference.

BACKGROUND OF THE INVENTION

The present invention relates to a photomask for use in fine pattern formation in the fabrication of a semiconductor integrated circuit device, a pattern formation method using the photomask and a method for creating mask data for the photomask.

Recently, there are increasing demands for thinning of circuit patterns in order to further increase the degree of integration of a large scale integrated circuit device (hereinafter referred to as the LSI) realized by using semiconductors. Accordingly, thinning of an interconnect pattern used in a circuit or thinning of a contact hole pattern (hereinafter referred to as the contact pattern) for mutually connecting multilayered interconnects having an insulating layer therebetween has become very significant.

Now, the thinning of an interconnect pattern using a conventional optical exposure system will be described on the assumption that the positive resist process is employed. In the positive resist process, a line pattern corresponds to a line-shaped resist film (a resist pattern) remaining correspondingly to an unexposed region of a resist after exposure using a photomask and subsequent development. Also, a space pattern corresponds to a resist removal portion (a resist removal pattern) corresponding to an exposed region of the resist. Furthermore, a contact pattern corresponds to a hole-shaped resist removal portion and can be regarded as a particularly fine space pattern. It is noted that when the negative resist process is employed instead of the positive resist process, the above-described definitions of a line pattern and a space pattern are replaced with each other.

In general, a fine pattern formation method using oblique incident exposure (off-axis illumination) designated as super-resolution exposure has been introduced for the thinning of an interconnect pattern. This method is good for thinning a resist pattern corresponding to an unexposed region of a resist and has an effect to improve the depth of focus of dense patterns periodically and densely arranged. However, this oblique incident exposure has substantially no effect to thin an isolated resist removal portion, and on the contrary, the contrast and the depth of focus of an image (optical image) are degraded when it is employed for an isolated resist removal portion. Therefore, the oblique incident exposure has been positively employed in pattern formation in which a resist removal portion has a larger dimension than a resist pattern, such as gate pattern formation.

On the other hand, it is known that a small light source including no oblique incident component and having a low degree of coherence is effectively used for forming an isolated fine resist removal portion like a fine contact pattern. In this case, the pattern can be more effectively formed by using an attenuated phase-shifting mask. In an attenuated phase-shifting mask, a phase shifter is used instead of a completely shielding portion as a shielding pattern for surrounding a transparent portion (an opening) corresponding to a contact pattern. The phase shifter has very low transmittance of approximately 3 through 6% against exposing light, and causes phase inversion of 180 degrees in the exposing light with respect to light passing through the opening.

Herein, the transmittance is effective transmittance obtained by assuming that a transparent substrate has transmittance of 100% unless otherwise mentioned. Also, a completely shielding film (a completely shielding portion) means a shielding film (a shielding portion) having effective transmittance lower than 1%.

Now, the principle of a conventional pattern formation method using an attenuated phase-shifting mask will be described with reference to FIGS. 32A through 32G.

FIG. 32A is a plan view of a photomask in which an opening corresponding to a contact pattern is formed in a chromium film formed on the mask surface as a completely shielding portion, and FIG. 32B shows the amplitude intensity obtained in a position corresponding to line AA' of light having passed through the photomask of FIG. 32A. FIG. 32C is a plan view of a photomask in which a chromium film corresponding to a contact pattern is formed in a phase shifter formed on the mask surface, and FIG. 32D shows the amplitude intensity obtained in a position corresponding to line AA' of light having passed through the photomask of FIG. 32C. FIG. 32E is a plan view of a photomask in which an opening corresponding to a contact pattern is formed in a phase shifter formed on the mask surface (namely, an attenuated phase-shifting mask), and FIGS. 32F and 32G respectively show the amplitude intensity and the light intensity obtained in a position corresponding to line AA' of light having passed through the photomask of FIG. 32E.

As shown in FIGS. 32B, 32D and 32F, the amplitude intensity of the light having passed through the attenuated phase-shifting mask of FIG. 32E is a sum of the amplitude intensities of the lights having passed through the photomasks of FIGS. 32A and 32C. In other words, in the attenuated phase-shifting mask of FIG. 32E, the phase shifter working as a shielding portion is formed not only so as to transmit light at low transmittance but also so as to cause an optical path difference (a phase difference) of 180 degrees in the light passing through the opening with respect to the light passing through the phase shifter. Therefore, as shown in FIGS. 32B and 32D, the light passing through the phase shifter has an amplitude intensity distribution in the opposite phase with respect to the light passing through the opening. Accordingly, when the amplitude intensity distribution of FIG. 32B and the amplitude intensity distribution of FIG. 32D are synthesized with each other, a phase boundary having amplitude intensity of 0 (zero) is obtained as a result of the phase change as shown in FIG. 32F. As a result, as shown in FIG. 32G, at an end of the opening corresponding to the phase boundary (hereinafter referred to as the phase end), the light intensity, which is expressed as a square of the amplitude intensity, is 0 (zero), and thus, a strongly dark part is formed. Therefore, in an image of the light having passed through the attenuated phase-shifting mask of FIG. 32E, very high contrast can be realized around the opening. However, this improved contrast is obtained in light vertically entering the mask, and more specifically, light entering the mask from a small light source region with a low degree of coherence. On the other hand, such improved contrast cannot be obtained even around the opening (namely, in the vicinity of the phase boundary where the phase change is caused) in employing the oblique incident exposure, such as exposure designated as annular illumination excluding a vertical incident component (an illumination component entering from the center of the light source (along the normal direction of the mask)). Furthermore, as compared with the case where the exposure is performed by using small light source with a low degree of coherence, the depth of focus is disadvantageously smaller when the oblique incident exposure is employed.

Moreover, in order to compensate the disadvantage of the attenuated phase-shifting mask in the oblique incident exposure such as the annular illumination, a method in which a small opening that is not resolved, namely, an auxiliary pattern, is formed around an opening (corresponding to an isolated contact pattern) of the attenuated phase-shifting mask has been proposed (for example, see Japanese Laid-Open Patent Publication No. 5-165194). Thus, a periodic light intensity distribution can be obtained, thereby improving the depth of focus.

As described above, in the case where a fine resist removal pattern such as a contact pattern is to be formed by the positive resist process, it is necessary to perform the exposure by using a combination of an attenuated phase-shifting mask and a small light source with a degree of coherence of approximately 0.5 or less, that is, illumination having a vertical incident component alone. This method is very effective for forming a fine isolated contact pattern.

In accordance with recent increase of the degree of integration of semiconductor devices, it has become necessary to form, as not only interconnect patterns but also contact patterns, isolated patterns and patterns densely arranged at a pitch corresponding to the wavelength. In such a case, in order to realize a large depth of focus in the formation of densely arranged contact patterns, the oblique incident exposure is effectively employed as in the formation of densely arranged interconnect patterns.

In other words, the oblique incident exposure is indispensable for the formation of dense interconnect patterns and dense contact patterns, but when the oblique incident exposure is employed, the contrast and the depth of focus of isolated contact patterns and isolated space patterns between interconnects are largely degraded. This degradation of the contrast and the depth of focus is more serious when an attenuated phase-shifting mask is used for improving the resolution.

On the contrary, when a small light source with a low degree of coherence is used for forming isolated fine contact patterns and isolated fine space patterns between interconnects, it is disadvantageously difficult to form dense patterns and fine line patterns.

Accordingly, there is a reciprocal relationship between the optimum illumination conditions for isolated fine space patterns and the optimum illumination conditions for densely arranged patterns or fine line patterns. Therefore, in order to simultaneously form fine resist patterns and fine isolated resist removal patterns, trade-off is considered between the effect of a vertical incident component and the effect of an oblique incident component of the light source. As a result, a light source with an intermediate degree of coherence (of approximately 0.5 through 0.6) is used. In this case, however, both the effects of the vertical incident component and the oblique incident component are cancelled, and therefore, it is difficult to realize a higher degree of integration of semiconductor devices by simultaneously thinning isolated line patterns or dense patterns and isolated space patterns.

It is noted that the aforementioned auxiliary pattern needs to be provided in a position away from an opening corresponding to a contact pattern at least by a distance corresponding to the wavelength of a light source (exposing light). Therefore, in the case where openings are arranged at a pitch ranging from the wavelength to a double of the wavelength, the auxiliary pattern cannot be used. In other words, the aforementioned method using the auxiliary pattern is not applicable to all arrangements ranging from the case where openings are arranged at a pitch substantially corresponding to the wavelength to the case where an opening is isolated.

SUMMARY OF THE INVENTION

In consideration of the aforementioned conventional disadvantages, an object of the invention is simultaneously thinning isolated space patterns and isolated line patterns or dense patterns.

In order to achieve the object, the photomask of this invention includes, on a transparent substrate, a semi-shielding portion having a transmitting property against exposing light; a transparent portion surrounded with the semi-shielding portion and having a transmitting property against the exposing light; and an auxiliary pattern surrounded with the semi-shielding portion and provided around the transparent portion. The semi-shielding portion and the transparent portion transmit the exposing light in an identical phase with respect to each other, and the auxiliary pattern transmits the exposing light in an opposite phase with respect to the semi-shielding portion and the transparent portion and is not transferred through exposure.

In the photomask of this invention, the transparent portion is preferably in the shape of a rectangle with a side smaller than $(0.8 \times \lambda \times M)/NA$, wherein $\lambda$ indicates a wavelength of the exposing light, and M and NA respectively indicate magnification and numerical aperture of a reduction projection optical system of a projection aligner. In this case, the auxiliary pattern is preferably a line-shaped pattern and has a center line thereof in a position away from the center of the transparent portion by a distance not less than $(0.3 \times \lambda \times M)/NA$ and not more than $(0.5 \times \lambda \times M)/NA$. Furthermore, the auxiliary pattern preferably has a width not less than $(0.05 \times \lambda \times M)/(NA \times T^{0.5})$ and not more than $(0.2 \times \lambda \times M)/(NA \times T^{0.5})$, wherein T indicates relative transmittance of the auxiliary pattern to the transparent portion. Alternatively, the auxiliary pattern is preferably a line-shaped pattern and has a center line thereof in a position away from the center of the transparent portion by a distance not less than $(0.365 \times \lambda \times M)/NA$ and not more than $(0.435 \times \lambda \times M)/NA$. In this case, the auxiliary pattern preferably has a width not less than $(0.1 \times \lambda \times M)/(NA \times T^{0.5})$ and not more than $(0.15 \times \lambda \times M)/(NA \times T^{0.5})$, wherein T indicates relative transmittance of the auxiliary pattern to the transparent portion.

In the photomask of this invention, the transparent portion is preferably in the shape of a line with a width smaller than $(0.65 \times \lambda \times M)/NA$, wherein $\lambda$ indicates a wavelength of the exposing light, and M and NA respectively indicate magnification and numerical aperture of a reduction projection optical system of a projection aligner. In this case, the auxiliary pattern is preferably a line-shaped pattern and has a center line thereof in a position away from the center of the transparent portion by a distance not less than $(0.25 \times \lambda \times M)/NA$ and not more than $(0.45 \times \lambda \times M)/NA$. Furthermore, the auxiliary pattern preferably has a width not less than $(0.05 \times \lambda \times M)/(NA \times T^{0.5})$ and not more than $(0.2 \times \lambda \times M)/(NA \times T^{0.5})$, wherein T indicates relative transmittance of the auxiliary pattern to the transparent portion. Alternatively, the auxiliary pattern is preferably a line-shaped pattern and has a center line thereof in a position away from the center of the transparent portion by a distance not less than $(0.275 \times \lambda \times M)/NA$ and not more than $(0.425 \times \lambda \times M)/NA$. In this case, the auxiliary pattern preferably has a width not less than $(0.1 \times \lambda \times M)/(NA \times T^{0.5})$ and not more than $(0.15 \times \lambda \times M)/(NA \times T^{0.5})$, wherein T indicates relative transmittance of the auxiliary pattern to the transparent portion.

In the photomask of this invention, the auxiliary pattern preferably includes a first auxiliary pattern that is adjacent to a different auxiliary pattern spaced by a given or smaller distance with the semi-shielding portion sandwiched therebetween and a second auxiliary pattern that is not adjacent to a different auxiliary pattern spaced by the given or smaller distance with the semi-shielding portion sandwiched therebetween, and the first auxiliary pattern preferably has a smaller width than the second auxiliary pattern. In this case, the first auxiliary pattern preferably includes a first pattern that is away from the adjacent different auxiliary pattern by a distance G1 and a second pattern that is away from the adjacent different auxiliary pattern by a distance G2, and in the case where $(0.5×\lambda×M)/NA>G1>G2$, the second pattern preferably has a smaller width than the first pattern, wherein $\lambda$ indicates a wavelength of the exposing light, and M and NA respectively indicate magnification and numerical aperture of a reduction projection optical system of a projection aligner. Furthermore, in this case, a difference between the width of the first pattern and the width of the second pattern is preferably in proportion to a difference between the distance G1 and the distance G2.

In the photomask of this invention, in the case where the transparent portion is in the shape of a rectangle with a side smaller than $(0.8×\lambda×M)/NA$, the photomask preferably further includes, on the transparent substrate, a second transparent portion adjacent to the transparent portion and spaced by a given or smaller distance, and the auxiliary pattern preferably includes a first auxiliary pattern disposed in an area sandwiched between the transparent portion and the second transparent portion and a second auxiliary pattern disposed in the other area, and the first auxiliary pattern preferably has a smaller area than the second auxiliary pattern. In this case, the given distance is preferably $(1.3×\lambda×M)/NA$.

In the photomask of this invention, in the case where the transparent portion is in the shape of a line with a width smaller than $(0.65×\lambda×M)/NA$, the photomask preferably further includes, on the transparent substrate, a second transparent portion adjacent to the transparent portion and spaced by a given or smaller distance, and the auxiliary pattern preferably includes a first auxiliary pattern disposed in an area sandwiched between the transparent portion and the second transparent portion and a second auxiliary pattern disposed in the other area, and the first auxiliary pattern preferably has a smaller width than the second auxiliary pattern. In this case, the given distance is preferably $(1.15×\lambda×M)/NA$.

In the photomask of this invention, in the case where the transparent portion is in the shape of a line with a width smaller than $(0.65×\lambda×M)/NA$, the photomask preferably further includes, on the transparent substrate, a second transparent portion adjacent to the transparent portion and spaced by a given or smaller distance, and the auxiliary pattern preferably includes a first auxiliary pattern disposed in an area sandwiched between the transparent portion and the second transparent portion and a second auxiliary pattern disposed in the other area, and the first auxiliary pattern preferably has a smaller area than the second auxiliary pattern. In this case, the given distance is preferably $(1.15×\lambda×M)/NA$.

In the photomask of this invention, in the case where the transparent portion is in the shape of a rectangle with a side smaller than $(0.8×\lambda×M)/NA$, the transparent portion is preferably close to a different transparent portion spaced by a distance of a given range at least along a first direction and is not close to a different transparent portion spaced by a distance of the given range at least along a second direction, the auxiliary pattern preferably includes a first auxiliary pattern disposed around the transparent portion along the first direction and a second auxiliary pattern disposed around the transparent portion along the second direction, and the first auxiliary pattern is preferably farther from the transparent portion than the second auxiliary pattern. In this case, the given range is preferably from $(1.15×\lambda×M)/NA$ to $(1.45×\lambda×M)/NA$.

In the photomask of this invention, in the case where the transparent portion is in the shape of a rectangle with a side smaller than $(0.8×\lambda×M)/NA$, the transparent portion is preferably close to a different transparent portion spaced by a distance of a given range at least along a first direction and is not close to a different transparent portion spaced by a distance of the given range at least along a second direction, the auxiliary pattern preferably includes a first auxiliary pattern disposed around the transparent portion along the first direction and a second auxiliary pattern disposed around the transparent portion along the second direction, and the first auxiliary pattern is preferably closer to the transparent portion than the second auxiliary pattern. In this case, the given range is preferably from $(0.85×\lambda×M)/NA$ to $(1.15×\lambda×M)/NA$.

In the photomask of this invention, in the case where the transparent portion is in the shape of a line with a width smaller than $(0.65×\lambda×M)/NA$, the transparent portion is preferably close to a different transparent portion spaced by a distance of a given range at least along a first direction and is not close to a different transparent portion spaced by a distance of the given range at least along a second direction, the auxiliary pattern preferably includes a first auxiliary pattern disposed around the transparent portion along the first direction and a second auxiliary pattern disposed around the transparent portion along the second direction, and the first auxiliary pattern is preferably farther from the transparent portion than the second auxiliary pattern. In this case, the given range is preferably from $(1.0×\lambda×M)/NA$ to $(1.3×\lambda×M)/NA$.

In the photomask of this invention, in the case where the transparent portion is in the shape of a line with a width smaller than $(0.65×\lambda×M)/NA$, the transparent portion is preferably close to a different transparent portion spaced by a distance of a given range at least along a first direction and is not close to a different transparent portion spaced by a distance of the given range at least along a second direction, the auxiliary pattern preferably includes a first auxiliary pattern disposed around the transparent portion along the first direction and a second auxiliary pattern disposed around the transparent portion along the second direction, and the first auxiliary pattern is preferably closer to the transparent portion than the second auxiliary pattern. In this case, the given range is preferably from $(0.7×\lambda×M)/NA$ to $(1.0×\lambda×M)/NA$.

In the photomask of this invention, the transparent portion is preferably in the shape of a line, the auxiliary pattern is preferably disposed in parallel to the transparent portion along a line direction of the transparent portion, and the transparent portion preferably has a line end protruded beyond the auxiliary pattern by a given or larger dimension along the line direction. In this case, the given dimension is preferably $(0.03×\lambda×M)/NA$, wherein $\lambda$ indicates a wavelength of the exposing light, and M and NA respectively indicate magnification and numerical aperture of a reduction projection optical system of a projection aligner.

In the photomask of this invention, the transparent portion is preferably in the shape of a line, the auxiliary pattern preferably includes a pair of first auxiliary patterns disposed in parallel to the transparent portion along a line direction of the transparent portion and sandwiching a line center part of the transparent portion and a pair of second auxiliary patterns disposed in parallel to the transparent portion along the line direction and sandwiching a line end part of the transparent portion, and a distance between the pair of second auxiliary patterns is preferably larger by a given or larger dimension than a distance between the pair of first auxiliary patterns. In this case, each of the pair of second auxiliary patterns preferably has a length along the line direction of $(0.03 \times \lambda \times M)/NA$ or more, wherein $\lambda$ indicates a wavelength of the exposing light, and M and NA respectively indicate magnification and numerical aperture of a reduction projection optical system of a projection aligner. Also, the given degree is preferably $(0.03 \times \lambda \times M)/NA$ or more.

In the photomask of this invention, the transparent portion is preferably formed by exposing the transparent substrate, the auxiliary pattern is preferably formed by depositing, on the transparent substrate, a first phase shift film that causes, in the exposing light, a phase difference in an opposite phase with respect to the transparent portion, and the semi-shielding portion is preferably formed by depositing, on the first phase shift film, a second phase shift film that causes, in the exposing light, a phase difference in an opposite phase with respect to the first phase shift film.

In the photomask of this invention, the transparent portion is preferably formed by exposing the transparent substrate, the auxiliary pattern is preferably formed by trenching the transparent substrate by a depth for causing, in the exposing light, a phase difference in an opposite phase with respect to the transparent portion, and the semi-shielding portion is preferably formed by depositing, on the transparent substrate, a semi-shielding film that transmits the exposing light in an identical phase with respect to the transparent portion.

In the photomask of this invention, the transparent portion is preferably formed by exposing the transparent substrate, the auxiliary pattern is preferably formed by trenching the transparent substrate by a depth for causing, in the exposing light, a phase difference in an opposite phase with respect to the transparent portion, and the semi-shielding portion is preferably formed by depositing, on the transparent substrate, a metal thin film that transmits the exposing light in an identical phase with respect to the transparent portion.

In the photomask of this invention, the auxiliary pattern is preferably formed by exposing the transparent substrate, the transparent portion is preferably formed by trenching the transparent substrate by a depth for causing, in the exposing light, a phase difference in an opposite phase with respect to the auxiliary pattern, and the semi-shielding portion is preferably formed by depositing, on the transparent substrate, a phase shift film that causes, in the exposing light, a phase difference in an opposite phase with respect to the auxiliary pattern.

The pattern formation method of this invention uses a photomask of this invention, and the pattern formation method includes the steps of forming a resist film on a substrate; irradiating the resist film with the exposing light through the photomask, and forming a resist pattern by developing the resist film after irradiation with the exposing light.

The mask data creation method of this invention is employed for creating mask data for a photomask including a mask pattern formed on a transparent substrate and a transparent portion of the transparent substrate where the mask pattern is not formed. Specifically, the mask data creation method includes the steps of determining an internal distance and a width of outline shifters on the basis of a desired exposed region of a resist formed by irradiating the resist with exposing light through the photomask; providing the transparent portion inside the outline shifters; setting the transparent portion as a CD adjustment pattern; providing a semi-shielding portion for transmitting the exposing light in an identical phase with respect to the transparent portion in such a manner that the transparent portion and the outline shifters are surrounded with the semi-shielding portion; setting the outline shifters as phase shifters that transmit the exposing light in an opposite phase with respect to the transparent portion; predicting, through simulation, a dimension of a resist pattern formed by using the mask pattern including the phase shifters and the semi-shielding portion; and when the predicted dimension of the resist pattern does not accord with a desired dimension, deforming the mask pattern by deforming the CD adjustment pattern. In this method, the step of determining an internal distance and a width of outline shifters preferably includes a sub-step of changing the width of the outline shifters in accordance with a distance between the outline shifters. Furthermore, the step of determining an internal distance and a width of outline shifters preferably includes a sub-step of changing the internal distance of the outline shifters in accordance with a close relationship between desired exposed regions.

According to this invention, contrast of a light intensity distribution between a transparent portion and an auxiliary pattern can be emphasized by utilizing mutual interference between light passing through the transparent portion and light passing through the auxiliary pattern. Also, this effect to emphasize the contrast can be attained also in the case where a fine isolated space pattern corresponding to the transparent portion is formed by, for example, the positive resist process using the oblique incident exposure. Accordingly, an isolated space pattern and an isolated line pattern or dense patterns can be simultaneously thinned by employing the oblique incident exposure. Furthermore, even in the case where complicated and fine space patterns are close to each other, a pattern with a desired dimension can be satisfactorily formed.

Herein, having a transmitting property against exposing light means having transmittance sufficiently high for sensitizing a resist, and having a shielding property against exposing light means having too low transmittance to sensitize a resist. Furthermore, an identical phase means a phase difference not less than $(-30+360 \times n)$ degrees and not more than $(30+360 \times n)$ degrees, and an opposite phase means a phase difference not less than $(150+360 \times n)$ degrees and not more than $(210+360 \times n)$ degrees (wherein n is an integer).

DETAILED DESCRIPTION OF THE INVENTION (Prerequisites)

Figure 1A:
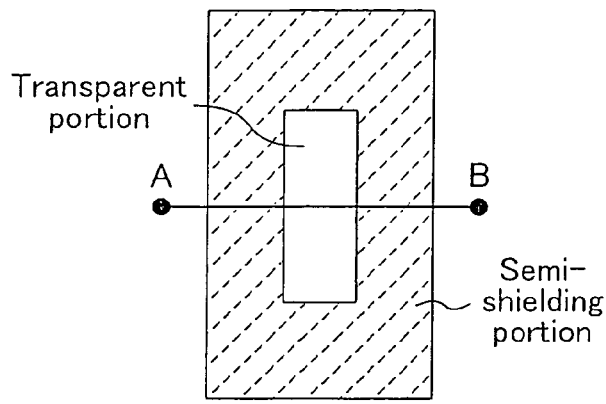
FIGS. 1A, 1B, 1C, 1D, 1E, 1F and 1G are diagrams for explaining the principle of an outline enhancement method of this invention.

Prerequisites for describing preferred embodiments of the invention will be first described.

Since a photomask is generally used in a reduction projection type aligner, it is necessary to consider a reduction ratio in arguing a pattern dimension on the mask. However, in order to avoid confusion, in the description of each embodiment below, when a pattern dimension on a mask is mentioned in correspondence to a desired pattern to be formed (such as a resist pattern), a value obtained by converting the pattern dimension by using a reduction ratio (magnification) is used unless otherwise mentioned. Specifically, also in the case where a resist pattern with a width of 100 nm is formed by using a mask pattern with a width of M×100 nm in a 1/M reduction projection system, the width of the mask pattern and the width of the resist pattern are both described as 100 nm.

Also, in each embodiment of the invention, M and NA respectively indicate a reduction ratio and numerical aperture of a reduction projection optical system of an aligner and λ indicates the wavelength of exposing light unless otherwise mentioned.

Moreover, pattern formation is described in each embodiment on the assumption that the positive resist process for forming a resist pattern correspondingly to an unexposed region of a resist is employed. In the case where the negative resist process is employed instead of the positive resist process, since an unexposed region of a resist is removed in the negative resist process, a resist pattern of the positive resist process is replaced with a space pattern.

Moreover, a photomask described in each embodiment is assumed to be a transmission mask. In the case where the photomask is applied to a reflection mask, since a transparent region and a shielding region of a transmission mask respectively correspond to a reflection region and a non-reflection region, the transmission phenomenon of the transmission mask is replaced with the reflection phenomenon. Specifically, a transparent portion or a transparent region of a transmission mask is replaced with a reflection portion or a reflection region, and a shielding portion is replaced with a non-reflection portion. Furthermore, a region partially transmitting light in a transmission mask is replaced with a portion partially reflecting light, and the transmittance is replaced with reflectance.

(Outline Enhancement Method)

First, a resolution improving method by using a photomask devised by the present inventor for realizing the present invention, that is, an "outline enhancement method" for improving the resolution of an isolated space pattern, will be described.

The following description is given in assuming formation of a space pattern by the positive resist process. It is noted that the "outline enhancement method" has the principle holding good regardless of the shape of a pattern as far as the pattern is a fine space pattern formed by the positive resist process. Also, the "outline enhancement method" is similarly applicable to the negative resist process by replacing a fine space pattern (resist removal pattern) of the positive resist process with a fine pattern (resist pattern).

FIGS. 1A through 1G are diagrams for explaining the principle for emphasizing the contrast of a transferred image of light in exposure performed for forming a space pattern.

Figure 1B:
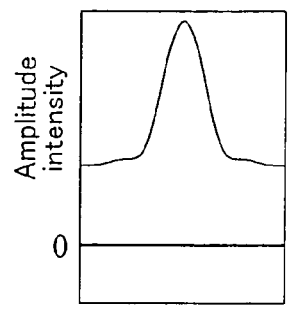

FIG. 1A is a plan view of a photomask in which an opening (i.e., a transparent portion) corresponding to a space pattern is surrounded with a semi-shielding portion with given transmittance against exposing light, and FIG. 1B shows the amplitude intensity obtained in a position corresponding to line AB of light having passed through the photomask of FIG. 1A.

Figure 1C:
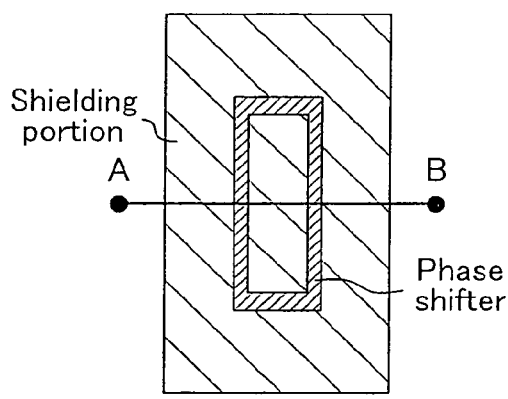
Figure 1D:
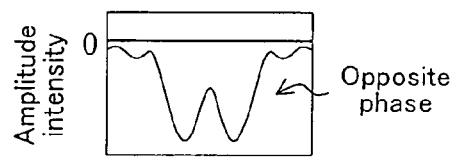

FIG. 1C is a plan view of a photomask in which a phase shifter is provided around an opening and a completely shielding portion is provided in the remaining area, and FIG. 1D shows the amplitude intensity obtained in a position corresponding to line AB of light having passed through the photomask of FIG. 1C. Since the amplitude intensity shown in FIG. 1D is obtained with respect to the light passing through the phase shifter, it is in the opposite phase to the light amplitude intensity shown in FIG. 1B.

Figure 1E:
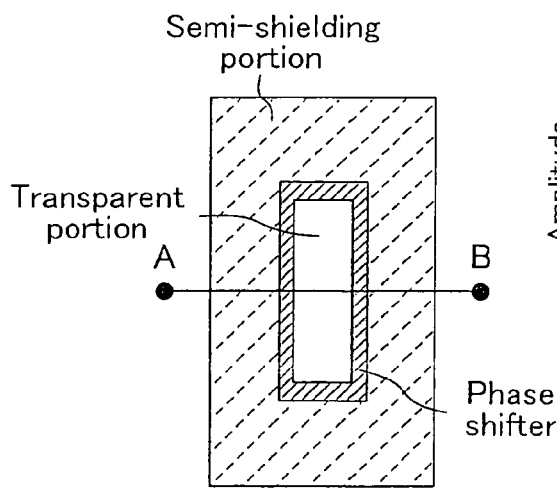
Figure 1F:
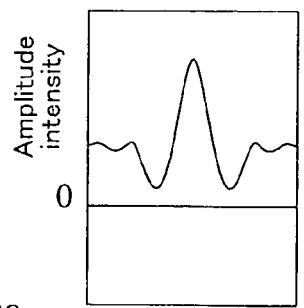
Figure 1G:
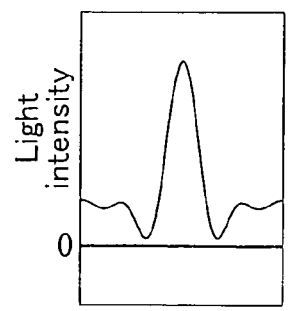

FIG. 1E is a plan view of a photomask in which an opening corresponding to a space pattern and a phase shifter provided around the opening are surrounded with a semi-shielding portion with given transmittance against exposing light, and FIGS. 1F and 1G respectively show the amplitude intensity and the light intensity (which is a square of the amplitude intensity) obtained in a position corresponding to line AB of light having passed through the photomask of FIG. 1E. The photomask of FIG. 1E is obtained by providing a phase shifter around the opening of the photomask of FIG. 1A. Among these photomasks, the photomask of FIG. 1E is an example of a photomask according to the present invention for realizing the "outline enhancement method" (hereinafter referred to as the outline enhancement mask).

In the photomask of FIG. 1A or 1E, there is a relationship of an identical phase between light passing through the semi-shielding portion and light passing through the opening (specifically, a relationship that a phase difference between these lights is not less than (−30+360×n) degrees and not more than (30+360×n) degrees (wherein n is an integer)). Also, in the photomask of FIG. 1E, there is a relationship of the opposite phases between light passing through the phase shifter and light passing through the opening (specifically, a relationship that a phase difference between these lights is not less than (150+360×n) degrees and not more than (210+360×n) degrees (wherein n is an integer)).

A transferred image of the light having passed through the outline enhancement mask of FIG. 1E is emphasized through the following principle: The structure of the photomask of FIG. 1E is obtained by combining the photomasks of FIGS. 1A and 1C. Accordingly, as shown in FIGS. 1B, 1D and 1F, the amplitude intensity of the light having passed through the photomask of FIG. 1E has a distribution obtained by combining the amplitude intensities of the lights respectively having passed through the photomasks of FIGS. 1A and 1C. At this point, as is understood from FIG. 1F, the light having passed through the phase shifter provided around the opening in the photomask of FIG. 1E can partially cancel the lights respectively having passed through the opening and the semi-shielding portion. Accordingly, when the intensity of the light passing through the phase shifter is adjusted so as to cancel light passing through a periphery of the opening in the photomask of FIG. 1E, a dark part in which the light intensity obtained in the periphery of the opening is reduced to approximately 0 (zero) can be formed in the light intensity distribution as shown in FIG. 1G.

In the photomask of FIG. 1E, the light passing through the phase shifter strongly cancels the light passing through the periphery of the opening and weakly cancels light passing through the center of the opening. As a result, as shown in FIG. 1G, it is possible to attain an effect that the gradient of the profile of the light intensity distribution changing from the center of the opening to the periphery of the opening can be increased. Accordingly, the intensity distribution of the light passing through the photomask of FIG. 1E achieves a sharp profile, resulting in forming an image with high contrast.

This is the principle of the emphasis of an optical image (an image of light intensity) according to the present invention. Specifically, since the phase shifter is provided along the outline of the opening in the mask composed of the semi-shielding portion with low transmittance, a very dark part corresponding to the outline of the opening can be formed in the light intensity image formed by using the photomask of FIG. 1A. Accordingly, a light intensity distribution in which contrast between the light intensity obtained in the opening and the light intensity obtained in the periphery of the opening is emphasized can be attained. Herein, a method for emphasizing an image through this principle is designated as the "outline enhancement method", and a photomask for realizing this principle is designated as the "outline enhancement mask".

Figure 32A:
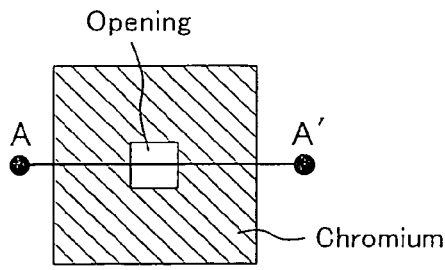
FIGS. 32A, 32B, 32C, 32D, 32E, 32F and 32G are diagrams for explaining the principle of a conventional pattern formation method using an attenuated phase-shifting mask.
Figure 32B:
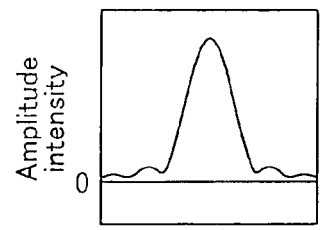
Figure 32C:
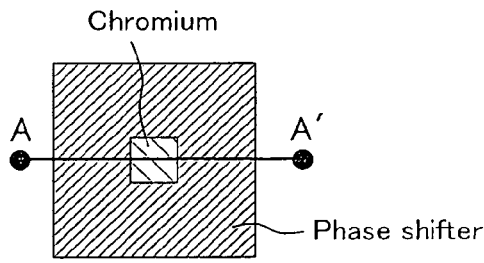
Figure 32D:
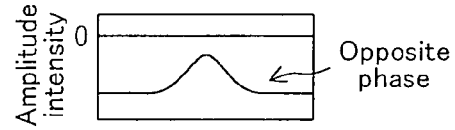
Figure 32E:
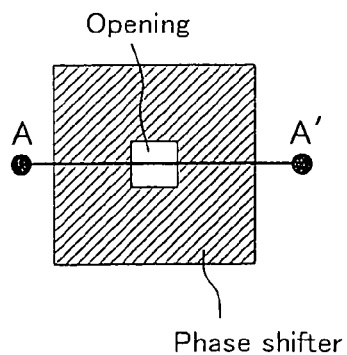
Figure 32F:
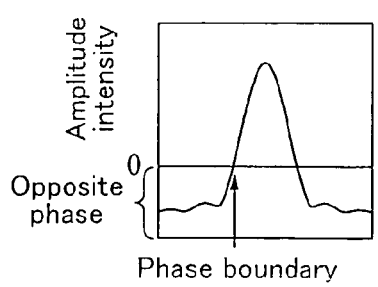
Figure 32G:
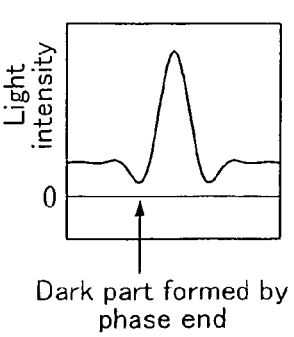

When the outline enhancement method is compared with the conventional principle of an attenuated phase shifter (see FIGS. 32A through 32G), the outline enhancement method is different from the conventional principle in mechanism for forming the dark part in the periphery of the opening in the light intensity distribution. As is understood from comparison between FIG. 1F and FIG. 32F, the dark part in the amplitude intensity distribution is formed by the phase boundary in the conventional attenuated phase shifter. In contrast, in the outline enhancement method, the dark part in the amplitude intensity distribution is formed as a result of periodical change of the amplitude intensity in the identical phase. Also, the dark part formed by the phase boundary in the conventional attenuated phase shifter cannot be sufficiently emphasized through the oblique incident exposure, and therefore, the conventional attenuated phase shifter should be combined with exposure using a small light source with a low degree of coherence. In contrast, the dark part formed through the periodical change of the amplitude intensity in the identical phase in the outline enhancement method is equivalent to a dark part formed by using a general pattern in which general transparent portions and shielding portions are periodically arranged, and therefore, the contrast of the light intensity distribution can be emphasized by combining the outline enhancement method and the oblique incident exposure. In other words, the effect of the outline enhancement method can be more remarkably exhibited when combined with the oblique incident exposure.

In the outline enhancement mask, the maximum transmittance of the semi-shielding portion is preferably approximately 15% for preventing the thickness of a resist film from reducing in pattern formation or for optimizing the resist sensitivity. In other words, the transmittance of the semi-shielding portion is preferably approximately 15% or less in the outline enhancement mask. Furthermore, the semi-shielding portion needs to have a property to partially transmit light, and in order to sufficiently attain the effect to substantially transmit light, the transmittance of the semi-shielding portion is preferably at least 3% or more and more preferably 6% or more. Accordingly, the optimum transmittance of the semi-shielding portion of the outline enhancement mask is not less than 6% and not more than 15%.

Although the outline enhancement method has been described on the assumption that the phase shifter is provided on the boundary between the semi-shielding portion and the transparent portion (i.e., the opening) surrounded with the semi-shielding portion, it is not always necessary to provide the phase shifter on the boundary. Specifically, as far as the phase shifter is provided in a position for enabling interference with light passing through the transparent portion through the principle of the outline enhancement method, the light having passed through the periphery of the transparent portion can be cancelled. Accordingly, the phase shifter may be provided in a position away from, for example, each side of a rectangular opening disposed in the semi-shielding portion as a pattern parallel to each side. However, in order to effectively utilize the outline enhancement method, the phase shifter is preferably provided in a position away from the opening by a distance not more than $0.5 \times \lambda/NA$, which is a distance for causing light interference. Furthermore, when the semi-shielding portion with a sufficient width (i.e., a width not less than $\lambda/NA$) is provided outside the phase shifter surrounding the transparent portion, a completely shielding portion may be provided outside the semi-shielding portion.

Now, preferred embodiments each for realizing a desired pattern by using a mask obtained on the basis of the principle of the outline enhancement method will be described.

EMBODIMENT 1

A photomask according to Embodiment 1 of the invention will now be described with reference to the accompanying drawings.

Figure 2A:
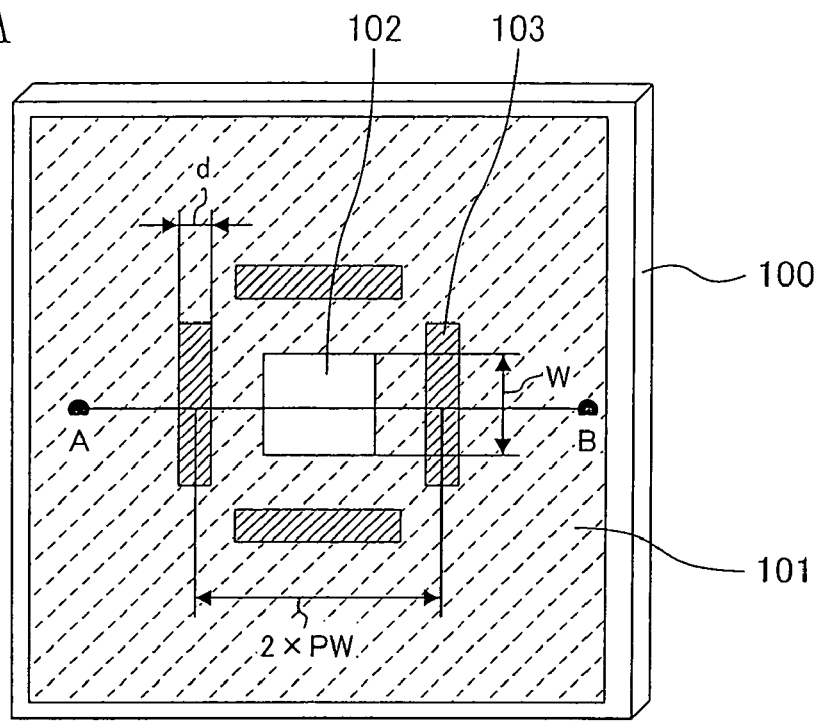
FIG. 2A is a plan view of a photomask according to Embodiment 1 of the invention and FIG. 2B is a diagram of a light intensity distribution formed on a wafer through exposure using the photomask of FIG. 2A.

FIG. 2A is a plan view of the photomask of Embodiment 1 (whereas a transparent substrate is perspectively shown, and this applies to similar drawings mentioned below). The photomask of this embodiment is used for forming a fine contact pattern.

As shown in FIG. 2A, a semi-shielding portion 101 covering a sufficiently large area is formed on a transparent substrate 100. Also, an opening pattern corresponding to a transparent portion 102 is formed in the semi-shielding portion 101 in a position corresponding to a desired contact pattern to be formed on a wafer through exposure. Furthermore, auxiliary patterns corresponding to phase shifters 103 are provided around the transparent portion 102 with the semi-shielding portion 101 sandwiched therebetween, for example, so as to be parallel to respective sides of the transparent portion 102 in a square shape or a rectangular shape. In other words, the phase shifters 103 are provided so as to surround the transparent portion 102.

In this embodiment, the semi-shielding portion 101 partially transmits light, and there is a relationship of the identical phase between light passing through the semi-shielding portion 101 and light passing through the transparent portion 102 (more specifically, a relationship that a phase difference between these lights is not less than $(-30+360 \times n)$ degrees and not more than $(30+360 \times n)$ degrees (wherein n is an integer)). Also, the semi-shielding portion 101 preferably has transmittance sufficiently low not to sensitize a resist, and specifically, the semi-shielding portion 101 has transmittance of 15% or less. On the other hand, in order to allow the semi-shielding portion 101 to have a different property from the transparent portion 102, the semi-shielding portion 101 has transmittance preferably not less than 3% and more preferably not less than 6%. In particular, in forming a contact hole, the optimum transmittance of the semi-shielding portion 101 is approximately 9%.

On the other hand, the phase shifter 103 transmits light, and there is a relationship of the opposite phase between light passing through the phase shifter 103 and light passing through the transparent portion 102 (specifically, a relationship that a phase difference between these lights is not less than $(150+360 \times n)$ degrees and not more than $(210+360 \times n)$ degrees (wherein n is an integer)). It is noted that in all embodiments mentioned below and including this embodiment, the phase shifter is regarded to have transmittance equivalent to that of the transparent portion (the transparent substrate) unless otherwise mentioned but the transmittance of the phase shifter is not herein particularly specified. However, in order to utilize the characteristic of the phase shifter to transmit light in the opposite phase, the transmittance of the phase shifter is preferably larger than at least the transmittance of the semi-shielding portion. Also, in order to efficiently realize the principle of the outline enhancement method, the transmittance of the phase shifter is preferably 50% or more.

Furthermore, assuming that an optical system using the photomask of FIG. 2A has exposure wavelength $\lambda$ and numerical aperture NA, in the most preferable structure for forming a fine contact hole, a distance between the center lines of the phase shifters 103 opposing each other with the transparent portion 102 sandwiched therebetween is $0.8 \times \lambda/NA$ as described in detail later. In other words, each phase shifter 103 is optimally provided in a position where the center line of the phase shifter 103 is away from the center of the transparent portion 102 by a distance of $0.4 \times \lambda/NA$. Furthermore, when the transmittance of the phase shifter 103 is set to be the same as the transmittance of the transparent portion 102, the width of the phase shifter 103 is optimally set to $0.15 \times \lambda/NA$.

Also, in each of all the embodiments described below, the aforementioned description is applied to a semi-shielding portion, a transparent portion and a phase shifter (an auxiliary pattern).

Now, a good pattern formation characteristic of the photomask with the aforementioned structure exhibited in forming a fine contact hole, and more particularly, in forming a pattern with a dimension of 0.4×λ/NA or less will be described on the basis of a result of simulation.

It is assumed in the simulation that the transparent portion 102 is in the shape of a square having a side dimension W, that each phase shifter 103 is a rectangular pattern with a width d and that the center line of each phase shifter 103 is disposed in a position away from the center of the transparent portion 102 by a distance PW in the photomask of FIG. 2A. In other words, a distance between a pair of opposing phase shifters 103 provided with the transparent portion 102 sandwiched therebetween is 2×PW. Also, it is assumed that the semi-shielding portion 101 working as the background has transmittance of 9%. Under these conditions, the light intensity is simulated with respect to various combinations of the dimension W, the distance PW and the width d. In this simulation, optical calculation is carried out on the assumption that the exposure is carried out with a wavelength λ of 193 nm and the numerical aperture NA of 0.7. Furthermore, ⅔ annular illumination having the outer diameter with a degree of coherence of 0.8 and the inner diameter with a degree of coherence of 0.53 is assumed to be used.

Figure 2B:
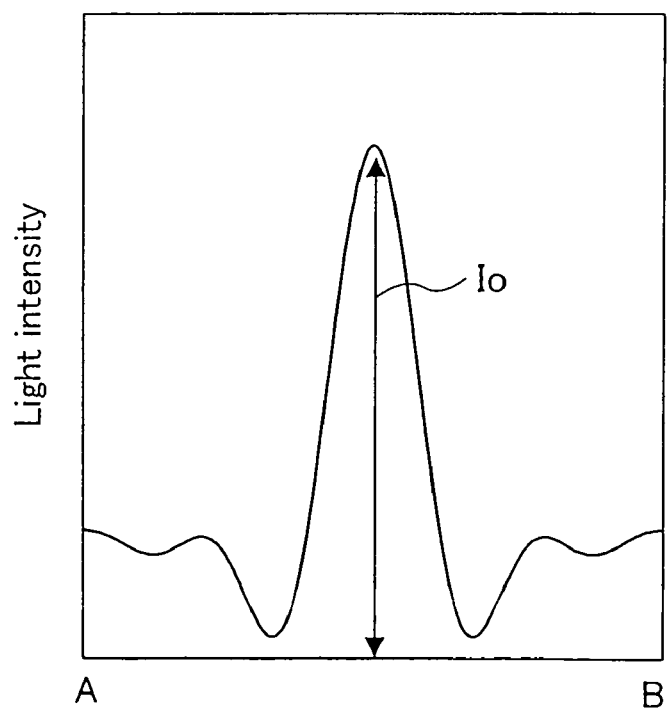

FIG. 2B shows a light intensity distribution formed on a wafer (in a position corresponding to line AB of FIG. 2A) through the exposure using the photomask of FIG. 2A. The light intensity distribution of FIG. 2B has a profile with a peak in a position corresponding to the center of the transparent portion 102. In this case, it is necessary for the peak intensity Io to be not less than a given value in order to sensitize a resist corresponding to the center of the transparent portion 102. The peak intensity Io necessary for sensitizing the resist depends upon the used resist material, and it has been experimentally found that the peak intensity Io necessary for forming a fine contact hole with a size of 0.4×λ/NA or less is approximately 0.25. It is noted that light intensity mentioned herein is expressed as relative light intensity obtained by assuming that the light intensity of the exposing light is 1 unless otherwise mentioned.

Figure 3A:
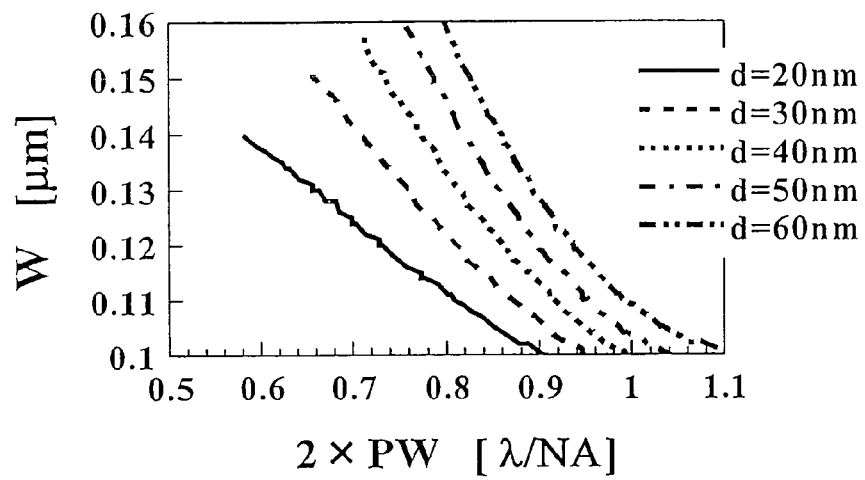
FIG. 3A is a graph of a result of simulation performed for obtaining a combination of a dimension W, a distance PW and a width d for attaining peak intensity Io of 0.25 in the photomask of FIG. 2A.

FIG. 3A shows the combinations of the dimension W, the distance PW and the width d for attaining the peak intensity Io of 0.25 in the photomask of FIG. 2A obtained as a result of the simulation. Specifically, FIG. 3A is obtained by plotting the dimension W of the transparent portion 102 for attaining the peak intensity Io of 0.25 against the distance 2×PW between the center lines of the pair of opposing phase shifters 103 provided with the transparent portion 102 sandwiched therebetween (hereinafter simply referred to as the shifter center line distance). Also, FIG. 3A shows the relationships between the shifter center line distance 2×PW and the dimension W respectively obtained when the width d of the phase shifter 103 is 20 nm, 30 nm, 40 nm, 50 nm and 60 nm. In other words, the light intensity distribution having the peak intensity Io of 0.25 can be formed by employing any of all the combinations of the distance PW, the dimension W and the width d shown in the graph of FIG. 3A. Furthermore, among these combinations, one having the maximum depth of focus or the maximum exposure margin corresponds to a mask structure having a good pattern formation characteristic.

Figure 3B:
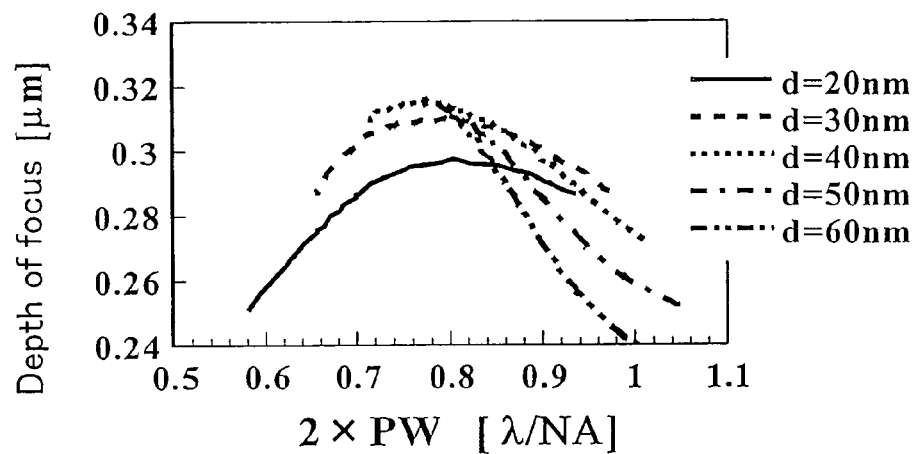
FIG. 3B is a diagram of a result of simulation for a depth of focus in which a contact hole with a size of 100 nm is formed by using a mask pattern having the combination of the distance PW, the dimension W and the width d shown in the graph of FIG. 3A.

FIG. 3B shows a result of simulation for the depth of focus in which a contact hole with a size of 100 nm is formed by using a mask pattern having the combination of the distance PW, the dimension W and the width d shown in the graph of FIG. 3A. In FIG. 3B, the abscissa indicates the shifter center line distance 2×PW and the value of the depth of focus is plotted by using the width d as a parameter on the ordinate. As shown in FIG. 3B, with respect to all the values of the width d, the depth of focus has the maximum value when the shifter center line distance 2×PW has a value in the vicinity of 0.8×λ/NA (=approximately 220 nm). At this point, the depth of focus means the width of a range of a focus position for attaining, in forming a contact hole with a target size of 100 nm, dimension variation of 10% or less of the target size.

Figure 3C:
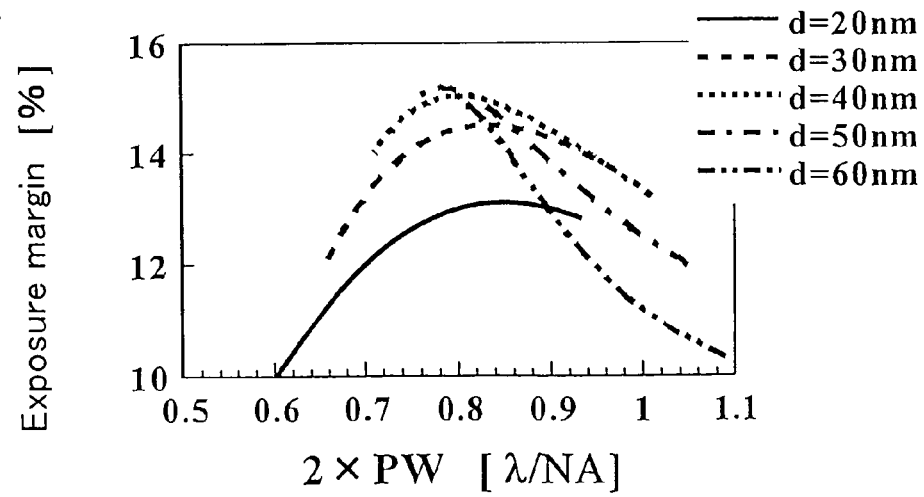
FIG. 3C is a diagram of a result of simulation for an exposure margin in which a contact hole with a size of 100 nm is formed by using the mask pattern having the combination of the distance PW, the dimension W and the width d shown in the graph of FIG. 3A.

Similarly, FIG. 3C shows a result of simulation for the exposure margin in which a contact hole with a size of 100 nm is formed by using a mask pattern having the combination of the distance PW, the dimension W and the width d shown in the graph of FIG. 3A. In FIG. 3C, the abscissa indicates the shifter center line distance 2×PW and the value of the exposure margin is plotted by using the width d as a parameter on the ordinate. As shown in FIG. 3C, regardless of the value of the width d, the exposure margin has the maximum value when the shifter center line distance 2×PW has a value in the vicinity of 0.8×λ/NA (=approximately 220 nm). At this point, the exposure margin means a ratio in percentage of the width of a range of exposure energy for attaining, in forming a contact hole with a target size of 100 nm, dimension variation of 10% or less of the target size to the value of exposure energy for realizing a contact hole with a size of 100 nm.

Specifically, in the photomask of FIG. 2A, no matter what value the width d of the phase shifter has, the shifter center line distance 2×PW is approximately 0.8×λ/NA when the depth of focus for forming a fine contact pattern is optimized. Also when the exposure margin is optimized, the shifter center line distance 2×PW is approximately 0.8×λ/NA. At this point, that the optimum value of the shifter center line distance 2×PW does not depend upon the width d of the phase shifter means that the optimum value does not depend upon the transmittance of the phase shifter either.

In phase shifters having the shifter center line distance 2×PW of 0.8×λ/NA, both of the depth of focus and the exposure margin have large values when the width d of each phase shifter is approximately 0.15×λ/NA (=40 nm). On the basis of these results, it is found that a mask structure in which the phase shifters 103 are provided to oppose each other with the transparent portion 102 sandwiched therebetween, each phase shifter 103 has a width of 0.15×λ/NA and the shifter center line distance is 0.8×λ/NA is good at fine contact hole formation.

Furthermore, referring to the graphs of FIGS. 3B and 3C in detail, it is understood that a large depth of focus and a large exposure margin can be attained as far as the width d of the phase shifter is not less than 0.05×λ/NA and not more than 0.2×λ/NA. Also, it is understood that a large depth of focus and a large exposure margin can be attained as far as the shifter center line distance is not less than 0.6×λ/NA and not more than λ/NA (namely, the distance between the center line of the phase shifter and the center of the transparent portion is not less than 0.3×λ/NA and not more than 0.5×λ/NA). Furthermore, in order to attain a depth of focus and an exposure margin approximate to their maximum values, the width d of the phase shifter is preferably not less than 0.1×λ/NA and not more than 0.15×λ/NA, and the shifter center line distance is preferably not less than 0.73×λ/NA and not more than 0.87×λ/NA (namely, the distance between the center line of the phase shifter and the center of the transparent portion is preferably not less than 0.365×λ/NA and not more than 0.435×λ/NA).

Figure 4A:
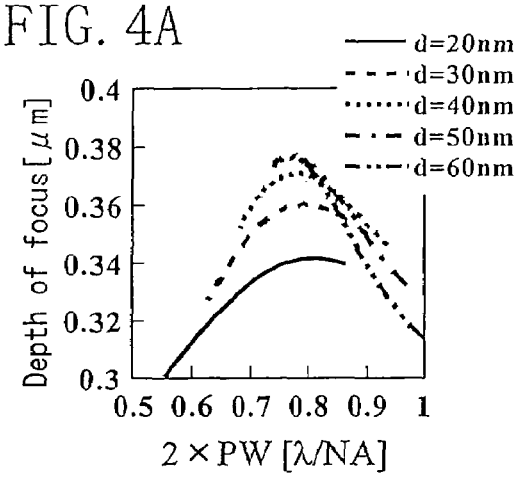
FIGS. 4A, 4C and 4E are diagrams of results of simulation for a depth of focus in which a contact hole with a size of 100 nm is formed by using the photomask of Embodiment 1 of the invention.
Figure 4B:
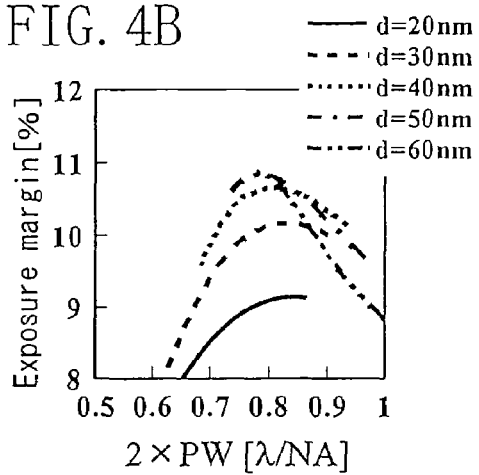
FIGS. 4B, 4D and 4F are diagrams of results of simulation for an exposure margin in which a contact hole with a size of 100 nm is formed by using the photomask of Embodiment 1 of the invention.
Figure 4C:
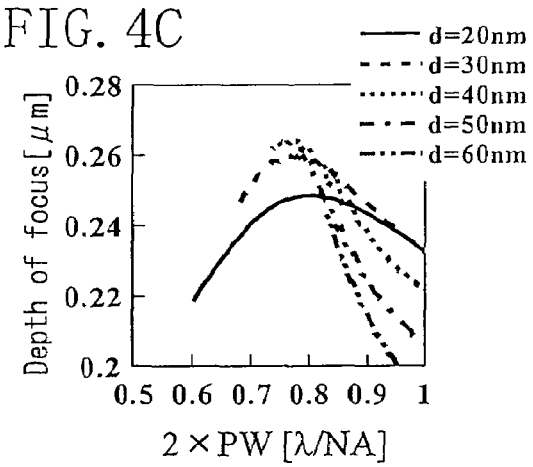
Figure 4D:
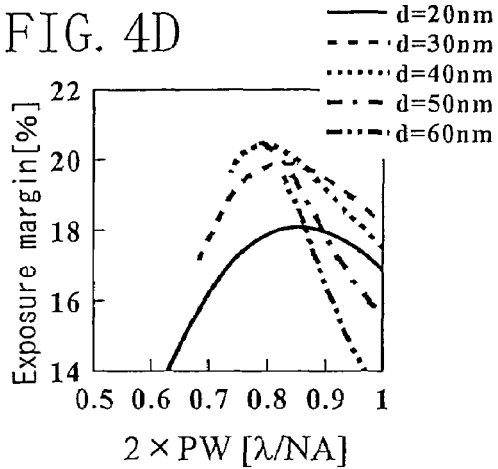

The results shown in FIGS. 3B and 3C are described as data obtained in the exemplified case where the numerical aperture NA is 0.7, and results obtained through simulation where the numerical aperture NA is 0.6 and 0.8 are shown in FIGS. 4A through 4D. FIGS. 4A and 4B show the results of the simulation where the numerical aperture NA is 0.6, and as shown in these graphs, the depth of focus and the exposure margin both have the maximum values when the shifter center line distance 2×PW is approximately 0.8×λ/NA (=approximately 250 nm). Also, FIGS. 4C and 4D show the results of the simulation where the numerical aperture NA is 0.8, and as shown in these graphs, the depth of focus and the exposure margin both have the maximum values when the shifter center line distance 2×PW is approximately 0.8×λ/NA (=approximately 190 nm). Thus, the aforementioned optimum mask structure does not depend upon the value of the numerical aperture NA.

Figure 4E:
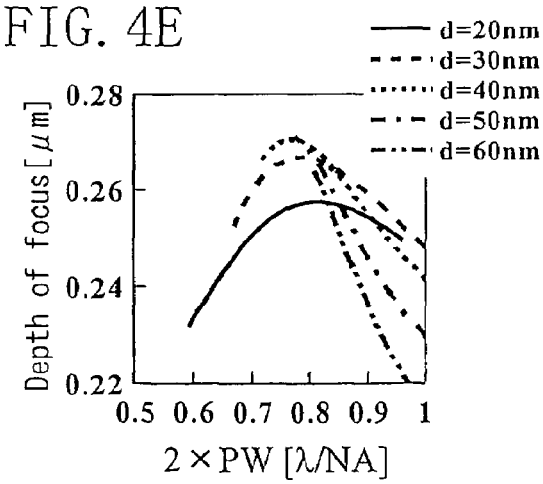
Figure 4F:
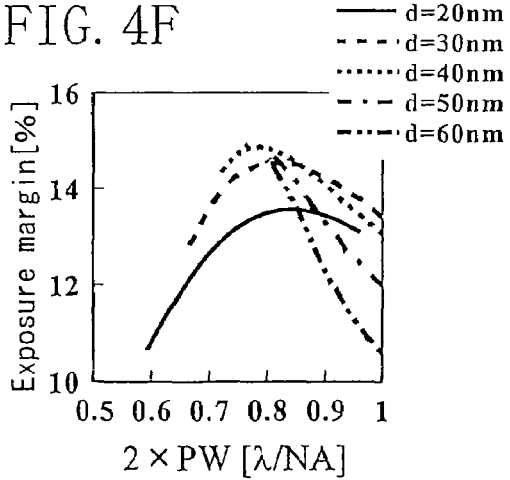

Furthermore, the results shown in FIGS. 3B and 3C are obtained through the simulation where the semi-shielding portion has transmittance of 9%, and results of simulation where the semi-shielding portion has transmittance of 6% are shown in FIGS. 4E and 4F. As shown in FIGS. 4E and 4F, similarly to the case where the semi-shielding portion has transmittance of 9%, the depth of focus and the exposure margin both have the maximum values when the shifter center line distance 2×PW is approximately 0.8×λ/NA (=approximately 250 nm). Thus, the aforementioned optimum mask structure does not depend upon the transmittance of the semi-shielding portion.

As described so far, assuming that the exposure wavelength is λ and the numerical aperture of the exposure system is NA, a photomask usable for forming a fine contact hole pattern with the maximum depth of focus and the maximum exposure margin can be obtained in the structure in which an opening corresponding to a transparent portion is provided in a semi-shielding portion, each of phase shifters surrounding the opening has a width d of 0.15×λ/NA and each phase shifter is provided so as to have its center line away from the center of the transparent portion by a distance of 0.4×λ/NA. It is noted that the phase shifter has equivalent transmittance to the transparent portion and the maximum value of the width d of the phase shifter is 0.15×λ/NA in this embodiment. In the case where the phase shifter has transmittance different from that of the transparent portion, namely, in the case where the effective relative transmittance of the phase shifter (the auxiliary pattern) to the transparent portion is not 1, the width of the phase shifter is changed in accordance with the relative transmittance for realizing an equivalent transmitting property. Specifically, assuming that the relative transmittance is T, the width d of the phase shifter is optimally set to $(0.15×λ)/(NA×T^{0.5})$. However, the optimum distance from the center of the transparent portion to the center line of the phase shifter is 0.4×λ/NA regardless of the transmittance and the width of the phase shifter.

Furthermore, the width d of the phase shifter is preferably not less than $(0.05×λ)/(NA×T^{0.5})$ and not more than $(0.2×λ)/(NA×T^{0.5})$, and more preferably not less than $(0.1×λ)/(NA×T^{0.5})$ and not more than $(0.15×λ)/(NA×T^{0.5})$.

In this manner, the optimum position of the phase shifter provided as the auxiliary pattern (i.e., the optimum position of its center line) on the basis of the outline enhancement method is a position away from the center of the transparent portion by a distance with a value not more than the wavelength λ of the exposing light in this embodiment. Accordingly, differently from the conventional technique where an auxiliary pattern should be provided in a position away from the center of a transparent portion by a distance with a value not less than the wavelength λ, an auxiliary pattern can be provided also between densely arranged transparent portions (corresponding to contact patterns) by utilizing the outline enhancement method.

In other words, according to this embodiment, the contrast of the light intensity distribution between the transparent portion 102 and the auxiliary pattern can be emphasized by utilizing mutual interference between the light passing through the transparent portion 102 and the light passing through the phase shifter 103, namely, the auxiliary pattern. Also, this effect to emphasize the contrast can be attained also in the case where a fine isolated space pattern corresponding to the transparent portion 102 is formed by, for example, the positive resist process using the oblique incident exposure. Accordingly, an isolated space pattern and an isolated line pattern or dense patterns can be simultaneously thinned by employing the oblique incident exposure. Furthermore, even in the case where complicated and fine space patterns are close to each other, a pattern with a desired dimension can be satisfactorily formed.

Figure 5A:
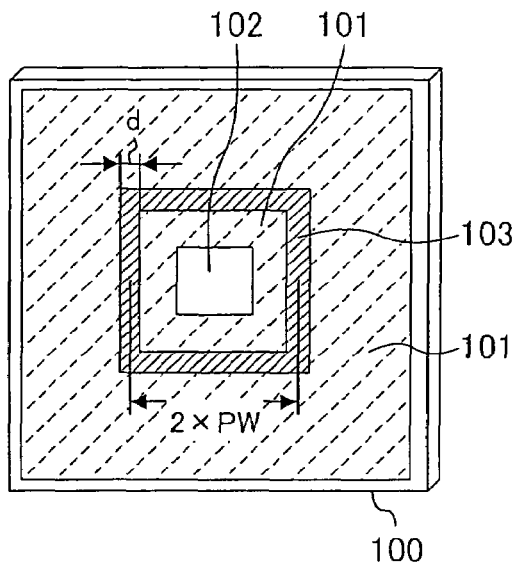
FIGS. 5A, 5B, 5C and 5D are diagrams for showing variations of the plane structure of the photomask of Embodiment 1.

In this embodiment, the transparent portion 102 is in a square shape or a rectangular shape and the phase shifters 103 each in a rectangular shape (namely, line-shaped patterns) are formed around the transparent portion 102 to be parallel to the respective sides of the transparent portion 102 as shown in FIG. 2A. However, the phase shifter 103 may be in a closed loop shape surrounding the whole transparent portion 102 as shown in FIG. 5A. Also in this case, a distance 2×PW between the center lines of portions of the phase shifter opposing each other with the transparent portion 102 sandwiched therebetween (hereinafter, the center line distance between such portions of a phase shifter is also designated as the shifter center line distance) and the width d of the phase shifter satisfy the aforementioned conditions for attaining the good pattern formation characteristic.

Figure 5B:
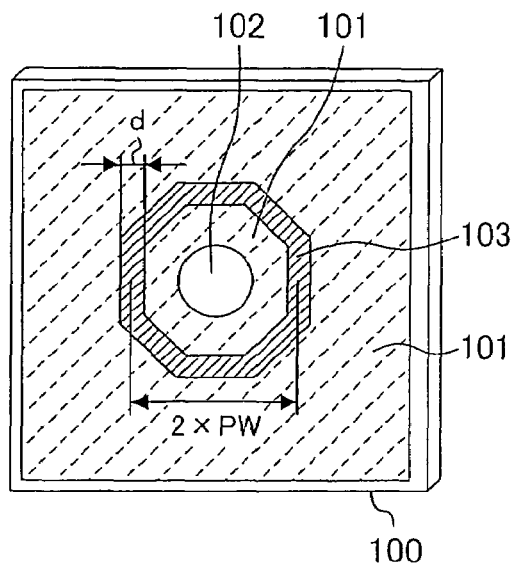
Figure 5C:
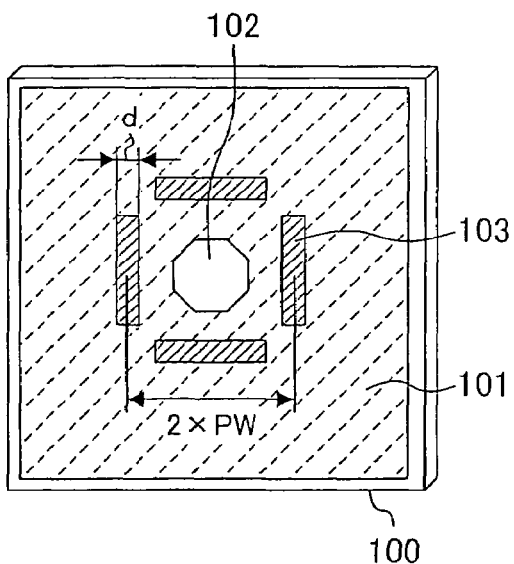
Figure 5D:
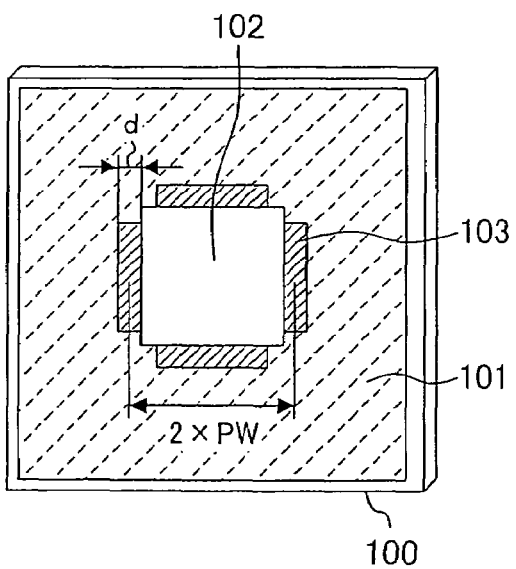

Also in this embodiment, the transparent portion 102 need not always be in a rectangular shape, but may be, for example, in a polygonal or circular shape as shown in FIG. 5B or 5C. Furthermore, the phase shifter(s) 103 surrounding the transparent portion 102 need not always be in an analogous shape to that of the transparent portion 102 but may be in any shape as far as the shifter center line distance satisfies the aforementioned condition. Moreover, in the case where a plurality of phase shifters 103 are individually provided, there is no need to provide each phase shifter 103 in parallel to each side of the transparent portion 102 but the phase shifters 103 may be provided, for example, as shown in FIG. 5C, in any manner as far as they surround the transparent portion 102 so as to satisfy the aforementioned condition of the shifter center line distance. The semi-shielding portion 101 is preferably sandwiched between the transparent portion 102 and the phase shifter 103, but the transparent portion 102 may be in contact with the phase shifter 103, for example, as shown in FIG. 5D as far as the shifter center line distance satisfies the aforementioned condition. However, in any of these mask structures described above, the phase shifter 103 corresponding to the auxiliary pattern is optimally provided so as to have its center line away from the center of the transparent portion 102 by the distance of 0.4×λ/NA, and therefore, the transparent portion 102 preferably used for forming a fine contact pattern is always smaller than a square or a rectangle with a side dimension of 0.8×λ/NA.

Next, the cross-sectional structure of the photomask of this embodiment will be described. FIGS. 6A through 6D show variations of the cross-sectional structure of the photomask taken along line AB of FIG. 2A. Specifically, the photomask having the plane structure composed of the transparent portion 102, the semi-shielding portion 101 corresponding to a shielding pattern and the phase shifter 103 corresponding to the auxiliary pattern has four basic types of the cross-sectional structure as shown in FIGS. 6A through 6D. Now, the basic types of the cross-sectional structure of FIGS. 6A through 6D will be described.

Figure 6A:
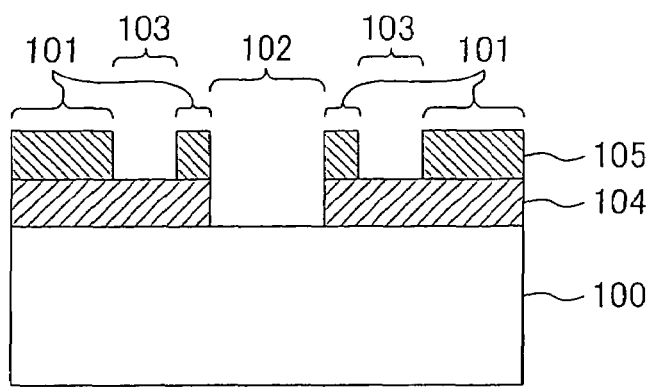
FIGS. 6A, 6B, 6C and 6D are diagrams for showing variations of the cross-sectional structure of the photomask of Embodiment 1.

First, in the photomask having the cross-sectional structure of the type shown in FIG. 6A, on a transparent substrate 100 of, for example, quartz, a first phase shift film 104 for causing, in exposing light, a phase difference in the opposite phase (namely, a phase difference not less than (150+360×n) degrees and not more than (210+360×n) degrees (wherein n is an integer)) with respect to the transparent portion 102 is formed. Hereinafter, to cause a phase difference in the opposite phase means to cause a phase difference not less than (150+360×n) degrees and not more than (210+360×n) degrees (wherein n is an integer). Furthermore, on the first phase shift film 104, a second phase shift film 105 for causing a phase difference in the opposite phase with respect to the first phase shift film 104 is formed. The first and second phase shift films 104 and 105 have openings in a transparent portion forming region, and the second phase shift film 105 has an opening in a phase shifter forming region. Thus, the semi-shielding portion 101 composed of a multilayer structure of the second phase shift film 105 and the first phase shift film 104 is formed, and the phase shifter 103 composed of a single layer structure of the first phase shift film 104 is formed. Also, an exposed portion of the transparent substrate 100 corresponds to the transparent portion 102.

Figure 6B:
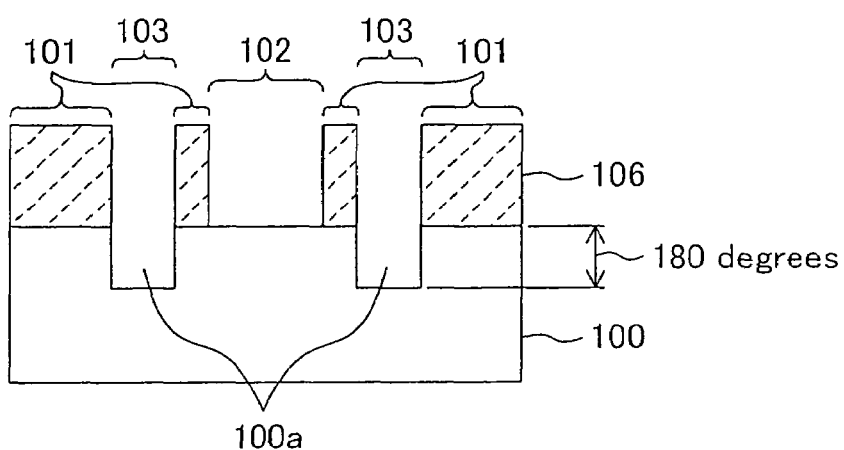

Next, in the photomask having the cross-sectional structure of the type shown in FIG. 6B, on a transparent substrate 100 of, for example, quartz, a semi-shielding film 106 for causing, in the exposing light, a phase difference in the identical phase (namely, a phase difference not less than (−30+360×n) degrees and not more than (30+360×n) degrees (wherein n is an integer)) with respect to the transparent portion 102 is formed. Hereinafter, to cause a phase difference in the identical phase means to cause a phase difference not less than (−30+360×n) degrees and not more than (30+360×n) degrees (wherein n is an integer). The semi-shielding film 106 has openings respectively in a transparent portion forming region and a phase shifter forming region. Also, a portion in the phase shifter forming region of the transparent substrate 100 is trenched by a depth for causing, in the exposing light, a phase difference in the opposite phase with respect to the transparent portion 102. Thus, the phase shifter 103 is formed by the trench portion 100a of the transparent substrate 100. Specifically, in the photomask of FIG. 6B, the semi-shielding film 106 that is formed on the quartz and minimally causes a phase difference with respect to the transparent portion 102 is processed, so that the semi-shielding portion 101 can be formed as a portion where the semi-shielding film 106 is formed, the phase shifter 103 can be formed as the trench portion 100a of the transparent substrate 100 where the semi-shielding film 106 has an opening, and the transparent portion 102 can be formed as another opening of the semi-shielding film 106 (i.e., an exposed portion of the transparent substrate 100).

Figure 6C:
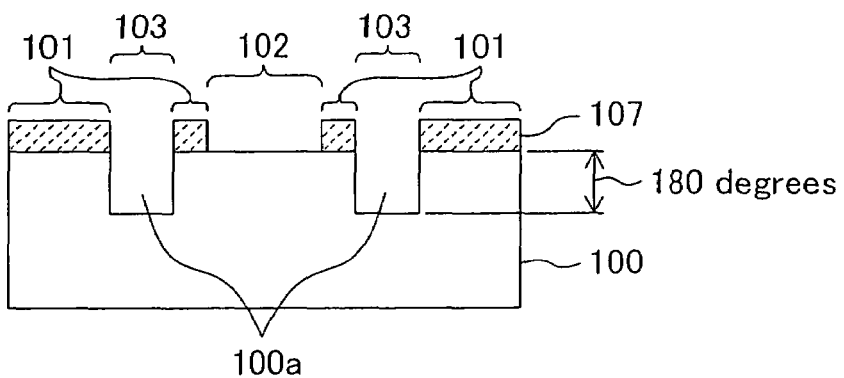

Next, in the photomask having the cross-sectional structure of the type shown in FIG. 6C, on a transparent substrate 100 of, for example, quartz, a thin film 107 that minimally changes the phase of the exposing light on the basis of the transparent portion 102 is formed. In other words, the photomask of FIG. 6C is a special one of photomasks belonging to the type of FIG. 6B. Specifically, a metal thin film with a thickness of, for example, 30 nm or less can be used for forming the thin film 107 that causes, with respect to the transparent portion 102, a phase difference not less than (−30+360×n) degrees and not more than (30+360×n) degrees (wherein n is an integer) and has transmittance of 15% or less. The thin film 107 has openings respectively in a transparent portion forming region and a phase shifter forming region. Furthermore, a portion in the phase shifter forming region of the transparent substrate 100 is trenched by a depth for causing, in the exposing light, a phase difference in the opposite phase with respect to the transparent portion 102. Thus, similarly to the photomask of FIG. 6B, the phase shifter 103 is formed by the trench portion 100a of the transparent substrate 100.

In the photomask of the type shown in FIG. 6A or 6B, the phase shift film for causing a phase difference in the opposite phase or the semi-shielding film for causing a phase difference in the identical phase should have a thickness approximately several hundreds nm for adjusting the phase. On the contrary, in the photomask of the type of FIG. 6C, the thin film 107 with a thickness of several tens nm at most is used, and therefore, refinement processing for patterning in the mask process can be easily performed. Examples of the metal material usable as the thin film 107 are metals such as Cr (chromium), Ta (tantalum), Zr (zirconium), Mo (molybdenum) and Ti (titanium), and alloy of any of these metals. Specific examples of the alloy are Ta—Cr alloy, Zr—Si alloy, Mo—Si alloy and Ti—Si alloy. When the photomask of the type of FIG. 6C is employed, since the film to be processed is the thin film 107, the refinement processing in the mask process can be easily performed. Therefore, in the case where it is necessary to provide a very fine pattern between the transparent portion 102 and the phase shifter 103 for realizing the outline enhancement method, the photomask of the type shown in FIG. 6C has a very good mask structure.

Figure 6D:
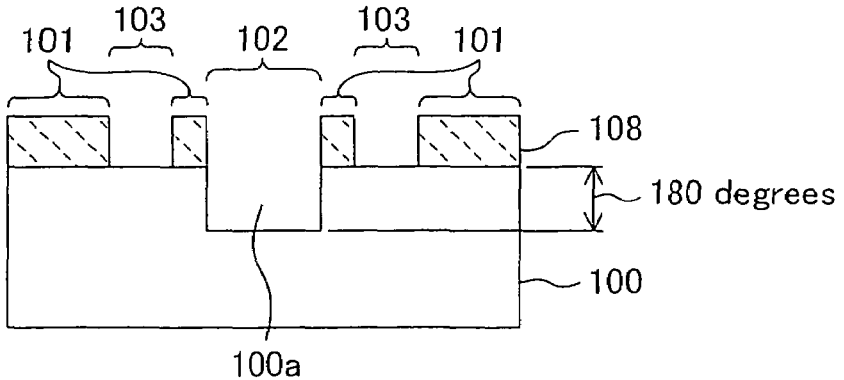

Ultimately, in the photomask with the cross-sectional structure of the type shown in FIG. 6D, on a transparent substrate 100 of, for example, quartz, a phase shift film 108 for causing, in the exposing light, a phase difference in the opposite phase with respect to the phase shifter 103 is formed. The phase shift film 108 has openings respectively in a transparent portion forming region and a phase shifter forming region. Furthermore, in order to accord the phase of light passing through the transparent portion 102 with the phase of light passing through the semi-shielding portion 101, a portion in the transparent portion forming region of the transparent substrate 100 is trenched by a depth for causing a phase difference in the opposite phase with respect to the phase shifter 103. Specifically, in the photomask of FIG. 6D, the quartz corresponding to the transparent substrate 100 and the phase shift film 108 for causing a phase difference in the opposite phase are respectively processed, so that the semi-shielding portion 101 can be formed as the portion where the phase shift film 108 is formed, the transparent portion 102 can be formed as the trench portion 100a of the transparent substrate 100 where the phase shifter film 108 has an opening, and the phase shifter 103 can be formed as an opening of the phase shift film 108 (i.e., an exposed portion of the transparent substrate 100). In the photomask of FIG. 6D, the phase shifter 103 that is formed as a fine pattern on the mask is formed as a simple opening of the phase shift film 108, and the transparent portion 102 corresponding to a comparatively large opening is an etched portion of the quartz. Therefore, the depth of the etched portion of the quartz can be easily controlled. Accordingly, the photomask of the type of FIG. 6C has a particularly good mask structure for realizing the outline enhancement method.

It is noted that although each of the semi-shielding film, the phase shift film and the like is shown as a single-layered film in FIGS. 6A through 6D, it goes without saying that each film may be formed as a multilayer film.

Modification of Embodiment 1

A photomask according to a modification of Embodiment 1 will now be described with reference to the accompanying drawings.

Figure 7A:
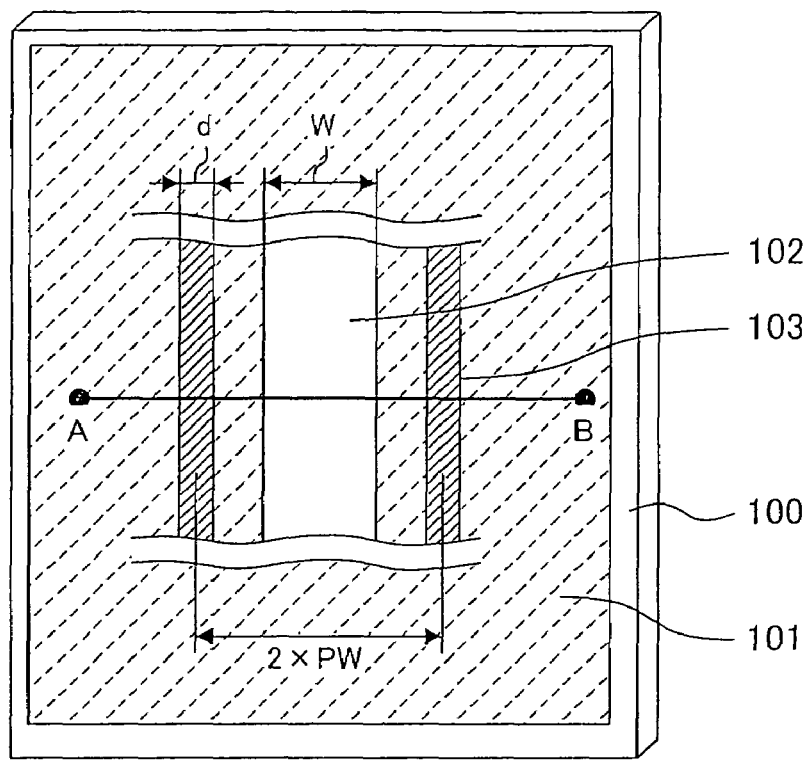
FIG. 7A is a plan view of a photomask according to a modification of Embodiment 1 and FIG. 7B is a diagram of a light intensity distribution formed on a wafer through exposure using the photomask of FIG. 7A.

FIG. 7A is a plan view of the photomask of this modification. The photomask of this modification is used for forming a fine space pattern. Specifically, a desired pattern to be formed in this modification is a line-shaped fine space pattern differently from Embodiment 1 in which a desired pattern is a contact hole pattern. Herein, a line-shaped pattern means a pattern having an optically sufficiently large longitudinal dimension and more specifically means a pattern with a longitudinal dimension of $2\times\lambda/NA$ or more.

As shown in FIG. 7A, on a transparent substrate 100, a semi-shielding portion 101 is formed so as to cover a sufficiently large area in the same manner as in the photomask of Embodiment 1 shown in FIG. 2A. Also, in a position in the semi-shielding portion 101 corresponding to a desired space pattern to be formed on a wafer through the exposure, an opening pattern corresponding to a transparent portion 102 is provided. Furthermore, auxiliary patterns corresponding to phase shifters 103 are provided around the transparent portion 102 with the semi-shielding portion 101 sandwiched therebetween, for example, so as to be parallel to the respective long sides of the line-shaped transparent portion 102. In other words, the phase shifters 103 are provided so as to sandwich the transparent portion 102. It is assumed in this modification that the semi-shielding portion 101 has transmittance of, for example, 6%. Specifically, in forming a line-shaped space pattern, the quantity of light passing through the transparent portion 102 is larger than in forming a contact hole pattern, and therefore, the preferable transmittance of the semi-shielding portion 101 is lower than in forming a contact hole pattern, and thus, the preferable transmittance is approximately 6%.

Assuming that the exposure wavelength and the numerical aperture of an optical system using the photomask of FIG. 7A are $\lambda$ and NA, respectively, the most preferable structure for forming a fine space pattern is a structure in which a distance between the center lines of the phase shifters 103 paring and opposing each other with the transparent portion 102 sandwiched therebetween is $0.65\times\lambda/NA$ as described below. In other words, each phase shifter 103 is optimally provided so as to have its center line in a position away from the center of the transparent portion 102 by a distance of $0.325\times\lambda/NA$. Furthermore, in the case where the transmittance of the phase shifter 103 is set to be the same as that of the transparent portion 102, the width of the phase shifter 103 is optimally set to $0.10\times\lambda/NA$.

Now, a good pattern formation characteristic of the photomask with the aforementioned structure exhibited in forming a fine space pattern, and more particularly, in forming a line-shaped space pattern with a width of $0.4\times\lambda/NA$ or less will be described on the basis of a result of simulation.

It is assumed in the simulation that the transparent portion 102 is a line-shaped pattern having a width W, that each phase shifter 103 provided in parallel to each long side of the transparent portion 102 is a rectangular pattern (a line-shaped pattern) with a width d and that the center line of each phase shifter 103 is disposed in a position away from the center of the transparent portion 102 by a distance PW in the photomask of FIG. 7A. In other words, a distance between the center lines of a pair of phase shifters 103 opposing each other with the transparent portion 102 sandwiched therebetween is $2\times PW$. Also, it is assumed that the semi-shielding portion 101 working as the background has transmittance of 6%. Under these conditions, the light intensity is simulated with respect to various combinations of the width W, the distance PW and the width d. In this simulation, optical calculation is carried out on the assumption that the exposure is carried out with the exposure wavelength $\lambda$ of 193 nm and the numerical aperture NA of 0.7. Furthermore, ⅔ annular illumination having the outer diameter with a degree of coherence of 0.8 and the inner diameter with a degree of coherence of 0.53 is assumed to be used.

Figure 7B:
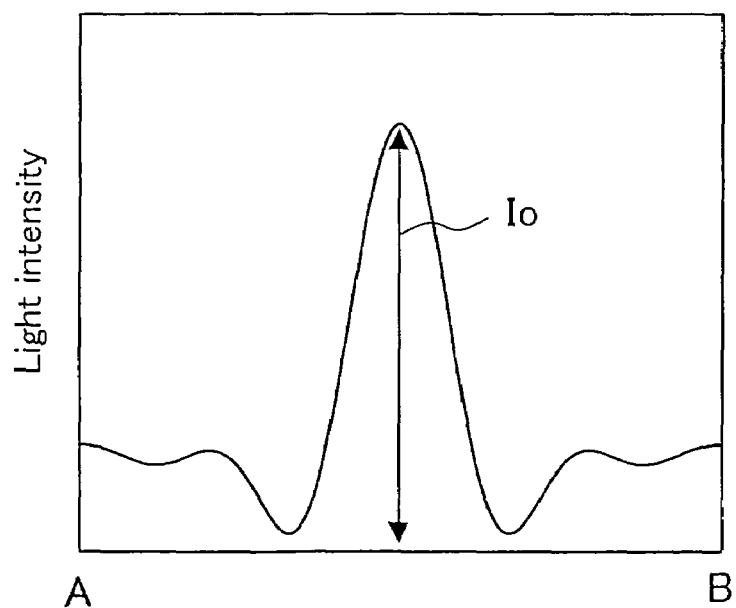

FIG. 7B shows a light intensity distribution formed on a wafer (in a position corresponding to line AB of FIG. 7A) through the exposure using the photomask of FIG. 7A. The light intensity distribution of FIG. 7B has a profile with a peak in a position corresponding to the center of the transparent portion 102. In this case, it is necessary for the peak intensity Io to be not less than a given value in order to sensitize a resist corresponding to the center of the transparent portion 102. The peak intensity Io necessary for sensitizing the resist depends upon the used resist material, and it has been experimentally found that the peak intensity Io necessary for forming a fine space pattern with a width of $0.4\times\lambda/NA$ or less is approximately 0.25.

Figure 8A:
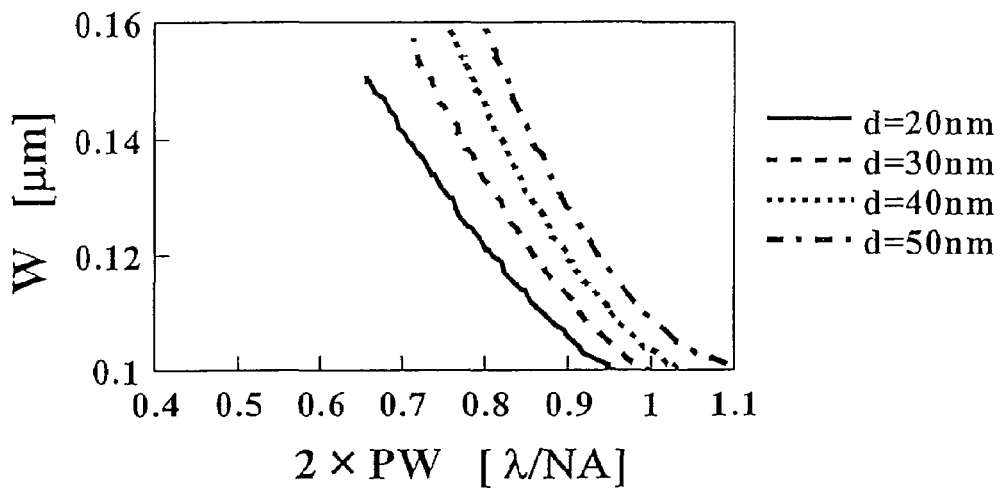
FIG. 8A is a graph of a result of simulation performed for obtaining a mask structure for attaining the peak intensity Io of 0.25 in the photomask of the modification of Embodiment 1.
Figure 8B:
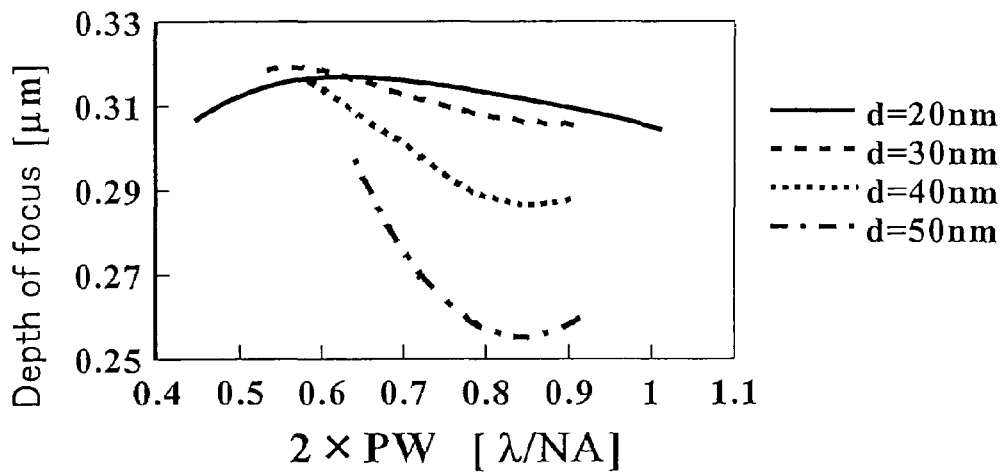
FIG. 8B is a diagram of a result of simulation for a depth of focus in which a space pattern with a width of 100 nm is formed by using a photomask having the mask structure shown in the graph of FIG. 8A.
Figure 8C:
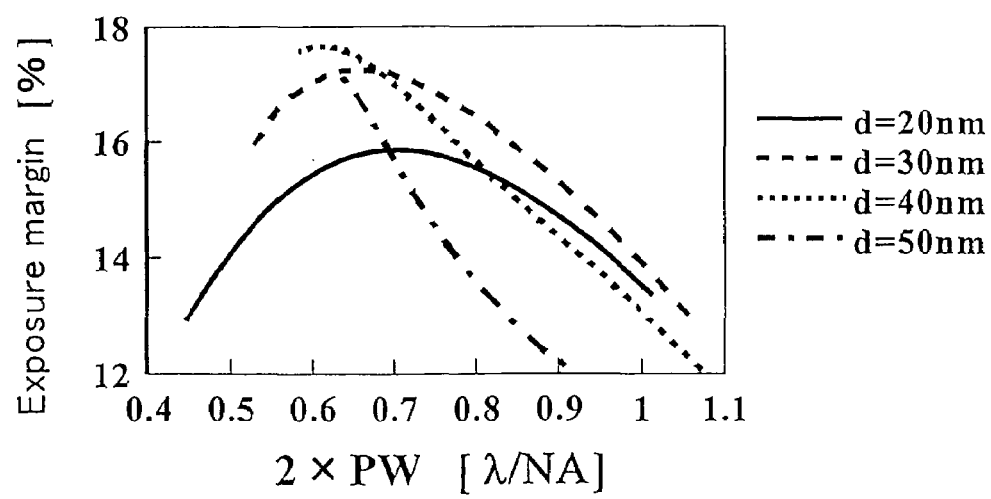
FIG. 8C is a diagram of a result of simulation for an exposure margin in which a space pattern with a width of 100 nm is formed by using the photomask having the mask structure shown in the graph of FIG. 8A.

Results of analysis of the photomask of this modification performed similarly to obtain the results shown in FIGS. 3A through 3C in Embodiment 1 are shown in FIGS. 8A through 8C.

FIG. 8A shows the combinations of the width W, the distance PW and the width d for attaining the peak intensity Io of 0.25 in the photomask of FIG. 7A obtained as a result of the simulation. Specifically, FIG. 8A shows the width W of the transparent portion 102 for attaining the peak intensity Io of 0.25 plotted against the shifter center line distance $2\times PW$. Also, FIG. 8A shows the relationships between the shifter center line distance $2\times PW$ and the width W obtained when the width d of the phase shifter 103 is 20 nm, 30 nm, 40 nm and 50 nm. In other words, the light intensity distribution having the peak intensity Io of 0.25 can be formed by employing any of all the combinations of the distance PW, the width W and the width d shown in the graph of FIG. 8A. Furthermore, among these combinations, one having the maximum depth of focus or the maximum exposure margin corresponds to a mask structure having a good pattern formation characteristic.

FIG. 8B shows a result of simulation for the depth of focus in which a space pattern with a width of 100 nm is formed by using a mask pattern having the combination of the distance PW, the width W and the width d shown in the graph of FIG. 8A. In FIG. 8B, the abscissa indicates the shifter center line distance $2\times PW$ and the value of the depth of focus is plotted by using the width d as a parameter on the ordinate.

Similarly, FIG. 8C shows a result of simulation for the exposure margin in which a space pattern with a width of 100 nm is formed by using a mask pattern having the combination of the distance PW, the width W and the width d shown in the graph of FIG. 8A. In FIG. 8C, the abscissa indicates the shifter center line distance $2\times PW$ and the value of the exposure margin is plotted by using the width d as a parameter on the ordinate.

As shown in FIGS. 8B and 8C, regardless of the value of the width d of the phase shifter, both the depth of focus and the exposure margin have the maximum values when the shifter center line distance $2\times PW$ has a value in the vicinity of $0.65\times\lambda/NA$ (=approximately 180 nm). That the optimum value of the shifter center line distance $2\times PW$ does not depend upon the width d of the phase shifter means that the optimum value does not depend upon the transmittance of the phase shifter, either.

Furthermore, in phase shifters having the center line distance $2\times PW$ of approximately $0.65\times\lambda/NA$, both the depth of focus and the exposure margin have sufficiently large values when the width d of the phase shifter is approximately $0.10\times\lambda/NA$ (=30 nm).

It is understood from these results that a mask structure in which the phase shifters 103 are provided to be paired each other with the transparent portion 102 sandwiched therebetween, each phase shifter 103 has a width of $0.10 \times \lambda/NA$ and the shifter center line distance is $0.65 \times \lambda/NA$ is good for forming a fine space pattern. As compared with Embodiment 1, since the transparent portion 102 is in the shape of a line in this modification, the light interference effect is large, and hence, the optimum position of each phase shifter 103 is closer to the center of the transparent portion 102.

Furthermore, referring to the graphs of FIGS. 8B and 8C in detail, it is understood that a large depth of focus and a large exposure margin can be attained as far as the width d of the phase shifter is not less than $0.05 \times \lambda/NA$ and not more than $0.2 \times \lambda/NA$ similarly to Embodiment 1. Also, it is understood that a large depth of focus and a large exposure margin can be attained as far as the shifter center line distance is not less than $0.5 \times \lambda/NA$ and not more than $0.9 \times \lambda/NA$ (namely, the distance between the center line of the phase shifter and the center of the transparent portion is not less than $0.25 \times \lambda/NA$ and not more than $0.45 \times \lambda/NA$). Furthermore, in order to attain a depth of focus and an exposure margin approximate to their maximum values, the width of the phase shifter is preferably not less than $0.1 \times \lambda/NA$ and not more than $0.15 \times \lambda/NA$, and the shifter center line distance is preferably not less than $0.55 \times \lambda/NA$ and not more than $0.85 \times \lambda/NA$ (namely, the distance between the center line of the phase shifter and the center of the transparent portion is preferably not less than $0.275 \times \lambda/NA$ and not more than $0.425 \times \lambda/NA$).

The results shown in FIGS. 8B and 8C are described as data obtained in the exemplified case where the numerical aperture NA is 0.7, and simulation is similarly performed on the assumption that the numerical aperture NA is 0.6 and 0.8. As a result, it is confirmed that the optimum mask structure does not depend upon the value of the numerical aperture NA.

In this modification, the optimum value of the width d of the phase shifter is $0.10 \times \lambda/NA$ on the assumption that the transmittance of the phase shifter is the same as that of the transparent portion. In the case where the phase shifter has transmittance different from that of the transparent portion, namely, in the case where the effective relative transmittance of the phase shifter (the auxiliary pattern) to the transparent portion is not 1, the width of the phase shifter is changed in accordance with the relative transmittance for realizing an equivalent transmitting property. Specifically, assuming that the relative transmittance is T, the width d of the phase shifter is preferably set to $(0.10 \times \lambda)/(NA \times T^{0.5})$. However, the optimum distance from the center of the transparent portion to the center line of the phase shifter is $0.325 \times \lambda/NA$ regardless of the transmittance and the width of the phase shifter.

Furthermore, the width d of the phase shifter is preferably not less than $(0.05 \times \lambda)/(NA \times T^{0.5})$ and not more than $(0.2 \times \lambda)/(NA \times T^{0.5})$, and more preferably not less than $(0.1 \times \lambda)/(NA \times T^{0.5})$ and not more than $(0.15 \times \lambda)/(NA \times T^{0.5})$.

In this manner, the optimum position of the phase shifter provided as the auxiliary pattern on the basis of the outline enhancement method (i.e., the optimum position of its center line) is a position away from the center of the transparent portion by a distance with a value not more than the wavelength $\lambda$ of the exposing light in this embodiment. Accordingly, differently from the conventional technique where an auxiliary pattern should be provided in a position away from the center of a transparent portion by a distance with a value not less than the wavelength $\lambda$ an auxiliary pattern can be provided between densely arranged transparent portions (corresponding to space patterns) by utilizing the outline enhancement method.

In other words, according to this modification, the contrast of the light intensity distribution between the transparent portion 102 and the auxiliary pattern can be emphasized by utilizing mutual interference between the light passing through the transparent portion 102 and the light passing through the phase shifter 103, namely, the auxiliary pattern. Also, this effect to emphasize the contrast can be attained also in the case where a fine isolated space pattern corresponding to the transparent portion 102 is formed by, for example, the positive resist process using the oblique incident exposure. Accordingly, an isolated space pattern and an isolated line pattern or dense patterns can be simultaneously thinned by employing the oblique incident exposure. Furthermore, even in the case where complicated and fine space patterns are close to each other, a pattern with a desired dimension can be satisfactorily formed.

In this modification, the phase shifters 103 are provided in parallel to the transparent portion 102. However, the phase shifters 103 need not be completely parallel to the transparent portion 102. Specifically, even when a desired pattern is, for example, a simple rectangular pattern, the pattern width of a transparent portion for obtaining the desired pattern is sometimes changed on a photomask with respect to each small length unit. In such a case, there is no need to provide the phase shifters so as to completely follow the change of the outline of the transparent portion. In other words, the phase shifters 103 may be provided substantially parallel to the transparent portion 102. However, the optimum value of the shifter center line distance, namely, the distance between the center lines of the phase shifters 103 pairing with each other with the transparent portion 102 sandwiched therebetween, is $0.65 \times \lambda/NA$, and therefore, the transparent portion 102 preferably used for forming a fine space pattern is always a line pattern with a width smaller than $0.65 \times \lambda/NA$.

EMBODIMENT 2

A photomask according to Embodiment 2 of the invention will now be described with reference to the accompanying drawings.

Figure 9A:
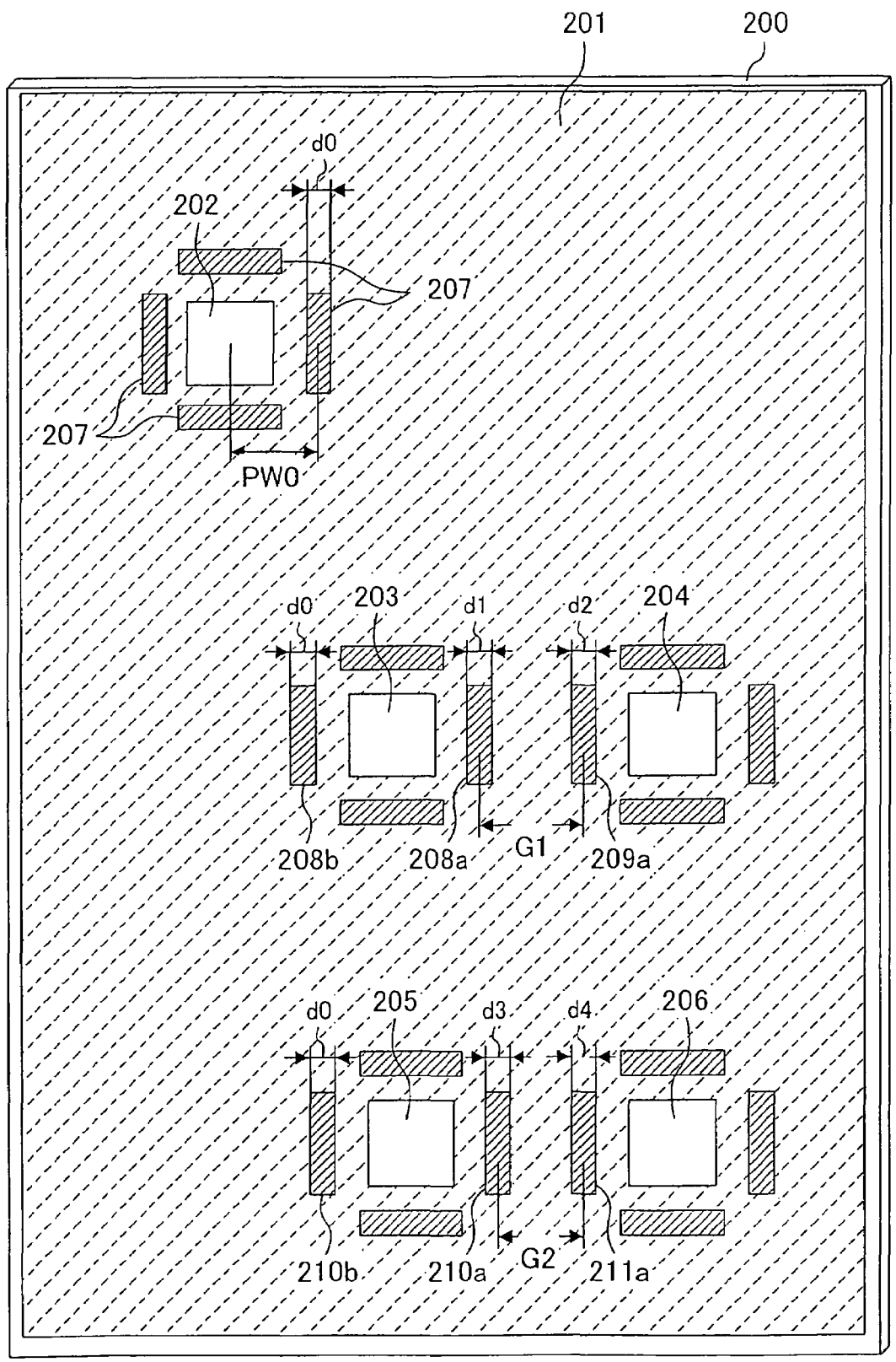
FIG. 9A is a plan view of a photomask according to Embodiment 2 of the invention.

FIG. 9 is a plan view of the photomask of Embodiment 2. The photomask of this embodiment is used for simultaneously forming a plurality of fine contact patterns.

As shown in FIG. 9, on a transparent substrate 200, a semi-shielding portion 201 is formed so as to cover a sufficiently large area. Also, in positions in the semi-shielding portion 201 corresponding to desired contact patterns to be formed on a wafer through the exposure, a transparent portion 202, a pair of transparent portions 203 and 204 and a pair of transparent portions 205 and 206 are provided as opening patterns. In this case, the transparent portion 202 is an opening pattern corresponding to an isolated contact pattern, and each of the transparent portions 203 and 205 is an opening pattern corresponding to a contact pattern having another contact pattern closely disposed. Furthermore, around the transparent portion 202, auxiliary patterns corresponding to phase shifters 207 are provided with the semi-shielding portion 201 sandwiched therebetween, for example, so as to be parallel to respective sides of the transparent portion 202 in the shape of a square or a rectangle and to surround the transparent portion 202. Similarly, around each of the transparent portions 203 through 206, auxiliary patterns corresponding to phase shifters 208, 209, 210 or 211 are provided with the semi-shielding portion 201 sandwiched therebetween, for example, so as to be parallel to respective sides of each of the transparent portions 203 through 206 and to surround the transparent portion 203, 204, 205 or 206.

The phase shifters 207 provided around the transparent portion 202 are disposed so as to attain a mask structure good for forming an isolated contact pattern, and each phase shifter 207 has a width d0.

The transparent portion 203 is close to the different transparent portion 204. In this case, among the phase shifters 208 and 209 respectively provided around the transparent portions 203 and 204, those provided in an area sandwiched between the transparent portions 203 and 204 are referred to as a phase shifter 208a and a phase shifter 209a. Furthermore, the transparent portion 205 is close to the different transparent portion 206. In this case, among the phase shifters 210 and 211 respectively provided around the transparent portions 205 and 206, those provided in an area sandwiched between the transparent portions 205 and 206 are referred to as a phase shifter 210a and a phase shifter 211a.

As a characteristic of this embodiment, assuming that the phase shifters 208a and 209a respectively have widths d1 and d2 and that a distance between the center lines of the phase shifters 208a and 209a is G1, the photomask has a structure in which a relationship (d1+d2)<2×d0 is satisfied under a condition of the distance G1 being 0.5×λ/NA or less. In other words, when d1=d2, d1<d0 and d2<d0. In this case, among the phase shifters 208 surrounding the transparent portion 203, each of phase shifters 208b provided on sides not close to the different transparent portion 204 has the width d0.

Furthermore, as another characteristic of this embodiment, assuming that the phase shifters 210a and 211a respectively have widths d3 and d4 and that a distance between the center lines of the phase shifters 210a and 211a is G2, the photomask has a structure in which a relationship (d3+d4)<(d1+d2)<2×d0 is satisfied under a condition of G2<G1<0.5×λ/NA. In other words, when d3=d4 and d1=d2, d3=d4<d1=d2<d0. In this case, among the phase shifters 210 surrounding the transparent portion 205, each of phase shifters 210b provided on sides not close to the different transparent portion 206 has the width d0.

Specifically, in this embodiment, in the relationship between phase shifters surrounding one transparent portion and phase shifters surrounding another transparent portion, in the case where any phase shifters of these transparent portions are adjacent and close to each other and spaced by a given or smaller distance, these close phase shifters have smaller widths than the other phase shifters having no adjacent and close phase shifter spaced by the given or smaller distance. In this case, the widths of the phase shifters adjacent and close to each other and spaced by the given or smaller distance are preferably in proportion to a distance (a close distance) between these phase shifters. Alternatively, in the case of the photomask of FIG. 9, a difference between the width d1 of the phase shifter 208a (or the width d2 of the phase shifter 209a) and the width d3 of the phase shifter 210a (or the width d4 of the phase shifter 211a) is preferably in proportion to a difference between the distances G1 and G2.

According to this embodiment, the contrast of the light intensity distribution between the transparent portion and the auxiliary pattern can be emphasized by utilizing mutual interference between light passing through each transparent portion and light passing through the phase shifters, namely, the auxiliary patterns, provided around the transparent portion. Also, this effect to emphasize the contrast can be attained also in the case where a fine isolated space pattern corresponding to the transparent portion is formed by, for example, the positive resist process using the oblique incident exposure. Accordingly, an isolated space pattern and an isolated line pattern or dense patterns can be simultaneously thinned by employing the oblique incident exposure. Furthermore, even in the case where complicated and fine space patterns are close to each other, a pattern with a desired dimension can be satisfactorily formed.

Now, an isolated contact hole and densely arranged contact holes satisfactorily formed by using the photomask of this embodiment will be described in detail on the basis of results of simulation.

Figure 10A:
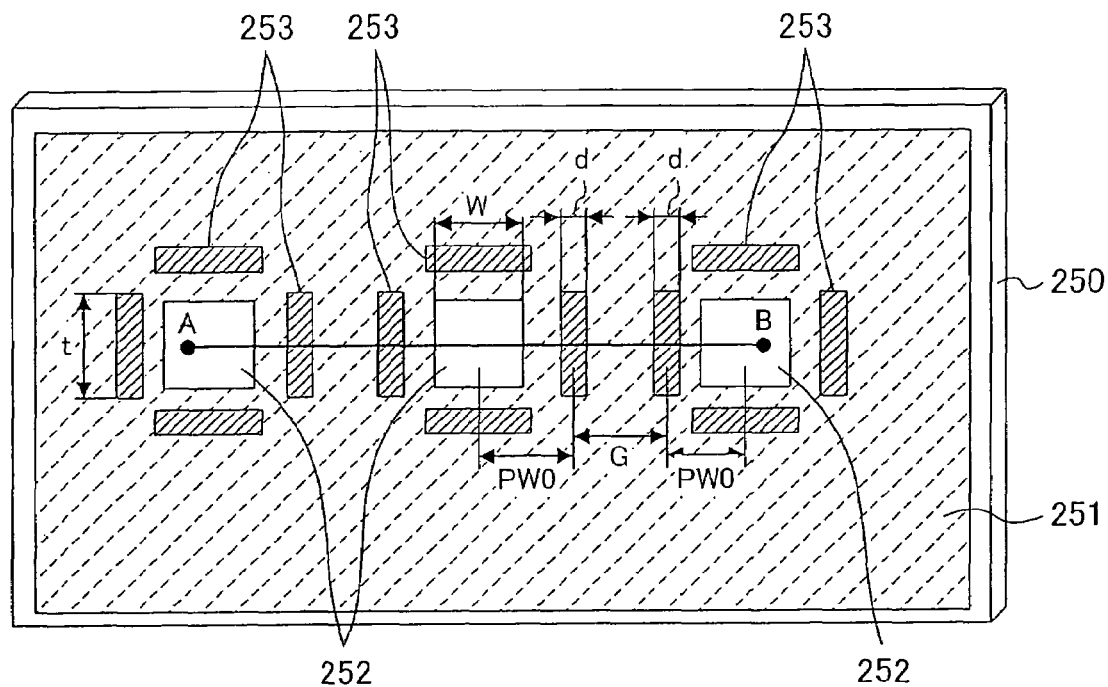
FIG. 10A is a plan view of a photomask used in simulation performed for confirming the effect of the photomask according to Embodiment 2 or 3 of the invention.

FIG. 10A is a plan view of a photomask used in the simulation for confirming the effect of this embodiment. As shown in FIG. 10A, on a transparent substrate 250, a semi-shielding portion 251 is formed so as to cover a sufficiently large area. Also, in positions in the semi-shielding portion 251 corresponding to desired contact patterns to be formed on a wafer through the exposure, a plurality of transparent portions 252 each in the shape of a square with a side dimension W are provided to be adjacent to one another. Also, around each of the transparent portions 252, phase shifters (auxiliary patterns) 253 are provided so as to have their center lines in positions away from the center of each transparent portion 252 by a distance PW0. In this case, each phase shifter 253 is in a rectangular shape with a width d and a length t. Furthermore, a distance between the center lines of the phase shifters 253 adjacent and close to each other in an area sandwiched between the adjacent transparent portions 252 (hereinafter referred to as the adjacent shifter distance) is assumed to be a distance G.

Figure 10B:
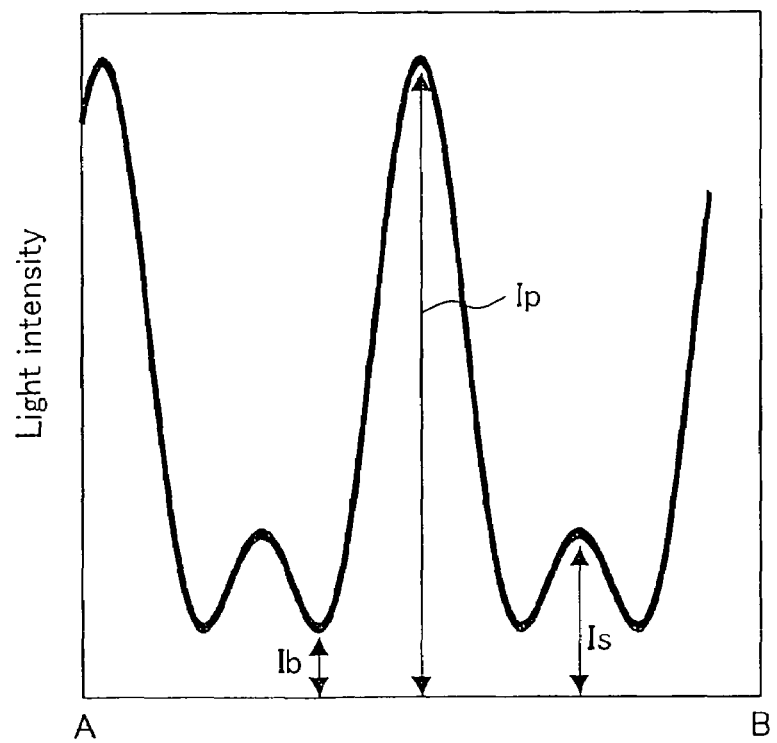
FIG. 10B is a diagram of a profile of a light intensity distribution formed through exposure using the photomask of FIG. 10A.

FIG. 10B shows the profile of a light intensity distribution formed through the exposure using the photomask of FIG. 10A. In FIG. 10B, the light intensity obtained at the center of the transparent portion 252 is expressed as Ip, the light intensity obtained at the center between the adjacent transparent portions 252 is expressed as Is, and the light intensity obtained in a position where the light intensity is minimum in the periphery of the transparent portion 252 is expressed as Ib. In this case, the center between the adjacent transparent portions 252 corresponds to the center of the adjacent phase shifters 253. Also, the light intensity simulation is performed under conditions of the exposure wavelength λ of 193 nm and the numerical aperture NA of 0.65. Furthermore, ⅔ annular illumination having the outer diameter with a degree of coherence of 0.8 and the inner diameter with a degree of coherence of 0.53 is assumed to be used. In addition, the transmittance of the semi-shielding portion 201 is set to 6%.

Furthermore, in the photomask of FIG. 10A, in order that each contact pattern can be satisfactorily formed even in an isolated state, the width d of each phase shifter 253 is set to approximately 0.15×λ/NA (=approximately 44 nm) and the distance PW0 between the phase shifter 253 and the transparent portion 252 is set to approximately 0.4×λ/NA (=approximately 120 nm). Moreover, in order to adjust the contact hole size to a desired size of 100 nm, the side dimension W of the transparent portion 252 and the length t of the phase shifter 253 are set to 160 nm. In the aforementioned mask structure for satisfactorily forming an isolated pattern, dependency of the light intensities Ib and Is on the adjacent shifter distance G calculated through the simulation is shown in a graph of FIG. 11A, wherein the value of the adjacent shifter distance G is normalized by λ/NA.

Figure 11A:
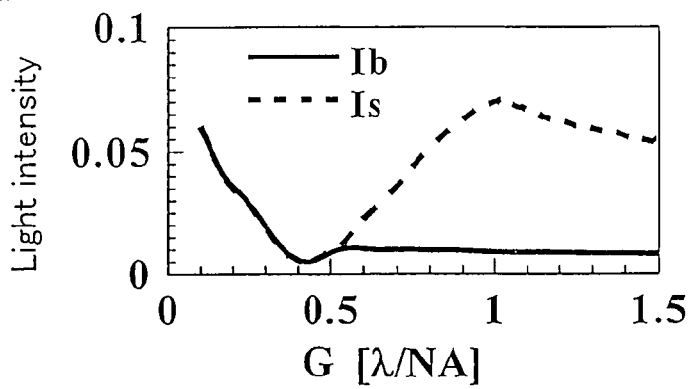
FIGS. 11A, 11B and 11C are diagrams of results of simulation performed for confirming the effect of the photomask of Embodiment 2.

As shown in FIG. 11A, when the adjacent shifter distance G is larger than 0.5×λ/NA, the light intensity Ib is sufficiently low. In other words, a light intensity distribution with high contrast is realized in this case, and therefore, good pattern formation can be realized by using the photomask. However, when the adjacent shifter distance G is not more than 0.5×λ/NA, the light intensity Ib is large. In other words, the contrast is lowered because a sufficient shielding property cannot be attained between the adjacent two contact patterns in the contact pattern formation. In this case, good pattern formation cannot be performed.

This phenomenon occurs for the following reason: When a distance between contact holes is small in desired dense contact holes, the width of a semi-shielding portion sandwiched between phase shifters on the mask is so small that the semi-shielding portion cannot transmit sufficient light. Now, this phenomenon will be described in more detail.

An opening pattern (a transparent portion) and a semi-shielding portion are regions for transmitting light in the positive phase while a phase shifter is a region for transmitting light in the negative phase. Also, the light intensity Ib in a dark part (in the periphery of the transparent portion) is obtained by canceling the light in the positive phase having passed through the opening pattern and the semi-shielding portion by the light in the negative phase having passed through the phase shifter. The light intensity Ib in the dark part can be sufficiently small when the light in the positive phase is balanced with the light in the negative phase. Specifically, when the adjacent shifter distance G is sufficiently large, the quantity of light passing through the semi-shielding portion is sufficiently large, and hence, the light intensity Is corresponds to the transmittance of the semi-shielding portion. However, when the adjacent shifter distance G is λ/NA or less, the area of the semi-shielding portion sandwiched between the phase shifters is accordingly reduced, and hence, the quantity of the light passing through the semi-shielding portion is reduced. This can be found also based on the value of the light intensity Is being reduced when the adjacent shifter distance G is λ/NA or less in the graph of FIG. 11A. In other words, in the relationship between the light in the positive phase and the light in the negative phase, which are balanced when the semi-shielding portion with a sufficiently large area is sandwiched between the adjacent phase shifters, the light in the negative phase becomes excessive when the area of the semi-shielding portion is reduced. As the light in the negative phase becomes more excessive, the light intensity Ib is also increased, resulting in lowering the contrast in the light intensity distribution.

Accordingly, in order to avoid this phenomenon, the quantity of the light passing through the phase shifter is reduced as the area of the semi-shielding portion sandwiched between the adjacent phase shifters is reduced. As one method employed for this purpose, the width of the phase shifter is reduced.

The present inventor has found the following through detailed analysis of the simulation result: Assuming that a phase shifter capable of realizing good pattern formation when the adjacent shifter distance G is sufficiently large has a width d0, when the adjacent shifter distance G is 0.5×λ/NA or less, dense contact hole patterns can be also satisfactorily formed by setting the width d of the phase shifter to d0×(0.5+G)/(λ/NA).

Figure 11B:
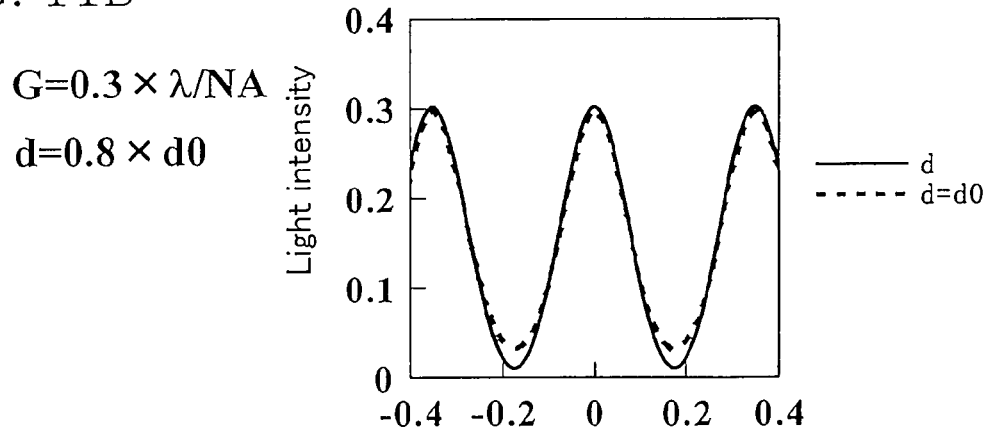

FIG. 11B shows the result of simulation similar to that performed for obtaining FIG. 10B, and specifically shows the light intensity distribution formed in a position corresponding to line AB of the photomask of FIG. 10A. FIG. 11B shows the results of the light intensity distribution simulation performed by assuming that the adjacent shifter distance G is 0.3×λ/NA with the width d set to the width d0 (approximately 0.15×λ/NA (=approximately 44 nm)) that is an optimum dimension for forming an isolated contact pattern and with the width d of the phase shifter reduced to 0.8×d0. As shown in FIG. 11B, a light intensity distribution with high contrast can be obtained by reducing the width d of the phase shifter.

Figure 11C:
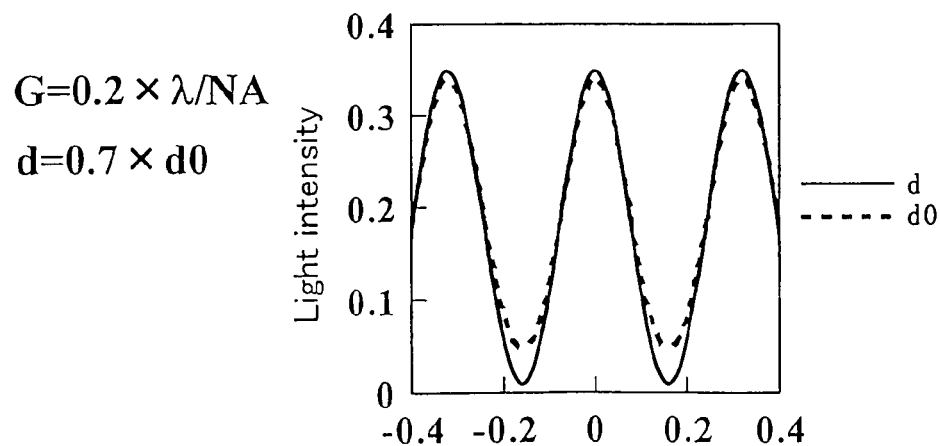

Also, FIG. 11C shows the result of the simulation similar to that performed for obtaining FIG. 10B, and specifically shows the light intensity distribution formed in the position corresponding to line AB in the photomask of FIG. 10A. FIG. 11C shows the results of the light intensity distribution simulation performed by assuming that the adjacent shifter distance G is further reduced to 0.2×λ/NA with the width d of the phase shifter set to the width d0 and with the width d reduced to 0.7×d0. As shown in FIG. 11C, a photomask capable of realizing a light intensity distribution with high contrast can be obtained by reducing the width d of the phase shifter in accordance with the reduction of the adjacent shifter distance G.

On the basis of the results of these simulations, it can be understood that when phase shifters (auxiliary patterns) are arranged on the basis of the outline enhancement method, if phase shifters respectively corresponding to adjacent transparent portions are provided in parallel to each other with a semi-shielding portion sandwiched therebetween and with the adjacent shifter distance set to 0.5×λ/NA or less, the width of each phase shifter is preferably reduced in proportion to the adjacent shifter distance.

Figure 12A:
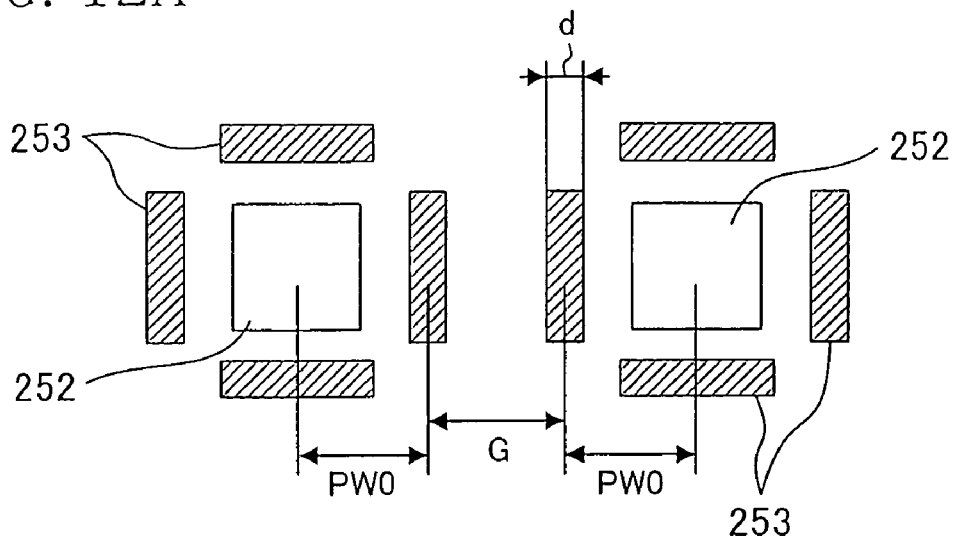
FIGS. 12A and 12B are diagrams for explaining the reason why the width of a phase shifter provided between transparent portions is preferably reduced in the photomask of Embodiment 2 in forming dense holes in which a distance between the centers of the transparent portions is 1.3×λ/NA or less.
Figure 12B:
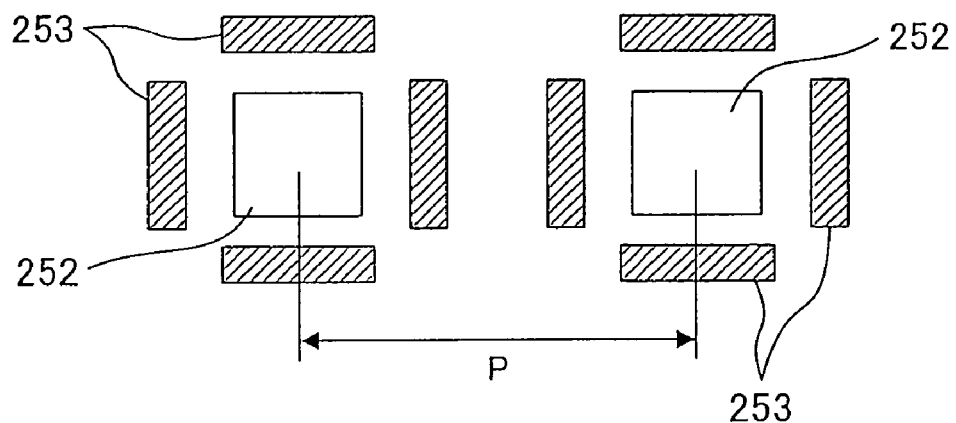

As shown in FIG. 12A, a typical distance (an optimum distance) PW0 between the center of an opening (i.e., a transparent portion 252) to the center line of a phase shifter 253 for forming a fine contact pattern is 0.4×λ/NA (see Embodiment 1). Accordingly, the case where the adjacent shifter distance G is 0.5×λ/NA or less, namely, the case where the width d of a phase shifter 253 disposed between the adjacent transparent portions is preferably reduced, corresponds to the case of forming dense holes in which a desired distance P (=2×PW0+G) between the centers of the transparent portions 252 corresponding to adjacent contact holes is 1.3×λ/NA or less as shown in FIG. 12B.

Figure 13A:
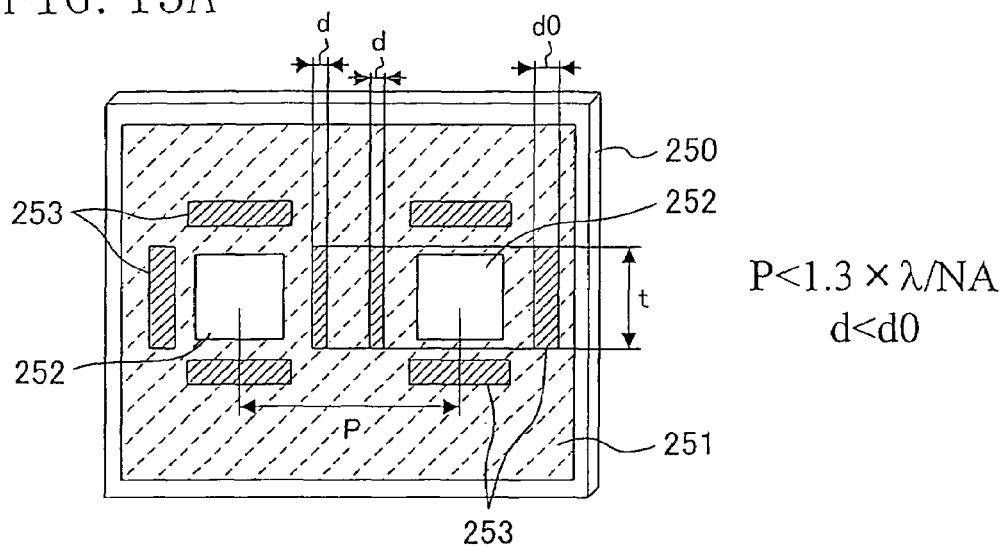
FIGS. 13A, 13B and 13C are diagrams of variations of the plane structure of the photomask of Embodiment 2.

Accordingly, in such a mask structure, assuming that a phase shifter 253 provided in an area sandwiched between the transparent portions 252 (opening patterns) adjacent to each other with the distance P between their centers of 1.3×λ/NA or less has a width d and that another phase shifter 253 provided in the other area (i.e., an area where the distance P is not 1.3×λ/NA or less) has a width d0 as shown in FIG. 13A, these widths d and d0 are set to satisfy d<d0, whereas each phase shifter 253 has a length t regardless of its position.

Figure 13B:
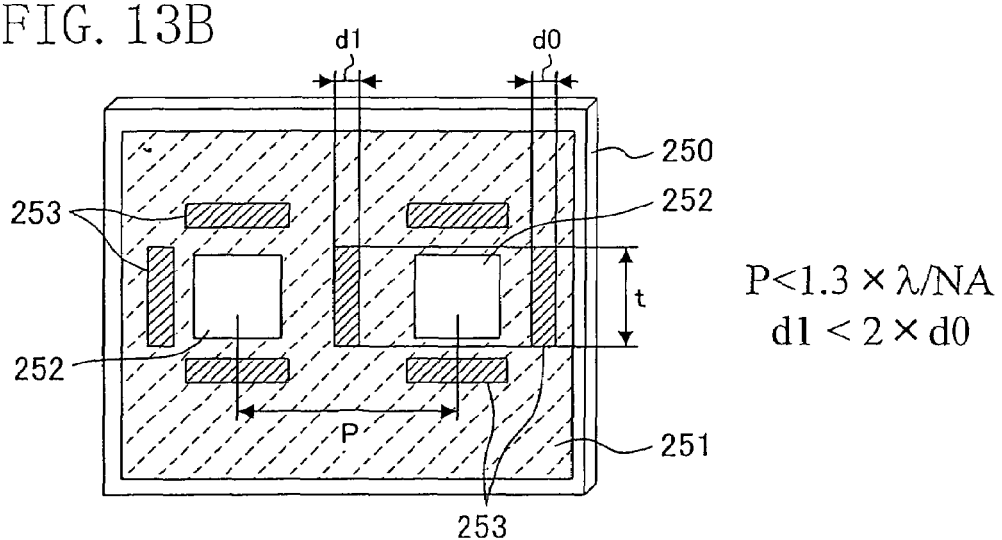

In FIG. 13A, the width of the phase shifter 253 provided in the area sandwiched between the adjacent transparent portions (opening patterns) 252 is reduced in order to reduce the quantity of the light in the negative phase passing through the phase shifter 253. Accordingly, with respect to the phase shifter 253 provided between the adjacent opening patterns, the two phase shifters 253 shown in FIG. 13A may be replaced with one phase shifter 253 shown in FIG. 13B as far as its width d1 satisfies d1<2×d0.

Figure 13C:
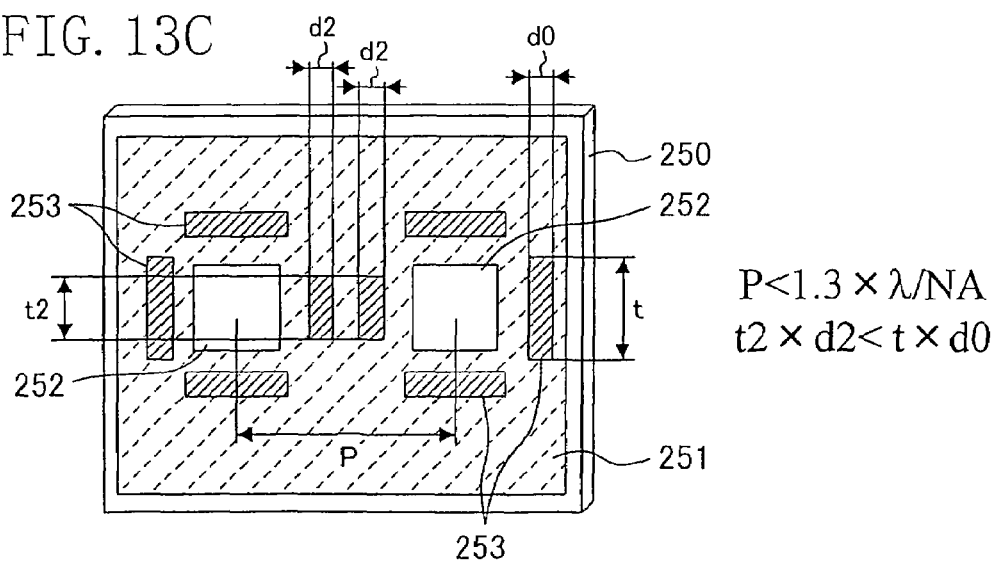

Also, in FIG. 13A, the width of the phase shifter 253 sandwiched between the adjacent opening patterns is reduced. Instead, the length of the phase shifter 253 may be reduced as shown in FIG. 13C. Specifically, assuming that the two phase shifters 253 provided between the opening patterns have a width d2 and a length t2, the width and the length are set to satisfy t2×d2<t×d0.

Figure 14A:
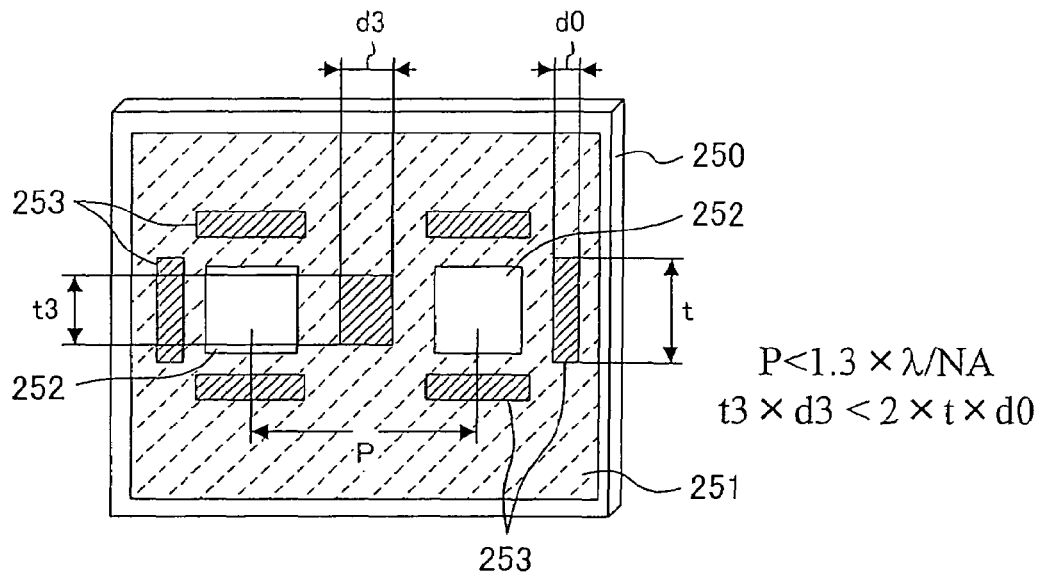
FIGS. 14A and 14B are diagrams of other variations of the plane structure of the photomask of Embodiment 2.

Furthermore, a mask structure as shown in FIG. 14A may be employed. Specifically, the phase shifters 253 sandwiched between the adjacent opening patterns is combined to one phase shifter, and assuming that this one phase shifter 253 has a width d3 and a length t3, the area of the phase shifter 253, namely, d3×t3, is set to be smaller than 2×t×d0.

Figure 14B:
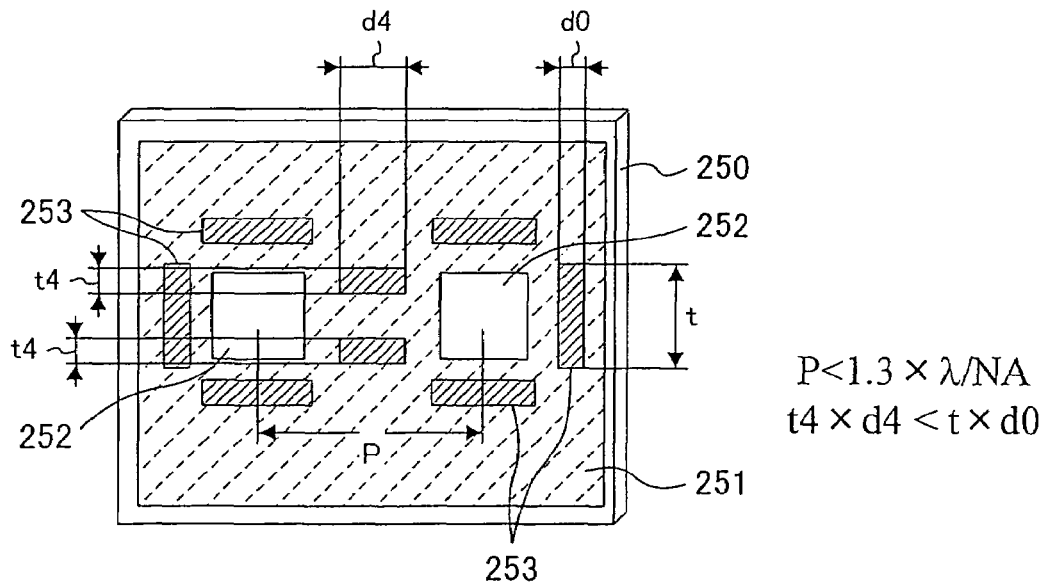

Moreover, a mask structure as shown in FIG. 14B may be employed. Specifically, as far as the area of the phase shifter 253 provided between the adjacent opening patterns is smaller than 2×t×d0, the phase shifter 253 may be in an arbitrary shape. In FIG. 14B, two rectangular patterns working as the phase shifter 253 provided between the adjacent opening patterns are arranged so as to extend along a direction along which the opening patterns (transparent portions) 252 are aligned. In this case, assuming that each phase shifter 253 has a width d4 and a length t4, the width and the length are set to satisfy t4×d4<t×d0. Although the two rectangular patterns are arranged as the phase shifters 253 in FIG. 14B, three, four or more rectangular patterns may be arranged instead as far as the total area of the phase shifters 253 provided between the adjacent opening patterns is smaller than 2×d0×t. Furthermore, in each of FIGS. 13B, 14A and 14B, when the area (the total area in FIG. 14B) of the phase shifter(s) 253 provided between the adjacent opening patterns is halved correspondingly to the pair of adjacent transparent portions 252, the halved area is smaller than the area, t×d0, of the other phase shifter 253 provided in the area other than that between the opening patterns.

As described so far, according to this embodiment, in the case where dense contact patterns are formed, phase shifters provided between transparent portions corresponding to dense contact holes are deformed so as to reduce the quantity of light in the opposite phase passing through these phase shifters. As a result, a photomask capable of good pattern formation can be realized.

Also in this embodiment, the cross-sectional structure of the photomask may be, for example, any of the cross-sectional structures shown in FIGS. 6A through 6D described in Embodiment 1.

Modification of Embodiment 2

A photomask according to a modification of Embodiment 2 of the invention will now be described with reference to the accompanying drawings.

Figure 15:
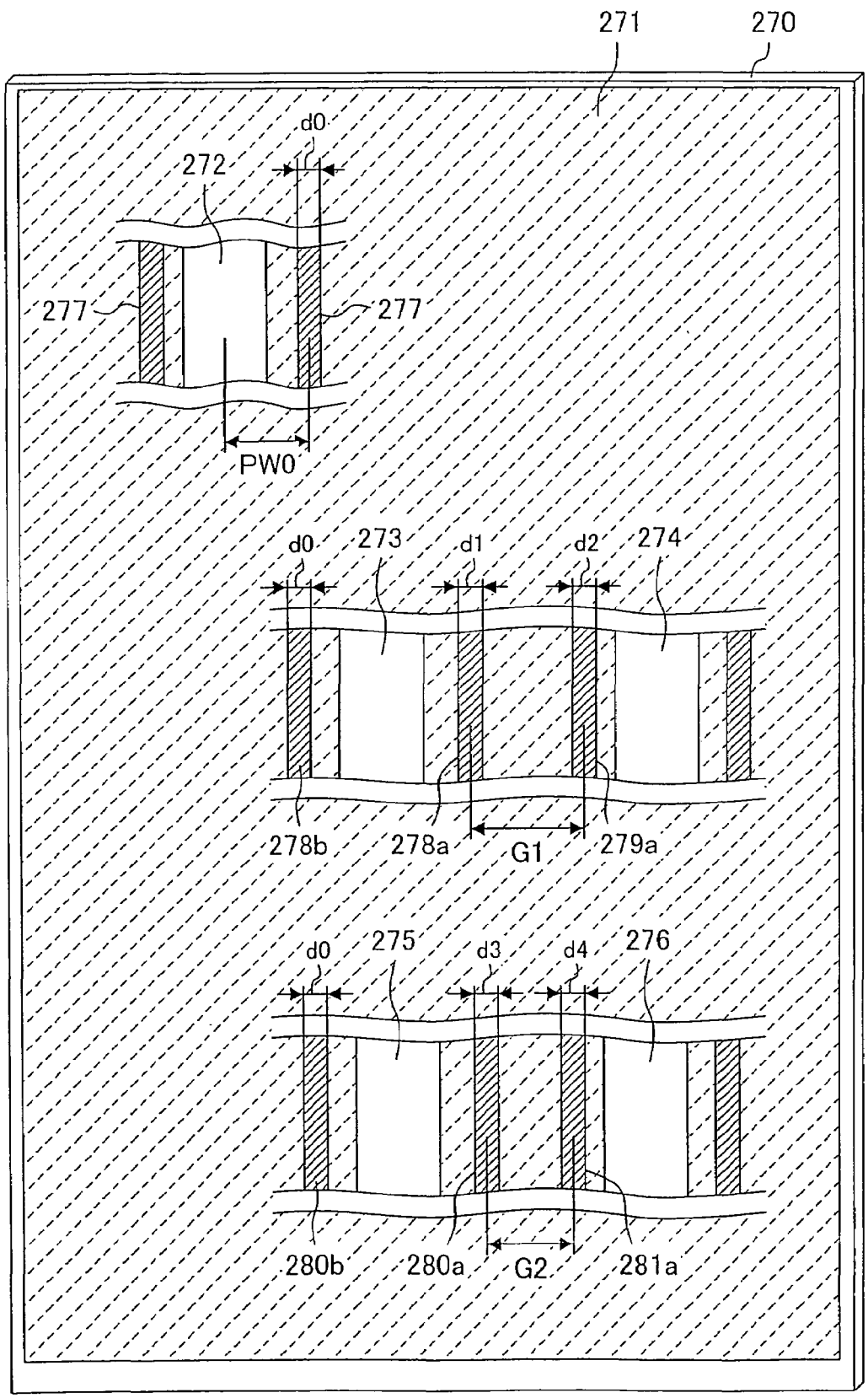
FIG. 15 is a plan view of a photomask according to a modification of Embodiment 2.

FIG. 15 is a plan view of the photomask of this modification. The photomask of this modification is used for simultaneously forming a plurality of fine line-shaped space patterns. Specifically, desired patterns to be formed in this modification are fine line-shaped space patterns differently from Embodiment 2 where the desired patterns are the contact hole patterns.

As shown in FIG. 15, on a transparent substrate 270, a semi-shielding portion 271 is formed so as to cover a sufficiently large area. Also, a transparent portion 272, a pair of transparent portions 273 and 274 and a pair of transparent portions 275 and 276 are provided in positions in the semi-shielding portion 201 corresponding to the desired space patterns to be formed on a wafer through the exposure. In this case, the transparent portion 272 is an opening pattern corresponding to an isolated space pattern, and each of the transparent portions 273 and 275 is an opening pattern corresponding to a space pattern having another space pattern closely disposed. Furthermore, auxiliary patterns corresponding to phase shifters 277 are provided around the transparent portion 272 with the semi-shielding portion 271 sandwiched therebetween so as to be parallel to the respective long sides of the line-shaped transparent portion 272. Similarly, auxiliary patterns corresponding to phase shifters 278 through 281 are provided respectively around the transparent portions 273 through 276 with the semi-shielding portion 271 sandwiched therebetween so as to be parallel to the respective long sides of the line-shaped transparent portions 273 through 276.

The phase shifters 277 provided around the transparent portion 272 are arranged so as to attain a mask structure good for forming an isolated fine space pattern, and each phase shifter 277 has a width d0.

The transparent portion 273 is close to the different transparent portion 274. In this case, among the phase shifters 278 and 279 respectively provided around the transparent portions 273 and 274, those provided in an area sandwiched between the transparent portions 273 and 274 are referred to as a phase shifter 278a and a phase shifter 279a. Furthermore, the transparent portion 275 is close to the different transparent portion 276. In this case, among the phase shifters 280 and 281 respectively provided around the transparent portions 275 and 276, those provided in an area sandwiched between the transparent portions 275 and 276 are referred to as a phase shifter 280a and a phase shifter 281a.

As a characteristic of this embodiment, assuming that the phase shifters 278a and 279a respectively have widths d1 and d2 and that a distance between the center lines of the phase shifters 278a and 279a is G1, the photomask has a structure in which a relationship (d1+d2)<2×d0 is satisfied under a condition of the distance G1 being 0.5×λ/NA or less as in Embodiment 2. In other words, when d1=d2, d1<d0 and d2<d0. In this case, among the phase shifters 278 surrounding the transparent portion 273, each of phase shifters 278b provided on sides not close to the different transparent portion 274 has the width d0 as in Embodiment 2.

Furthermore, as another characteristic of this embodiment, assuming that the phase shifters 280a and 281a respectively have widths d3 and d4 and that a distance between the center lines of the phase shifters 280a and 281a is G2, the photomask has a structure in which a relationship (d3+d4)<(d1+d2)<2×d0 is satisfied under a condition of G2<G1<0.5×λ/NA as in Embodiment 2. In other words, when d3=d4 and d1=d2, d3=d4<d1=d2<d0. In this case, among the phase shifters 280 surrounding the transparent portion 275, each of phase shifters 280b provided on sides not close to the different transparent portion 276 has the width d0.

Specifically, in this modification, similarly to Embodiment 2, in the relationship between phase shifters surrounding one transparent portion and phase shifters surrounding another transparent portion, in the case where any phase shifters of these transparent portions are adjacent and close to each other and spaced by a given or smaller distance, these phase shifters have smaller widths than the other phase shifters having no adjacent and close phase shifter spaced by the given or smaller distance. In this case, the widths of the phase shifters adjacent and close to each other and spaced by the given or smaller distance are preferably in proportion to a distance (a close distance) between these phase shifters. Alternatively, in the case of the photomask of FIG. 15, a difference between the width d1 of the phase shifter 278a (or the width d2 of the phase shifter 279a) and the width d3 of the phase shifter 280a (or the width d4 of the phase shifter 281a) is preferably in proportion to a difference between the distances G1 and G2.

According to this modification, similarly to Embodiment 2, the contrast of the light intensity distribution between the transparent portion and the auxiliary pattern can be emphasized by utilizing mutual interference between light passing through each transparent portion and light passing through the phase shifters, namely, the auxiliary patterns, provided around the transparent portion. Also, this effect to emphasize the contrast can be attained also in the case where a fine isolated space pattern corresponding to the transparent portion is formed by, for example, the positive resist process using the oblique incident exposure. Accordingly, an isolated space pattern and an isolated line pattern or dense patterns can be simultaneously thinned by employing the oblique incident exposure. Furthermore, even in the case where complicated and fine space patterns are close to each other, a pattern with a desired dimension can be satisfactorily formed.

Accordingly, also in this modification, in the case where a pair of phase shifters are provided to be close to each other and to be sandwiched between adjacent opening patterns (transparent portions) and the adjacent shifter distance G therebetween is smaller than $0.5 \times \lambda/NA$, a photomask capable of forming a light intensity distribution with high contrast even in forming dense space patterns can be realized by reducing the width of the phase shifters in proportion to the adjacent shifter distance G in the same manner as in Embodiment 2.

In the above description, the respective line-shaped transparent portions are independent patterns. However, the mask structure of this modification can be used even when the line-shaped transparent portions are not independent patterns as far as the above-described structure is employed in a specified area. In other words, the respective transparent portions may be connected to one another to form one pattern in areas other than the specified area.

A typical distance (an optimum distance) PW0 between the center of an opening pattern and the center line of a phase shifter for forming a fine space pattern is $0.325 \times \lambda/NA$ (see the modification of Embodiment 1). Accordingly, the case where the adjacent shifter distance G is $0.5 \times \lambda/NA$ or less, namely, the case where the width d of a phase shifter disposed between the adjacent transparent portions is preferably reduced, corresponds to the case of dense holes in which a desired distance P (=2×PW0+G) between the transparent portions corresponding to adjacent space patterns is $1.15 \times \lambda/NA$ or less.

Figure 16A:
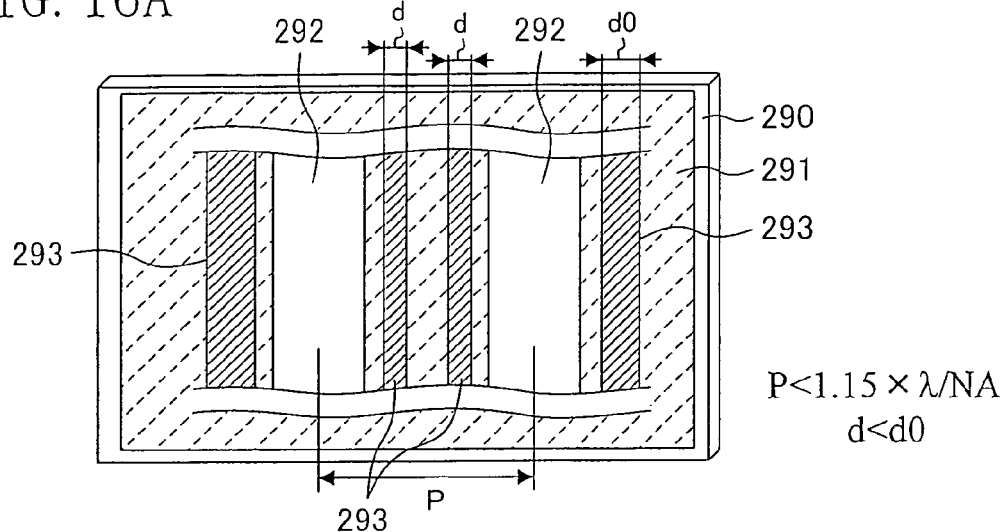
FIGS. 16A, 16B and 16C are diagrams of variations of the plane structure of the photomask of the modification of Embodiment 2.

Accordingly, in such a mask structure, assuming that a phase shifter 293 provided in an area sandwiched between transparent portions 292 (opening patterns) adjacent to each other with the distance P between their centers of $1.15 \times \lambda/NA$ or less has a width d and that another phase shifter 293 provided in the other area (i.e., an area where the distance P is not $1.15 \times \lambda/NA$ or less) has a width d0 as shown in FIG. 16A, these widths d and d0 are set to satisfy d<d0.

In FIG. 16A, the width of the phase shifter 293 provided in the area sandwiched between the adjacent transparent portions (opening patterns) 292 is reduced in order to reduce the quantity of the light in the negative phase passing through the phase shifter 293. Accordingly, with respect to the phase shifters 293 provided between the adjacent opening patterns, the two phase shifters 293 shown in FIG. 16A may be replaced with one phase shifter 293 shown in FIG. 16B as far as its width d1 satisfies d1<2×d0.

Also, in FIG. 16A, the width of the phase shifter 293 sandwiched between the adjacent opening patterns is reduced. Alternatively, the phase shifter 293 sandwiched between the adjacent opening patterns may be divided into a plurality of patterns as shown in FIG. 16C, so as to reduce the area of the phase shifter 293 (that is, the area per unit length along an extending direction of the opening pattern corresponding to the transparent portion 292). Specifically, assuming that the phase shifter 293 sandwiched between the adjacent opening patterns is divided into a plurality of patterns each with a width d2 and a length t and that these plural patterns are arranged along the extending direction of the opening patterns at a cycle TT, d2×t/TT is set to be smaller than 2×d0, whereas TT is preferably $(\lambda/NA)/2$ or less. This is for the following reason: In the case where the phase shifter 293 is divided at the cycle TT not more than the resolution limit $((\lambda/NA)/2)$ of the exposure system, the quantity of light passing through the phase shifter 293 is reduced in proportion to the area reduction of the phase shifter 293 but the divided shape of the phase shifter 293 does not affect the shape of the light intensity distribution.

Figure 16B:
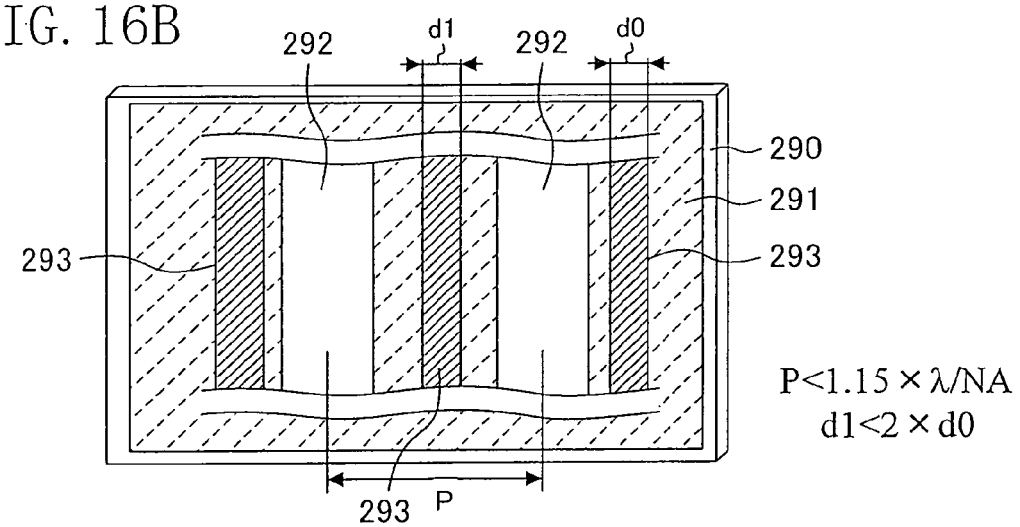
Figure 16C:
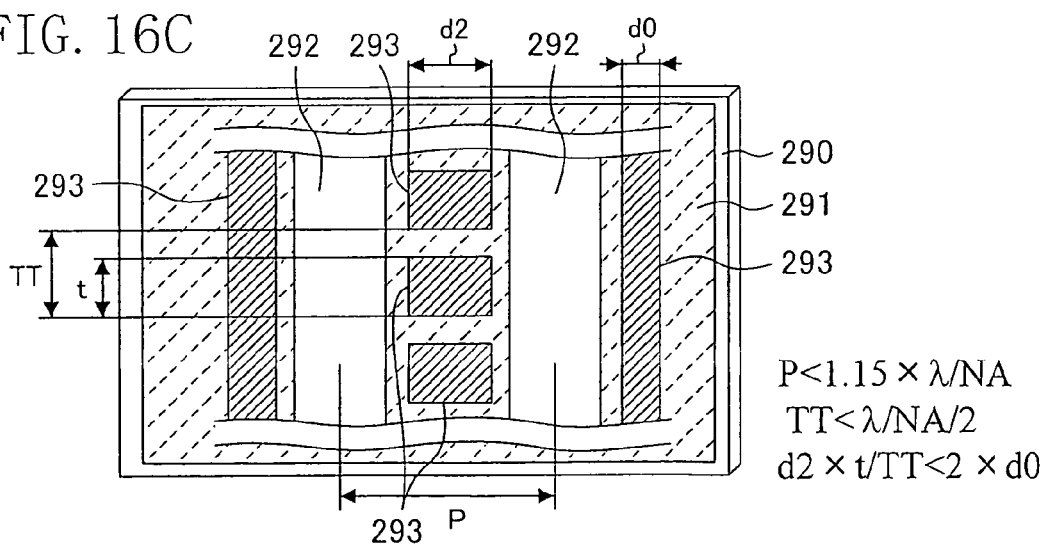

In each of FIGS. 16A through 16C, a semi-shielding portion 291 is formed on a transparent substrate 290 so as to cover a sufficiently large area, and the pair of line-shaped transparent portions 292 are provided to be adjacent to each other in the semi-shielding portion 291 in positions corresponding to desired space patterns to be formed on a wafer through the exposure.

Furthermore, in each of FIGS. 16B and 16C, when the area of the phase shifters 293 (the total area in FIG. 16C) provided between the opening patterns is halved correspondingly to the pair of transparent portions 292, the halved area is smaller than the area (the area per unit length along the extending direction of the opening patterns corresponding to the transparent portions 292) of the phase shifter 293 provided in the area other than that between the opening patterns.

As described so far, according to this modification, in forming dense space patterns, a phase shifter provided between adjacent transparent portions corresponding to the dense space patterns is deformed so as to reduce the quantity of the light in the opposite phase passing through the phase shifter. Thus, a photomask capable of good pattern formation can be realized.

EMBODIMENT 3

A photomask according to Embodiment 3 of the invention will now be described with reference to the accompanying drawings.

Figure 17:
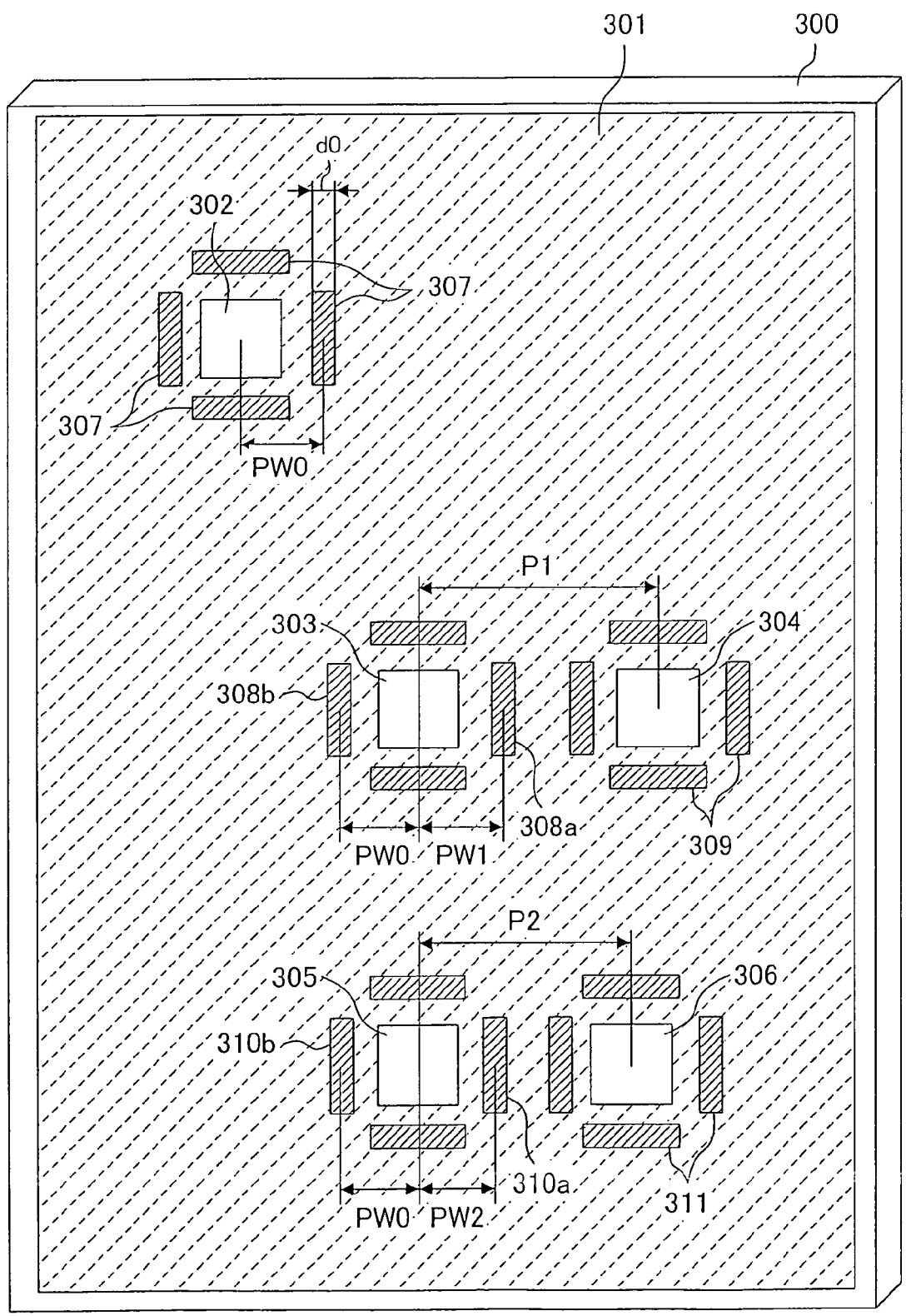
FIG. 17 is a plan view of a photomask according to Embodiment 3 of the invention.

FIG. 17 is a plan view of the photomask of Embodiment 3. The photomask of this embodiment is used for simultaneously forming a plurality of fine contact patterns.

As shown in FIG. 17, on a transparent substrate 300, a semi-shielding portion 301 is formed so as to cover a sufficiently large area. Also, in positions in the semi-shielding portion 301 corresponding to desired contact patterns to be formed on a wafer through the exposure, a transparent portion 302, a pair of transparent portions 303 and 304 and a pair of transparent portions 305 and 306 are provided as opening patterns. In this case, the transparent portion 302 is an opening pattern corresponding to an isolated contact pattern, and each of the transparent portions 303 and 305 is an opening pattern corresponding to a contact pattern having another contact pattern closely disposed. Furthermore, around the transparent portion 302, auxiliary patterns corresponding to phase shifters 307 are provided with the semi-shielding portion 301 sandwiched therebetween, for example, so as to be parallel to respective sides of the transparent portion 302 in the shape of a square or a rectangle and to surround the transparent portion 302. Similarly, around each of the transparent portions 303 through 306, auxiliary patterns corresponding to phase shifters 308, 309, 310 or 311 are provided with the semi-shielding portion 301 sandwiched therebetween, for example, so as to be parallel to respective sides of each of the transparent portions 303 through 306 each in the shape of a square or a rectangle and to surround the transparent portion 303, 304, 305 or 306.

The phase shifters 307 provided around the transparent portion 302 are disposed so as to attain a mask structure good for forming an isolated contact pattern. In this case, the phase shifter 307 has a width d0 and the center line of the phase shifter 307 is away from the center of the transparent portion 302 by a distance PW0.

Also, the transparent portion 303 is close to the different transparent portion 304 in one direction and is close to no transparent portion in the other directions. In this case, one of the phase shifters 308 provided around the transparent portion 303 in this one direction is designated as a phase shifter 308a and the other phase shifters 308 disposed in the other directions are designated as phase shifters 308b. Furthermore, the transparent portion 305 is close to the different transparent portion 306 in one direction and is close to no transparent portion in the other directions. In this case, one of the phase shifters 310 provided around the transparent portion 305 in this one direction is designated as a phase shifter 310a and the other phase shifters 310 disposed in the other directions are designated as phase shifters 310b.

As a characteristic of this embodiment, assuming that a distance P1 between the center of the transparent portion 303 and the center of the transparent portion 304 is approximately $1.3\times\lambda/NA$, a distance PW1 between the center of the phase shifter 308a and the center of the transparent portion 303 is set to satisfy PW1>PW0. In this case, a distance between the center of the phase shifter 308b to the center of the transparent portion 303 is set to the distance PW0.

Furthermore, as another characteristic of this embodiment, assuming that a distance P2 between the center of the transparent portion 305 and the center of the transparent portion 306 is approximately $1.0\times\lambda/NA$, a distance PW2 between the center of the phase shifter 310a and the center of the transparent portion 305 is set to satisfy PW2<PW0. In this case, a distance between the center of the phase shifter 310b and the center of the transparent portion 305 is set to the distance PW0.

Specifically, in this embodiment, in the arrangement of phase shifters (auxiliary patterns) seen from the center of an opening pattern (a transparent portion), in the case where any different opening pattern is close to this opening pattern, the position of a phase shifter preferable for forming an isolated fine contact hole is changed in accordance with the distance (close distance) between the close opening patterns.

According to this embodiment, the contrast of the light intensity distribution between the transparent portion and the auxiliary pattern can be emphasized by utilizing mutual interference between light passing through each transparent portion and light passing through the phase shifters, namely, the auxiliary patterns, provided around the transparent portion. Also, this effect to emphasize the contrast can be attained also in the case where a fine isolated space pattern corresponding to the transparent portion is formed by, for example, the positive resist process using the oblique incident exposure. Accordingly, an isolated space pattern and an isolated line pattern or dense patterns can be simultaneously thinned by employing the oblique incident exposure. Furthermore, even in the case where complicated and fine space patterns are close to each other, a pattern with a desired dimension can be satisfactorily formed.

Now, the photomask of this embodiment capable of satisfactorily forming an isolated contact hole and densely arranged contact holes will be described in detail on the basis of results of simulation.

The plane structure of a photomask used in the simulation performed for confirming the effect of this embodiment is the same as that (of Embodiment 2) shown in FIG. 10A. As shown in FIG. 10A, on a transparent substrate 250, a semi-shielding portion 251 is formed so as to cover a sufficiently large area. Also, in positions in the semi-shielding portion 251 corresponding to desired contact patterns to be formed on a wafer through the exposure, a plurality of transparent portions 252 each in the shape of a square with a side dimension W are provided to be adjacent to one another. Also, around each of the transparent portions 252, phase shifters (auxiliary patterns) 253 are provided so as to have their center lines in positions away from the center of each transparent portion 252 by a distance PW0. In this case, each phase shifter 253 is in a rectangular shape with a width d and a length t. Furthermore, a distance between the center lines of the phase shifters 253 adjacent and close to each other in an area between the adjacent transparent portions 252 (hereinafter referred to as the adjacent shifter distance) is assumed to be a distance G.

FIG. 10B shows the profile of a light intensity distribution formed through the exposure using the photomask of FIG. 10A. In FIG. 10B, the light intensity obtained at the center of the transparent portion 252 is expressed as Ip, the light intensity obtained at the center between the adjacent transparent portions 252 is expressed as Is, and the light intensity obtained in a position where the light intensity is minimum in the periphery of the transparent portion 252 is expressed as Ib. In this case, the center between the adjacent transparent portions 252 corresponds to the center between the adjacent phase shifters 253. Also, the light intensity simulation is performed under conditions of the exposure wavelength λ of 193 nm and the numerical aperture NA of 0.65. Furthermore, ⅔ annular illumination having the outer diameter with a degree of coherence of 0.8 and the inner diameter with a degree of coherence of 0.53 is assumed to be used. In addition, the transmittance of the semi-shielding portion 201 is set to 6%.

Furthermore, in the photomask of FIG. 10A, in order that each contact pattern can be satisfactorily formed even in an isolated state, the width d of each phase shifter 253 is set to approximately $0.15\times\lambda/NA$ (=approximately 44 nm) and the distance PW0 between the phase shifter 253 and the transparent portion 252 is set to approximately $0.4\times\lambda/NA$ (=approximately 120 nm). Moreover, in order to adjust the contact hole size to a desired size of 100 nm, the side dimension W of the transparent portion 252 and the length t of the phase shifter 253 are set to 160 nm. The change, calculated through the simulation, of the light intensity Ip (namely, the light intensity obtained at the center of the transparent portion 252) of FIG. 10B in accordance with the change of a distance P (=G+2×PW0) between the centers of the opening patterns (transparent portions) 252 in the aforementioned mask structure is shown in a graph of FIG. 18A, wherein the value of the distance P is normalized by λ/NA.

Figure 18A:
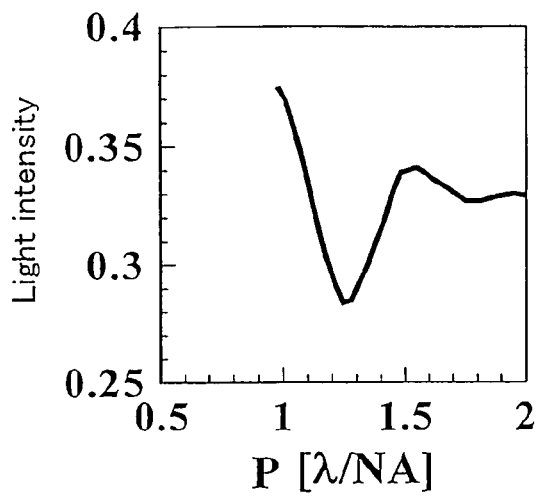
FIGS. 18A, 18B, 18C and 18D are diagrams of results of simulation performed for confirming the effect of the photomask of Embodiment 3.

As shown in FIG. 18A, when the distance P between the centers of the opening patterns is $1.5\times\lambda/NA$ or less, the light intensity Ip is abruptly lowered and becomes the minimum when the distance P is approximately $1.3\times\lambda/NA$. Furthermore, when the distance P is $1.3\times\lambda/NA$ or less, the light intensity Ip starts to abruptly increase and becomes higher than that obtained when the transparent portion 252 is isolated (namely, when the distance P is infinite) when the distance P is approximately λ/NA.

As described also in Embodiment 2, when opening patterns (transparent portions) are close to each other, the width of the semi-shielding portion sandwiched between adjacent phase shifters provided in an area between these opening patterns is so small that the quantity of light in the positive phase passing through the photomask is reduced. Also, the light intensity peak Ip obtained at the center of the opening pattern is formed by the light in the positive phase, and therefore, when the quantity of the light in the positive phase is reduced as described above, the light intensity Ip is lowered. Furthermore, since such a phenomenon is serious when the distance G between the adjacent phase shifters is $0.5\times\lambda/NA$ (see Embodiment 2), the phenomenon is serious when the distance P between the centers of opening patterns close to each other (hereinafter referred to as close opening center distance) is $G+2\times PW0=0.5\times\lambda/NA+2\times 0.4\times\lambda/NA=1.3\times\lambda/NA$.

Furthermore, when one transparent portion is close to a different transparent portion, the quantity of the light in the positive phase passing through the photomask is increased again owing to light in the positive phase passing through the different transparent portion. In this case, the influence of the different transparent portion is remarkable when the distance P between the centers of these transparent portions (i.e., the close opening center distance) is $\lambda/NA$.

As described so far, when the close opening center distance P is in the vicinity of $1.3\times\lambda/NA$, the light intensity Ip obtained at the center of the transparent portion is lowered, but when the close opening center distance P is in the vicinity of $\lambda/NA$, the light intensity Ip obtained at the center of the transparent portion is increased. It is noted that when the light intensity Ip is lowered, the contrast is lowered, resulting in preventing good pattern formation. Furthermore, when the light intensity Ip is increased, the size of a contact hole to be formed is increased, resulting in preventing fine pattern formation.

Figure 18B:
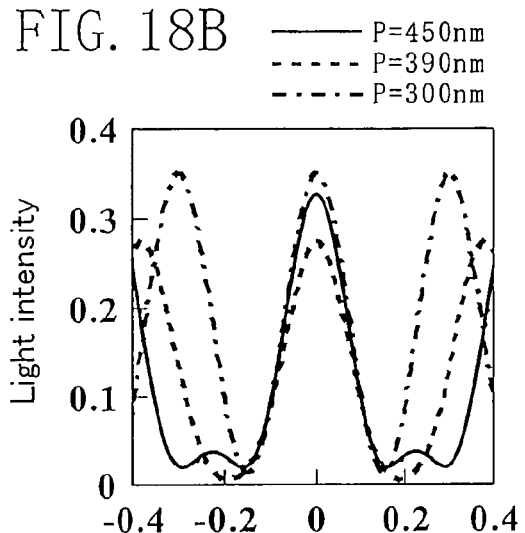

FIG. 18B shows the result of simulation similar to that performed for obtaining FIG. 10B, and specifically shows the light intensity distribution formed in a position corresponding to line AB of the photomask of FIG. 10A. FIG. 18B shows the results of the simulation for the light intensity distribution profile obtained by respectively setting the close opening center distance P to 450 nm (=approximately $1.5\times\lambda/NA$), 390 nm (=approximately $1.3\times\lambda/NA$) and 300 nm (=approximately $1.0\times\lambda/NA$). As shown in FIG. 18B, when the close opening center distances P are different, namely, when the closeness of adjacent opening patterns are different, the profiles of the light intensity distributions corresponding to the centers of the respective opening patterns do not accord with each other, and hence, fine contact patterns cannot be uniformly formed.

Figure 18C:
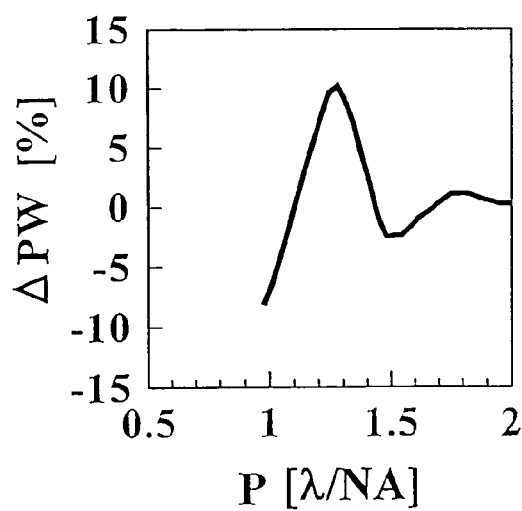

In contrast, the present inventor has found as a result of detailed simulation that the light intensity profiles corresponding to the centers of opening patterns can be made uniform regardless of the close opening center distance P by changing the position of a phase shifter seen from the center of each opening pattern in accordance with the close opening center distance P. Specifically, when the position of a phase shifter against the close opening center distance P for making uniform the light intensity profiles corresponding to the centers of the opening patterns is expressed as PW(P), $\Delta PW(P)$ defined as $(PW(P)-PW0)/PW0$ (i.e., $PW(P)=PW0+\Delta PW(P)\times PW0$) is expressed as shown in a graph of FIG. 18C. Specifically, when the close opening center distance P is in the vicinity of $1.3\times\lambda/NA$, the optimum position PW(P) of a phase shifter against each close opening center distance P is preferably set to be larger by approximately 10% than a position PW0 of the phase shifter for satisfactorily forming an isolated contact pattern. Also, when the close opening center distance P is in the vicinity of $\lambda/NA$, the position PW(P) is preferably set to be smaller by approximately 10% than the position PW0.

Figure 18D:
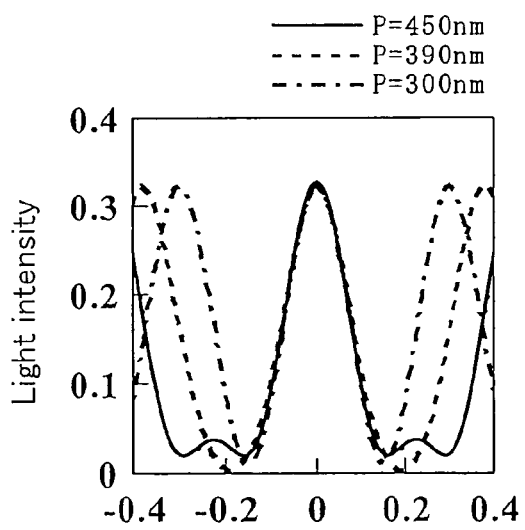

Also, FIG. 18D shows the result of the simulation similar to that performed for obtaining FIG. 10B, and specifically shows the light intensity distribution formed in the position corresponding to line AB in the photomask of FIG. 10A. FIG. 18D shows the results of the simulation for the light intensity distribution profile obtained by using the photomask in which a phase shifter is disposed in the position shown in FIG. 18C respectively when the close opening center distance P is 450 nm (=approximately $1.5\times\lambda/NA$), 390 nm (=approximately $1.3\times\lambda/NA$) and 300 nm (=approximately $1.0\times\lambda/NA$). As shown in FIG. 18D, when the phase shifter is disposed in the position shown in the graph of FIG. 18C, the profiles of the light intensity distributions corresponding to the centers of the opening patterns can be made to accord with each other with respect to all the aforementioned values of the close center line distance P.

On the basis of the results of these simulations, it can be understood that when there are a plurality of opening patterns (transparent portions) close to one another and each surrounded with phase shifters, the position PW seen from the center of the transparent portion of each phase shifter is preferably set as follows in accordance with the close center line distance P:

First, when the close opening center distance P is in the vicinity of $1.3\times\lambda/NA$, and more specifically, when $1.15\times\lambda/NA<P<1.45\times\lambda/NA$, assuming that a phase shifter provided on a side of an opening pattern close to another opening pattern is disposed in a position PW1 seen from the center of the opening pattern and a phase shifter provided on another side of the opening pattern not close to another opening pattern is disposed in a position PW0 seen from the center of the opening pattern, the position PW1 is preferably larger than the position PW0, and more preferably, the position PW1 is larger than the position PW0 by 5% or more.

Next, when the close opening center distance P is in the vicinity of $\lambda/NA$, and more specifically, when $0.85\times\lambda/NA<P<1.15\times\lambda/NA$, assuming that a phase shifter provided on a side of one opening pattern close to another opening pattern is disposed in a position PW2 seen from the center of the opening pattern and a phase shifter provided on another side of the opening pattern not close to another opening pattern is disposed in a position PW0 seen from the center of the opening pattern, the position PW2 is preferably smaller than the position PW0, and more preferably, the position PW2 is smaller than the position PW0 by 5% or more.

As described so far, according to this embodiment, in the case where dense contact patterns are formed, the position of a phase shifter provided in an area corresponding to the dense contact holes (namely, the distance of the phase shifter from the center of a transparent portion) is changed in accordance with the close distance of contact patterns (namely, the close opening center distance P). As a result, a photomask capable of forming a uniform light intensity distribution profile in forming contact patterns with an arbitrary density can be realized. Accordingly, fine contact hole patterns arbitrarily arranged can be satisfactorily formed.

Also in this embodiment, the cross-sectional structure of the photomask may be, for example, any of the cross-sectional structures shown in FIGS. 6A through 6D described in Embodiment 1.

Modification of Embodiment 3

A photomask according to a modification of Embodiment 3 of the invention will now be described with reference to the accompanying drawings.

Figure 19:
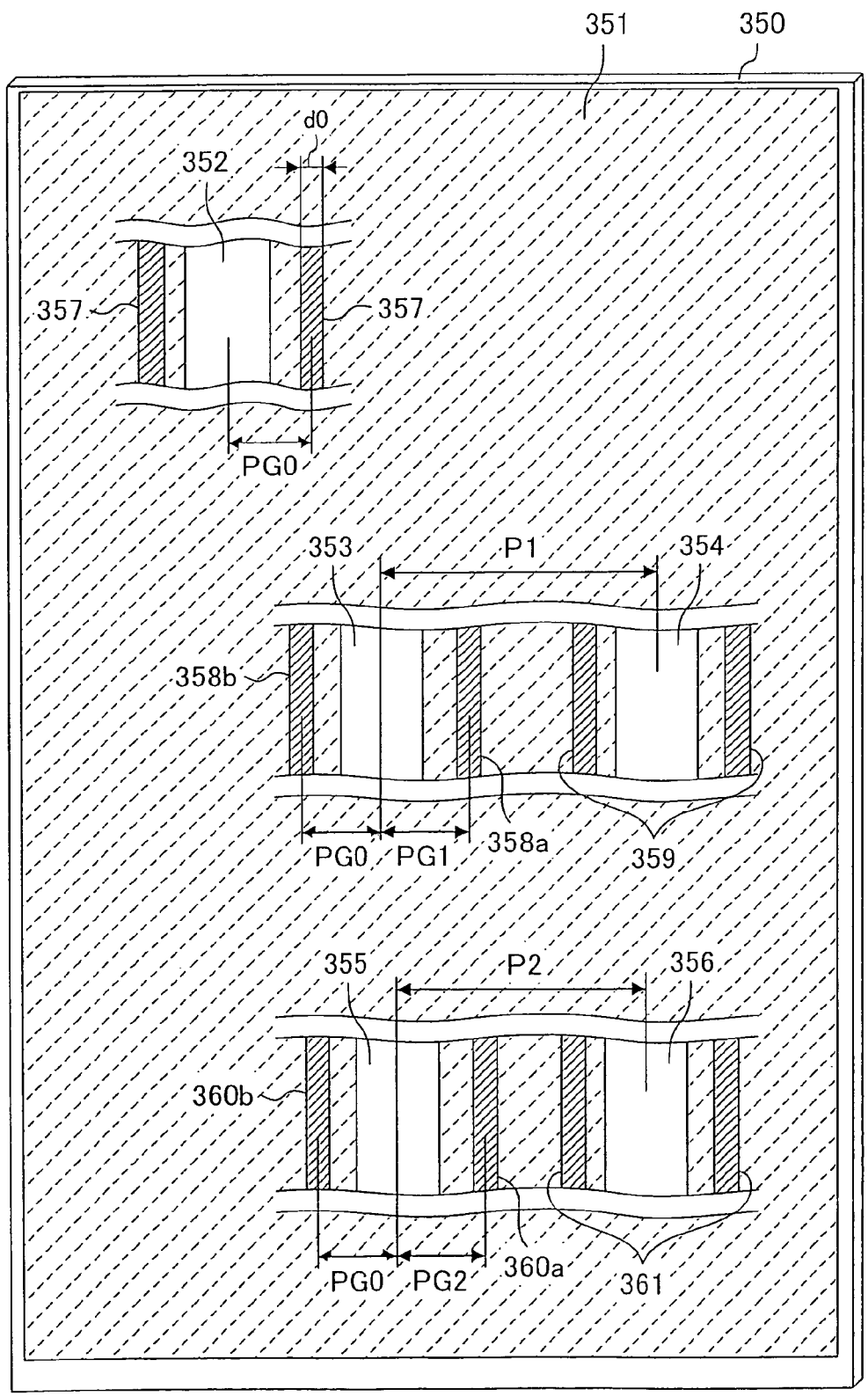
FIG. 19 is a plan view of a photomask according to a modification of Embodiment 3.

FIG. 19 is a plan view of the photomask of this modification. The photomask of this modification is used for simultaneously forming a plurality of fine line-shaped space patterns. Specifically, desired patterns to be formed in this modification are fine line-shaped space patterns differently from Embodiment 3 where the desired patterns are the contact hole patterns.

As shown in FIG. 19, on a transparent substrate 350, a semi-shielding portion 351 is formed so as to cover a sufficiently large area. Also, in the semi-shielding portion 351, a transparent portion 352, a pair of transparent portions 353 and 354 and a pair of transparent portions 355 and 356 are provided in positions corresponding to the desired space patterns to be formed on a wafer through the exposure. In this case, the transparent portion 352 is an opening pattern corresponding to an isolated space pattern, and each of the transparent portions 353 and 355 is an opening pattern corresponding to a space pattern having another space pattern closely disposed. Furthermore, auxiliary patterns corresponding to phase shifters 357 are provided around the transparent portion 352 with the semi-shielding portion 351 sandwiched therebetween so as to be parallel to the respective long sides of the line-shaped transparent portion 352. Similarly, auxiliary patterns corresponding to phase shifters 358 through 361 are provided respectively around the transparent portions 353 through 356 with the semi-shielding portion 351 sandwiched therebetween so as to be parallel to the respective long sides of the line-shaped transparent portions 353 through 356.

The phase shifters 357 provided around the transparent portion 352 are arranged so as to attain a mask structure good for forming an isolated space pattern, and each phase shifter 357 has a width d0 and a distance between the center line of the phase shifter 357 and the center of the transparent portion 352 is a distance PG0.

The transparent portion 353 is close to the different transparent portion 354 in one direction and is not close to another transparent portion in the other directions. In this case, one of the phase shifters 358 provided around the transparent portion 353 in this one direction is designated as a phase shifter 358a and the other phase shifters 358 provided around the transparent portion 353 in the other directions are designated as phase shifters 358b. Furthermore, the transparent portion 355 is close to the different transparent portion 356 in one direction and is not close to another transparent portion in the other directions. In this case, one of the phase shifters 360 provided around the transparent portion 355 in this one direction is designated as a phase shifter 360a and the other phase shifters provided around the transparent portion 355 in the other directions are designated as phase shifters 360b.

As a characteristic of this embodiment, when a distance P1 between the center of the transparent portion 353 and the center of the transparent portion 354 is approximately 1.15×λ/NA, a distance PG1 from the center of the phase shifter 358a to the center of the transparent portion 353 is set to satisfy PG1>PG0. In this case, a distance from the center of the phase shifter 358b to the center of the transparent portion 353 is set to the distance PG0.

Furthermore, as another characteristic of this embodiment, when a distance P2 between the center of the transparent portion 355 and the center of the transparent portion 356 is approximately 0.85×λ/NA, a distance PG2 from the center of the phase shifter 360a to the center of the transparent portion 355 is set to satisfy PG2<PG0. In this case, a distance from the center of the phase shifter 360b to the center of the transparent portion 355 is set to the distance PG0.

Specifically, in this modification, with respect to the position of a phase shifter (auxiliary pattern) seen from the center of an opening pattern (transparent portion), when another opening pattern is close to the opening pattern, the position of a phase shifter preferred for forming an isolated fine space pattern is changed in the same manner as in Embodiment 3 in accordance with the distance between these opening patterns (the close opening center distance).

According to this modification, the contrast of the light intensity distribution between the transparent portion and the auxiliary pattern can be emphasized by utilizing mutual interference between light passing through each transparent portion and light passing through the phase shifters, namely, the auxiliary patterns, provided around the transparent portion. Also, this effect to emphasize the contrast can be attained also in the case where a fine isolated space pattern corresponding to the transparent portion is formed by, for example, the positive resist process using the oblique incident exposure. Accordingly, an isolated space pattern and an isolated line pattern or dense patterns can be simultaneously thinned by employing the oblique incident exposure. Furthermore, even in the case where complicated and fine space patterns are close to each other, a pattern with a desired dimension can be satisfactorily formed.

Also in this modification, the profile of a light intensity distribution corresponding to the center of an opening pattern (transparent portion) is changed in accordance with the close opening center distance due to the influence of another opening pattern close to this opening pattern as described in Embodiment 3. However, in this embodiment, since the opening pattern does not correspond to a contact pattern but corresponds to a line-shaped space pattern, the relationship between the close opening center distance and the profile of the light intensity distribution is different from that described in Embodiment 3.

Figure 20A:
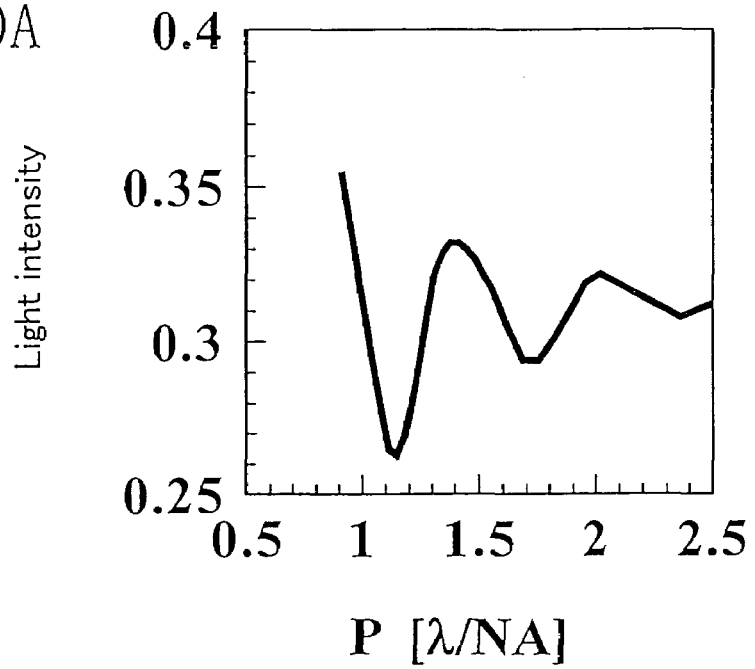
FIGS. 20A and 20B are diagrams of results of simulation performed for confirming the effect of the photomask of the modification of Embodiment 3.

FIG. 20A shows the dependency of the light intensity Ip obtained at the center of an opening pattern (a transparent portion) on the close opening center distance P obtained through the same calculation carried out for obtaining FIG. 18A of Embodiment 3. In FIG. 20A, the value of the close opening center distance P is normalized by λ/NA.

As shown in FIG. 20A, differently from Embodiment 3, the light intensity Ip is the minimum when the close opening center distance P is in the vicinity of 1.15×λ/NA. Also, when the close opening center distance P is in the vicinity of 0.85×λ/NA, the light intensity Ip has a value larger than that obtained when the transparent portion is isolated (i.e., when the close opening center distance P is infinite). In other words, when the close opening center distances P are different, namely, when the closeness of adjacent opening patterns are different, the profiles of the light intensity distributions corresponding to the centers of the respective opening patterns do not accord with each other, and hence, fine contact patterns cannot be uniformly formed.

Figure 20B:
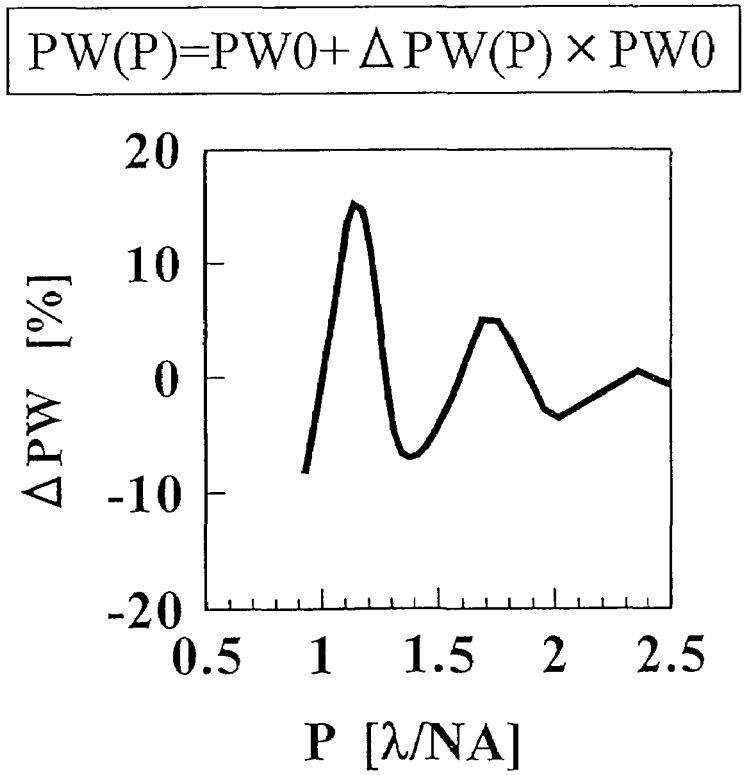

In contrast, the present inventor has found that the light intensity profiles corresponding to the centers of opening patterns can be made uniform regardless of the close opening center distance P by changing the position of a phase shifter seen from the center of the opening pattern in accordance with the close opening center distance P. Specifically, when the position of a phase shifter against each close opening center distance P for making uniform the light intensity profiles corresponding to the centers of the opening patterns is expressed as PW(P), ΔPW(P) defined as (PW(P)−PW0)/PW0 (i.e., PW(P)=PW0+ΔPW(P)×PW0) is expressed as shown in a graph of FIG. 20B. Specifically, when the close opening center distance P is in the vicinity of 1.15×λ/NA, the optimum position PW(P) of a phase shifter against each close opening center distance P is preferably set to be larger by approximately 10% than a position PW0 of the phase shifter for satisfactorily forming an isolated contact pattern. Also, when the close opening center distance P is in the vicinity of 0.85×λ/NA, the position PW(P) is preferably set to be smaller by approximately 10% than the position PW0.

On the basis of the above description, it is found that when there are a plurality of line-shaped opening patterns close to one another, the position PW of each phase shifter provided around the opening pattern (transparent portion) seen from the center of the transparent portion is preferably set as follows in accordance with the close opening center distance P:

First, when the close opening center distance P is in the vicinity of 1.15×λ/NA, and more specifically, when 1.0×λ/

NA<P<1.3×λ/NA, assuming that a phase shifter provided on a side of an opening pattern close to another opening pattern is disposed in a position PG1 seen from the center of the opening pattern and that a phase shifter provided on another side of the opening pattern not close to another opening pattern is disposed in a position PG0 seen from the center of the opening pattern, the position PG1 is preferably larger than the position PG0, and more preferably, the position PG1 is larger than the position PG0 by 5% or more.

Next, when the close opening center distance P is in the vicinity of 0.85×λ/NA, and more specifically, when 0.7×λ/NA<P<1.0×λ/NA, assuming that a phase shifter provided on one side of one opening pattern close to another opening pattern is disposed in a position PG2 seen from the center of the opening pattern and that a phase shifter provided on another side of the opening pattern not close to another opening pattern is disposed in a position PG0 seen from the center of the opening pattern, the position PG2 is preferably smaller than the position PG0, and more preferably, the position PG2 is smaller than the position PG0 by 5% or more.

As described so far, according to this modification, in the case where dense space patterns are formed, the position of a phase shifter provided in an area corresponding to the dense space patterns (namely, the distance of the phase shifter from the center of a transparent portion) is changed in accordance with the close distance of contact patterns (namely, the close opening center distance P). As a result, a photomask capable of forming a uniform light intensity distribution profile in forming space patterns with an arbitrary density can be realized. Accordingly, fine space patterns arbitrarily arranged can be satisfactorily formed.

EMBODIMENT 4

A photomask according to Embodiment 4 of the invention will now be described with reference to the accompanying drawings.

Figure 21A:
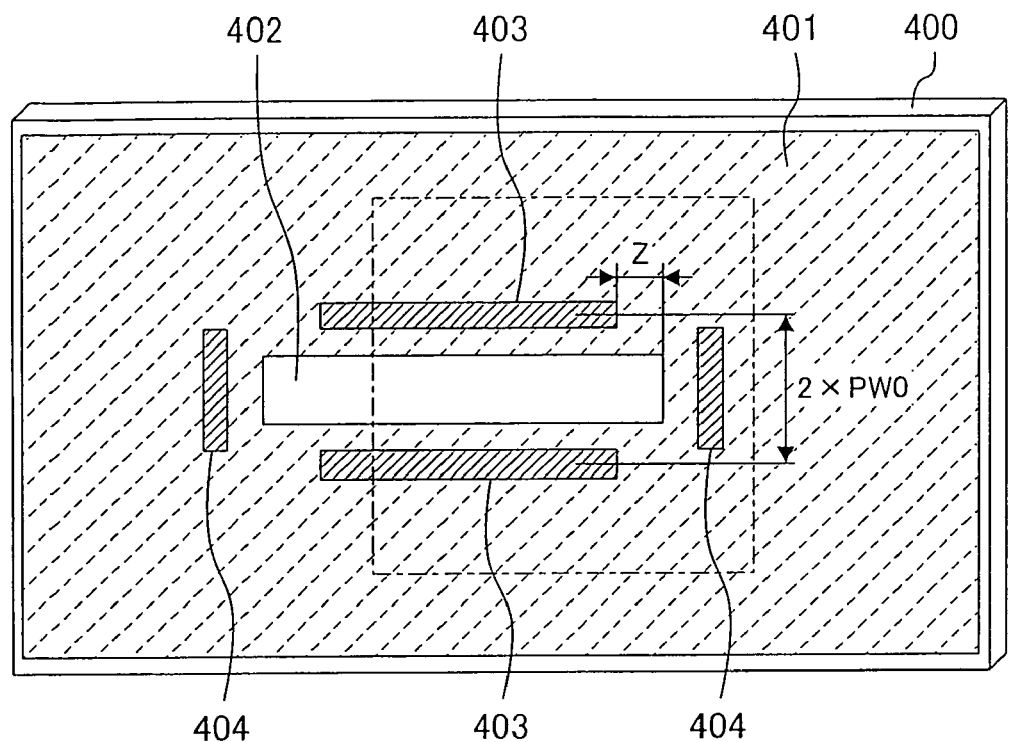
FIG. 21A is a plan view of a photomask according to Embodiment 4 of the invention and FIG. 21B is a diagram of a result of pattern formation simulation using the photomask of FIG. 21A.

FIG. 21A is a plan view of the photomask of Embodiment 4. The photomask of this embodiment is used for forming a fine line-shaped space pattern.

As shown in FIG. 21A, on a transparent substrate 400, a semi-shielding portion 401 is formed so as to cover a sufficiently large area. Also, in the semi-shielding portion 401, in a position corresponding to a desired space pattern to be formed on a wafer through the exposure, a line-shaped opening pattern is formed as a transparent portion 402. Furthermore, around the transparent portion 402, auxiliary patterns corresponding to phase shifters 403 and 404 are provided so as to surround the transparent portion 402 with the semi-shielding portion 401 sandwiched therebetween. Specifically, one pair of phase shifters 403 are provided so as to sandwich the transparent portion 402 and to be parallel to the transparent portion 402 along the lengthwise direction (line direction) of the transparent portion 402, and another pair of phase shifters 404 are provided so as to sandwich the transparent portion 402 and to be parallel to the transparent portion 402 along the width direction of the transparent portion 402.

In this case, the pair of phase shifters 403 are arranged, for obtaining a mask structure good for forming an isolated space pattern, in such a manner that a distance between the phase shifters 403 with the transparent portion 402 sandwiched therebetween (more precisely, a distance between the center lines of the phase shifters 403) is a distance PW0×2.

As a characteristic of this embodiment, the phase shifters 403 are shorter than the transparent portion 402 along the line direction of the transparent portion 402, namely, the ends (line ends) along the longitudinal direction of the transparent portion 402 are protruded beyond the line ends of the phase shifters 403. The phase shifters 404 opposing the line ends of the transparent portion 402 may be longer or shorter than the width (line width) of the transparent portion 402.

According to Embodiment 4, the following effect can be attained in addition to the effects of Embodiments 1 through 3 above: In general, in forming a line-shaped pattern by using an opening pattern (transparent portion), the quantity of light passing through a line end of the pattern is reduced, and hence, the line end of the pattern formed after the exposure is receded, resulting in reducing the length of the line. In contrast, in this embodiment, parts of the phase shifters surrounding the line ends of the opening pattern are removed, so as to increase the quantity of light passing through the opening pattern. As a result, the line end of a pattern formed after the exposure (hereinafter referred to as a transferred pattern) can be prevented from receding.

Figure 21B:
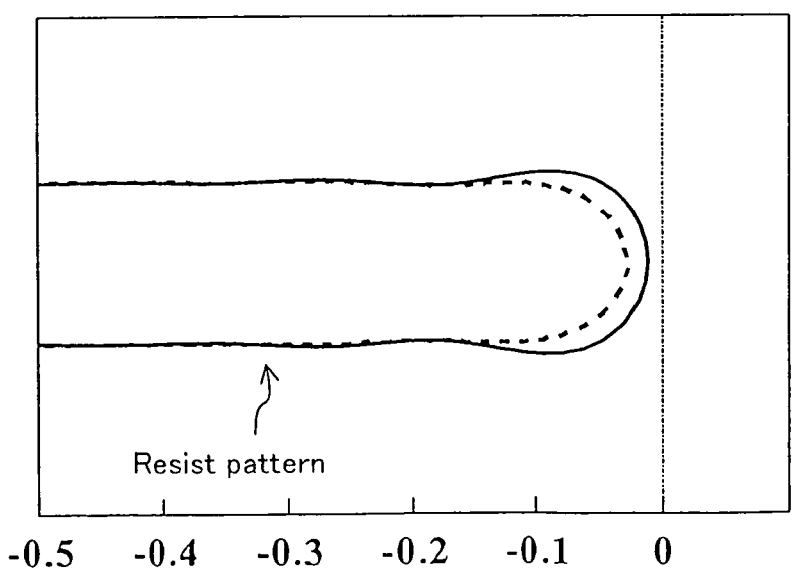

FIG. 21B shows results of pattern formation simulation performed by using the photomask of FIG. 21A in which the line ends of the transparent portion 402 are protruded beyond the line ends of the phase shifters 403 by a dimension Z set to 0 nm and 100 nm. On the abscissa of FIG. 21B, a position with the scale of 0 (zero) corresponds to the end of the transparent portion (opening pattern) 402. Also, in FIG. 21B, a pattern shape obtained when the dimension Z is 100 nm is shown with a solid line and a pattern shape obtained when the dimension Z is 0 nm is shown with a broken line. As shown in FIG. 21B, in the phase shifters provided in parallel to the opening pattern, when the parts thereof disposed in the vicinity of the line ends of the opening pattern are removed, the line ends of the transferred pattern (resist pattern) can be prevented from receding.

Now, a result of simulation performed for quantifying the part of the phase shifter to be removed in the vicinity of the line end of the opening pattern for preventing the line end of the transferred pattern from receding will be described.

Figure 22A:
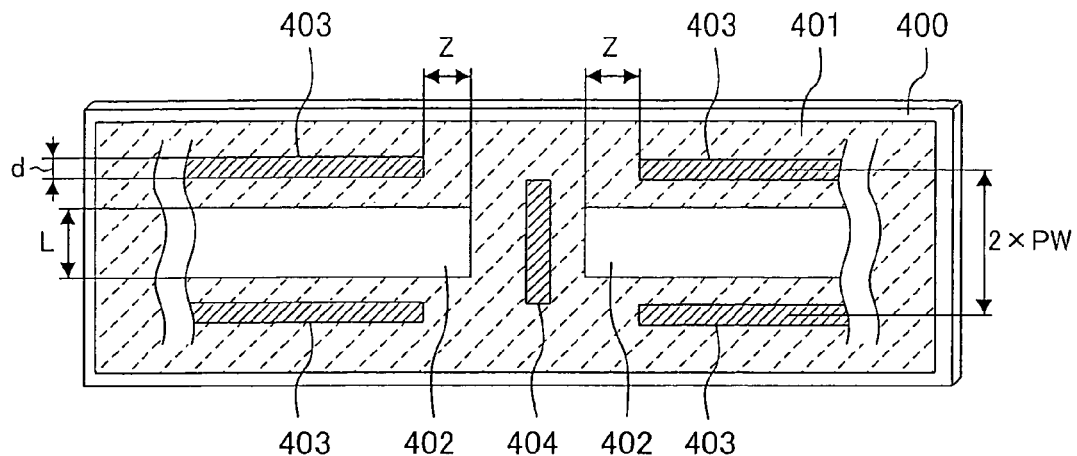
FIGS. 22A, 22B and 22C are diagrams of results of simulation performed for confirming the effect of the photomask of Embodiment 4.

FIG. 22A is a plan view of a photomask used in the simulation. In FIG. 22A, like reference numerals are used to refer to like elements shown in FIG. 21A so as to omit the description.

As shown in FIG. 22A, with respect to each of a pair of line-shaped transparent portions (opening patterns) 402 having a width L and opposing each other at their line ends, a pair of phase shifters 403 with a width d are provided along the line direction of the transparent portion 402 so as to sandwich each transparent portion 402 therebetween. In this case, it is assumed that a distance between the center lines of the phase shifters 403 sandwiching the transparent portion 402 is a distance 2×PW. Also, it is assumed that a part of the phase shifter 403 removed in the vicinity of the line end of the transparent portion 402 has a dimension Z.

Figure 22B:
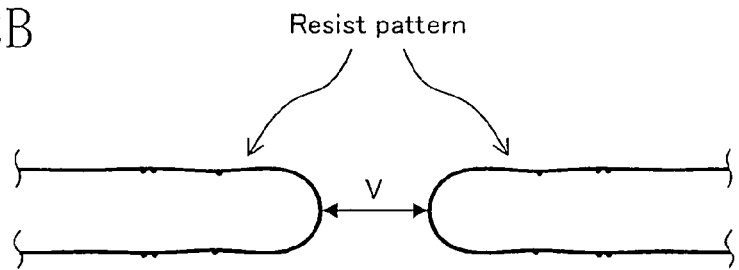

FIG. 22B shows a pattern shape resulting from the exposure using the photomask of FIG. 22A. In FIG. 22B, it is assumed that a distance between line ends of a pair of transferred patterns (resist patterns) corresponding the pair of transparent portions 402 is a distance V.

Figure 22C:
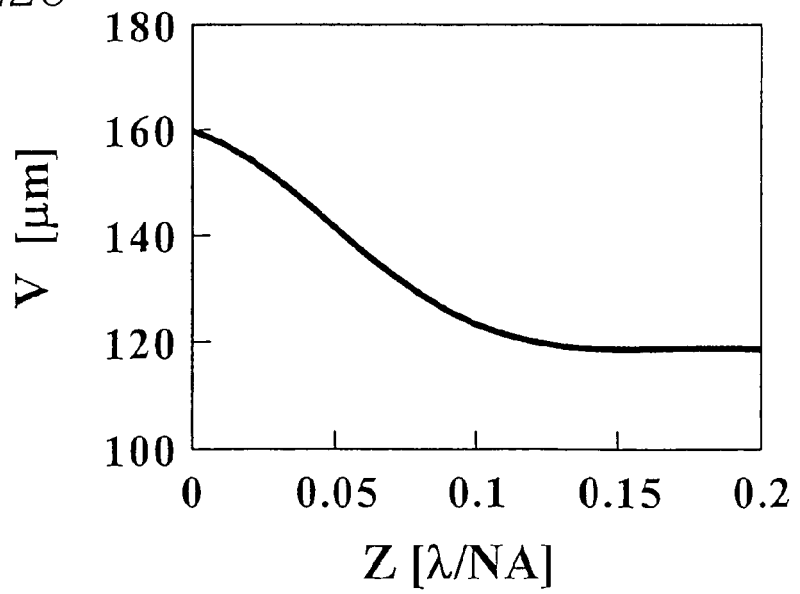

FIG. 22C shows a result of light intensity simulation carried out for calculating the distance V between the line ends of the transferred patterns (hereinafter referred to as a pattern distance) with the dimension Z (hereinafter referred to as the shifter removal dimension) variously set in the photomask of FIG. 22A with the width L set to 110 nm, the distance 2×PW set to 180 nm and the width d set to 30 nm. In this light intensity simulation, the exposure is performed with the exposure wavelength λ of 193 nm and the numerical aperture NA of 0.7. Also, as the illumination, ⅔ annular illumination having the outer diameter with a degree of coherence of 0.8 and the inner diameter with a degree of coherence of 0.53 is assumed to be used. Furthermore, the transmittance of the semi-shielding portion 401 is 6%. In FIG. 22C, the abscissa indicates the shifter removal dimension Z and the value of the shifter removal dimension Z is normalized by $\lambda/NA$. Also, in FIG. 22C, the ordinate indicates the pattern distance V.

As shown in FIG. 22C, when the shifter removal dimension Z is 0 (zero), the pattern distance V is approximately 160 nm, and as the shifter removal dimension Z is increased, the pattern distance V is reduced, namely, the recession of the line end of the transferred pattern is reduced. In this case, when the shifter removal dimension Z exceeds $0.1\times\lambda/NA$, the pattern distance V is approximately 120 nm and is not further reduced. Furthermore, when the shifter removal dimension Z is $0.03\times\lambda/NA$, the pattern distance V is reduced to approximately 140 nm. This reveals that the effect of this embodiment can be attained also when the shifter removal dimension Z is approximately $0.03\times\lambda/NA$.

Accordingly, in this embodiment, in order to prevent the line end of the transferred pattern from receding, a mask structure in which the line end of the line-shaped opening pattern is protruded beyond the phase shifter provided in parallel to the opening pattern by a given or larger dimension is preferably used. Specifically, the given dimension is preferably approximately $0.1\times\lambda/NA$ but this effect can be attained even when the given dimension is approximately $0.03\times\lambda/NA$.

In other words, the line end of the line-shaped opening pattern is preferably protruded beyond the phase shifter by a dimension of approximately $0.03\times\lambda/NA$ or more. However, in order to effectively utilize the principle of the outline enhancement method, the dimension Z of the protruded part of the opening pattern is preferably approximately $0.5\times\lambda/NA$ or less. This is for the following reason: Since a phase shifter is preferably provided in a position away from an opening pattern by a distance of approximately $0.5\times\lambda/NA$ or less, which corresponds to light interference distance, the dimension of the protruded part of the line end of the opening pattern, namely, the length of the part where the phase shifter is not provided in parallel to the opening pattern, is preferably $0.5\times\lambda/NA$ or less.

As described so far, according to this embodiment, in the case where a line-shaped space pattern is formed, in the relationship between a line-shaped opening pattern and phase shifters provided around the opening pattern, the line end of the opening pattern is protruded beyond the line end of a phase shifter disposed in parallel to the opening pattern along the line direction, so that the line end of the line-shaped space pattern can be prevented from receding.

Also in this embodiment, the photomask may have, for example, any of the cross-sectional structures shown in FIGS. 6A through 6D described in Embodiment 1.

Modification of Embodiment 4

A photomask according to a modification of Embodiment 4 of the invention will now be described with reference to the accompanying drawings.

Figure 23A:
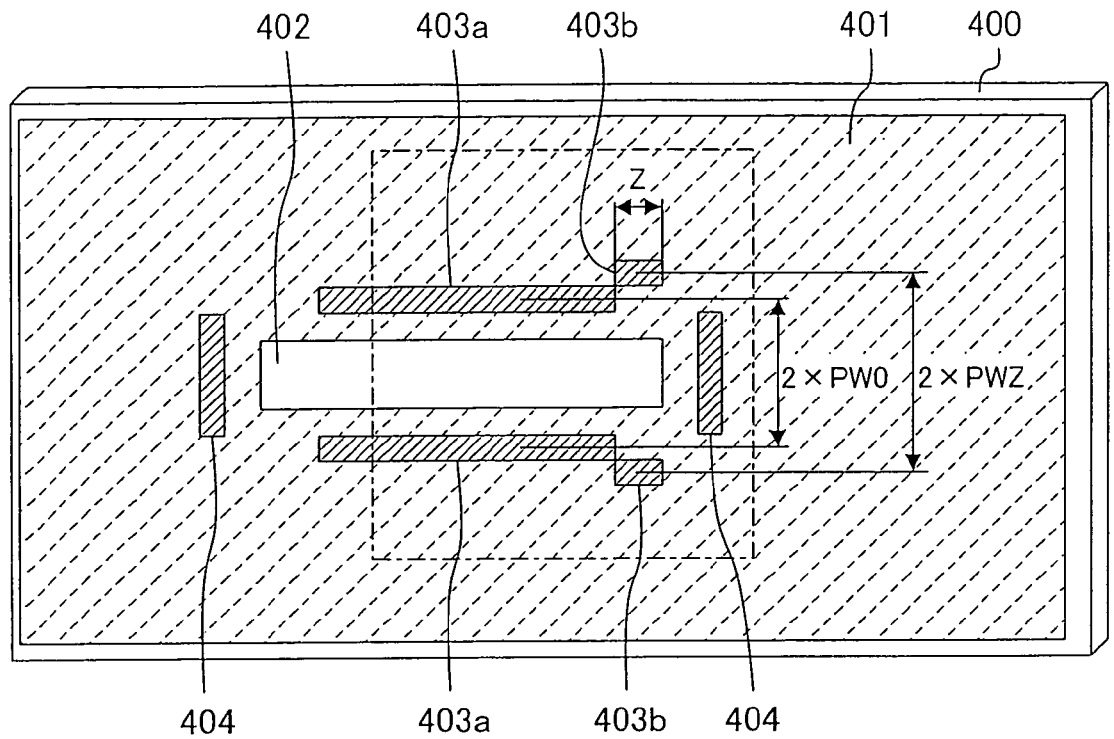
FIG. 23A is a plan view of a photomask according to a modification of Embodiment 4 and FIG. 23B is a diagram of a result of pattern formation simulation using the photomask of FIG. 23A.

FIG. 23A is a plan view of the photomask of the modification of Embodiment 4. The photomask of this modification is used for forming a fine line-shaped space pattern.

As shown in FIG. 23A, on a transparent substrate 400, a semi-shielding portion 401 is formed so as to cover a sufficiently large area. Also, in the semi-shielding portion 401, in a position corresponding to a desired space pattern to be formed on a wafer through the exposure, a line-shaped opening pattern is formed as a transparent portion 402. Furthermore, around the transparent portion 402, auxiliary patterns corresponding to phase shifters 403 and 404 are provided so as to surround the transparent portion 402 with the semi-shielding portion 401 sandwiched therebetween. Specifically, one pair of phase shifters 403 are provided so as to sandwich the transparent portion 402 and to be parallel to the transparent portion 402 along the lengthwise direction (line direction) of the transparent portion 402, and another pair of phase shifters 404 are provided so as to sandwich the transparent portion 402 and to be parallel to the transparent portion 402 along the width direction of the transparent portion 402.

As a characteristic of this modification, each phase shifter 403 extending along the line direction is composed of a phase shifter 403a provided in parallel to a line center part (more precisely, a part other than a line end part described below) of the transparent portion 402 and a phase shifter 403b provided in parallel to the line end part (more precisely, a part with a dimension Z of $0.1\times\lambda/NA$ from the line end) of the transparent portion 402. In this case, a pair of phase shifters 403a sandwiching the line center part of the transparent portion 402 are arranged, for obtaining a mask structure good for forming an isolated space pattern, in such a manner that a distance between the phase shifters 403a with the transparent portion 402 sandwiched therebetween (more precisely, a distance between the center lines of the phase shifters 403a) is a distance $PW0\times2$. On the other hand, a pair of phase shifters 403b sandwiching the line end part of the transparent portion 402 are arranged in such a manner that a distance between the phase shifters 403b with the transparent portion 402 sandwiched therebetween (more precisely, a distance between the center lines of the phase shifters 403b) is a distance $PWZ\times2$, whereas $PWZ\times2 > PW0\times2$. Also, each phase shifter 404 opposing the line end of the transparent portion 402 may be longer or shorter than the width (line width) of the transparent portion 402.

In Embodiment 4, the parts of the phase shifters 403 surrounding the line ends of the transparent portion 402 are removed, so as to increase the quantity of light passing through the transparent portion 402 (see FIG. 21A). In contrast, in this modification, parts of the phase shifters 403 surrounding the line ends of the transparent portion 402, namely, the phase shifters 403b, are disposed in positions farther from the transparent portion 402 (opening pattern), so as to increase the quantity of light passing through the opening pattern, thereby preventing the line ends of a transferred pattern from receding.

Thus, this modification can attain the same effect as that of Embodiment 4.

Figure 23B:
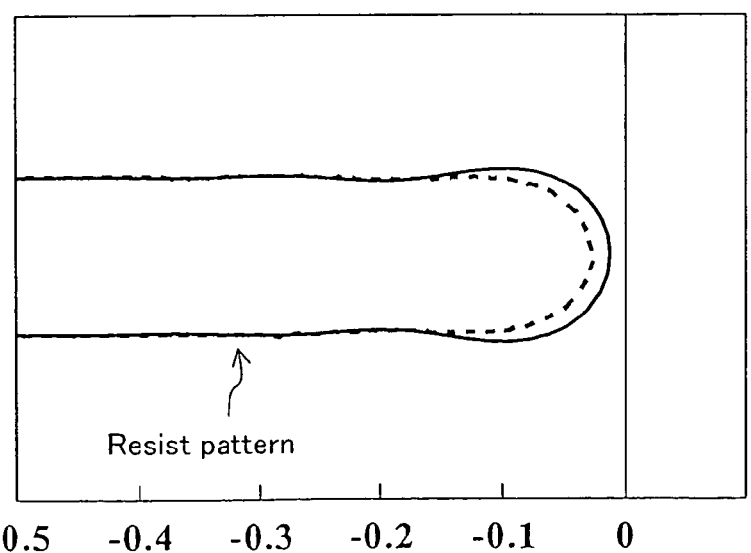

FIG. 23B shows a shape of a resist pattern formed through the exposure using the photomask of FIG. 23A obtained through simulation. On the abscissa of FIG. 23B, a position with the scale of 0 (zero) corresponds to the end of the transparent portion (open pattern) 402. Also, in FIG. 23B, a pattern shape obtained when the distance PWZ is equal to the distance PW0 (namely, when the phase shifter 403b is not farther from the transparent portion 402) is shown with a broken line and a pattern shape obtained when the distance PWZ is set to $1.2\times PW0$ (namely, when the phase shifter 403b is farther from the transparent portion 402) is shown with a solid line. The dimension Z of the phase shifter 403b is set to $0.1\times\lambda/NA$ (=approximately 270 nm). As shown in FIG. 23B, in the phase shifters provided in parallel to the opening pattern, when the parts disposed in the vicinity of the line ends of the opening pattern are disposed to be farther from the opening pattern, the line ends of the transferred pattern (resist pattern) can be prevented from receding.

Now, a result of simulation performed for quantifying the part, in the vicinity of the line end of the opening pattern, of the phase shifter to be disposed farther from the opening pattern for preventing the line end of the transferred pattern from receding will be described.

Figure 24A:
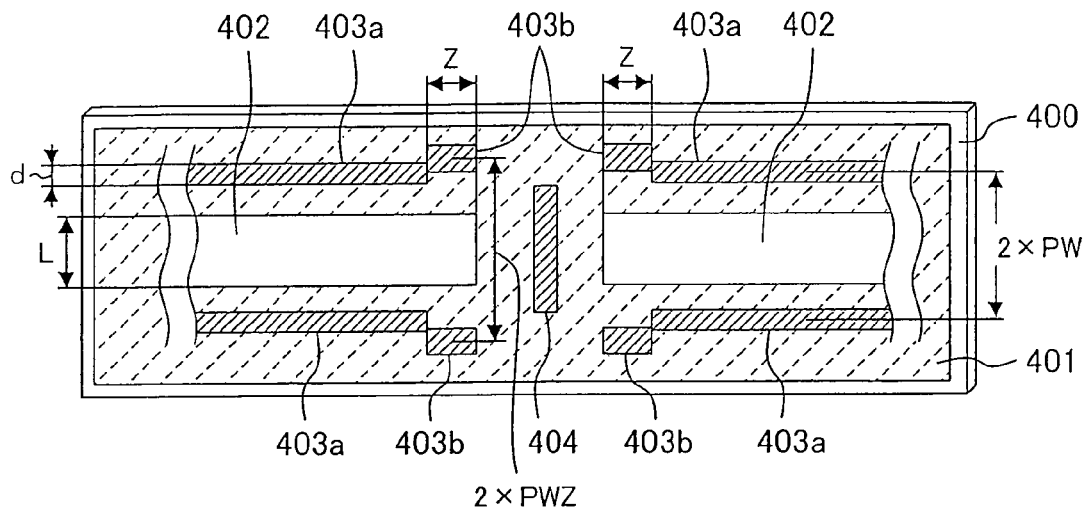
FIGS. 24A, 24B and 24C are diagrams of results of simulation performed for confirming the effect of the photomask of the modification of Embodiment 4.

FIG. 24A is a plan view of a photomask used in the simulation. In FIG. 24A, like reference numerals are used to refer to like elements shown in FIG. 23A so as to omit the description. The photomask of FIG. 24A has a similar structure to the photomask of Embodiment 4 shown in FIG. 22A except that each phase shifter 403b is provided in parallel to a part with the dimension Z from the line end of the opening pattern (transparent portion) 402.

In this case, a distance between the center lines of the pair of phase shifters 403b sandwiching the line end part of the transparent portion 402 is a distance 2×PWZ. Also, a distance between the center lines of the pair of phase shifters 403a sandwiching the line center part of the transparent portion 402 is a distance 2×PW.

Figure 24B:
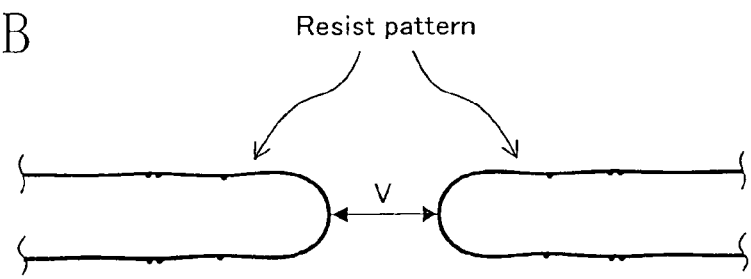

FIG. 24B shows a pattern shape resulting from the exposure using the photomask of FIG. 24A. In FIG. 24B, it is assumed that a distance between line ends of a pair of transferred patterns (resist patterns) corresponding to the pair of transparent portions 402 is a distance V.

Figure 24C:
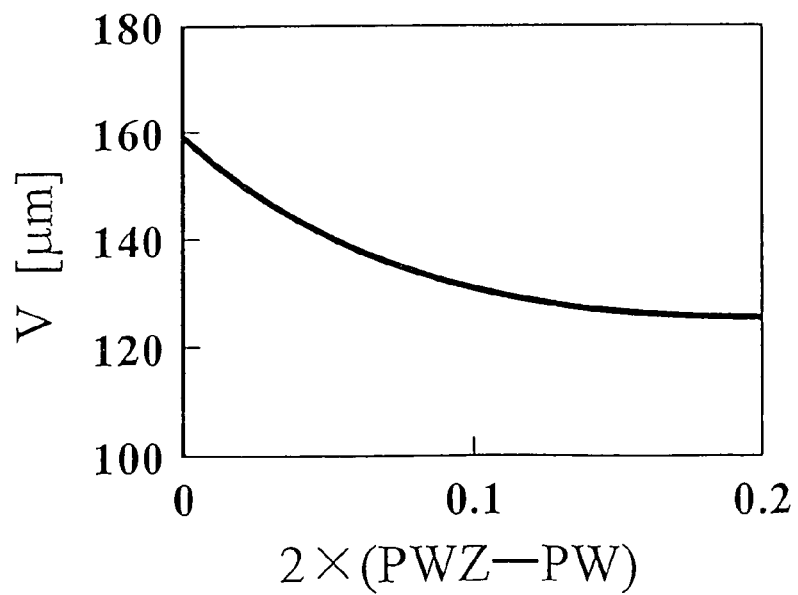

FIG. 24C shows a result of light intensity simulation carried out for calculating the distance (pattern distance) V between the line ends of the transferred patterns with the distance 2×PWZ (hereinafter referred to as the shifter distance) variously set in the photomask of FIG. 24A with the width L set to 110 nm, the distance 2×PW set to 180 nm, the width d set to 30 nm and the dimension Z set to 270 nm. In this light intensity simulation, the exposure is performed with the exposure wavelength λ of 193 nm and the numerical aperture NA of 0.7. Also, as the illumination, ⅔ annular illumination having the outer diameter with a degree of coherence of 0.8 and the inner diameter with a degree of coherence of 0.53 is assumed to be used. Furthermore, the transmittance of the semi-shielding portion 401 is 6%. In FIG. 24C, the abscissa indicates 2×(PWZ−PW), that is, increment of the shifter distance 2×PWZ, normalized by λ/NA, and the ordinate indicates the pattern distance V.

As shown in FIG. 24C, when 2×(PWZ−PW) is 0 (zero), the pattern distance V is approximately 160 nm, and as 2×(PWZ−PW) is increased, the pattern distance V is reduced, namely, the recession of the line end of the transferred pattern is reduced. In this case, when the value of 2×(PWZ−PW) exceeds 0.1×λ/NA, the pattern distance V is approximately 120 nm and is not further reduced. Furthermore, when the value of 2×(PWZ−PW) is 0.03×λ/NA, the pattern distance V is reduced to approximately 140 nm. This reveals that the effect of this modification can be attained also when 2×(PWZ−PW) is approximately 0.03×λ/NA.

Accordingly, in this modification, in order to prevent the line end of a transferred pattern from receding, a mask structure in which a distance 2×PWZ between a pair of phase shifters provided in parallel to the line end part of a line-shaped opening pattern is larger than a distance 2×PW between a pair of phase shifters provided in parallel to the line center part of the opening pattern by a given or larger dimension is preferably used. Specifically, the given dimension is preferably approximately 0.1×λ/NA but this effect can be attained even when the given dimension is approximately 0.03×λ/NA.

In other words, 2×(PWZ−PW) is preferably approximately 0.03×λ/NA or more. However, in order to effectively utilize the principle of the outline enhancement method, PWZ−L/2 is preferably approximately 0.5×λ/NA or less. This is for the following reason: Since a phase shifter is preferably provided in a position away from an opening pattern by a distance of approximately 0.5×λ/NA or less, which corresponds to light interference distance, PWZ−L/2, namely, the distance of the phase shifter from the opening pattern, is preferably 0.5×λ/NA or less.

In this modification, similarly to Embodiment 4, the dimension Z (namely, the length of the phase shifter 403b) is preferably not less than approximately 0.03×λ/NA and not more than approximately 0.5×λ/NA.

EMBODIMENT 5

A pattern formation method according to Embodiment 5 of the invention, and more specifically, a pattern formation method using a photomask according to any of Embodiments 1 through 4 (and modifications of these embodiments) (hereinafter referred to as the present photomask), will be described with reference to the accompanying drawings.

FIGS. 25A through 25D are cross-sectional views for showing procedures in the pattern formation method of this embodiment.

Figure 25A:
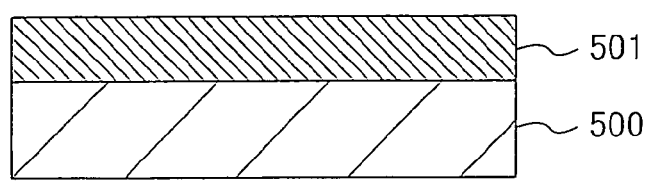
FIGS. 25A, 25B, 25C and 25D are cross-sectional views for showing procedures in a pattern formation method according to Embodiment 5 of the invention.
Figure 25B:
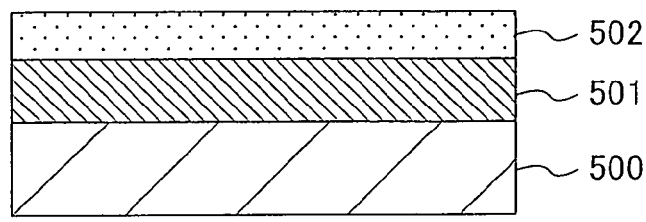

First, as shown in FIG. 25A, a target film 501 of, for example, a metal film or an insulating film is formed on a substrate 500. Thereafter, as shown in FIG. 25B, for example, a positive resist film 502 is formed on the target film 501.

Figure 25C:
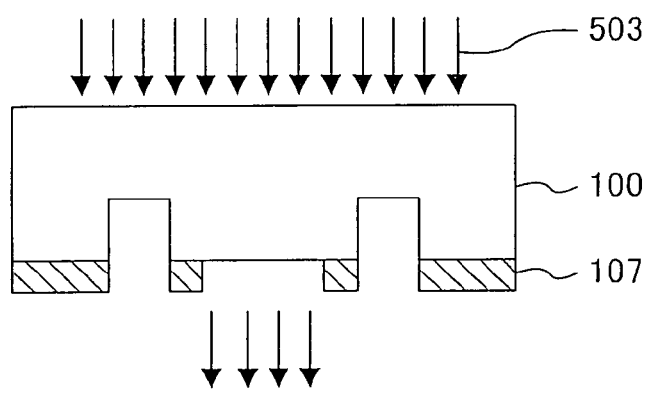

Next, as shown in FIG. 25C, the resist film 502 is irradiated with exposing light 503 through the present photomask, such as the photomask according to Embodiment 1 shown in FIG. 2A (more specifically, the photomask having the cross-sectional structure of FIG. 6C). Thus, the resist film 502 is exposed to the exposing light 503 having passed through the photomask.

On the transparent substrate 100 of the photomask used in the procedure shown in FIG. 25C, the semi-shielding film (thin film) 107 corresponding to the semi-shielding portion is formed, and in the semi-shielding film 107, the opening corresponding to a contact pattern to be transferred through the exposure is formed. Furthermore, in the semi-shielding film 107 around the opening, other openings corresponding to phase shifter forming regions are provided, and the transparent substrate 100 below (above in the drawings) each of these other openings is trenched, so as to form the phase shifters corresponding to auxiliary patterns.

In this embodiment, in the exposure performed in FIG. 25C, the resist film 502 is subjected to the exposure by using an oblique incident exposure light source. In this case, since the semi-shielding portion having low transmittance is used as the shielding pattern, the entire resist film 502 is exposed at weak energy. However, as shown in FIG. 25C, it is only a latent image portion 502a of the resist film 502 corresponding to the contact pattern, namely, the opening (transparent portion) of the photomask, that is irradiated at exposure energy sufficiently high for allowing the resist to dissolve in subsequent development.

Figure 25D:
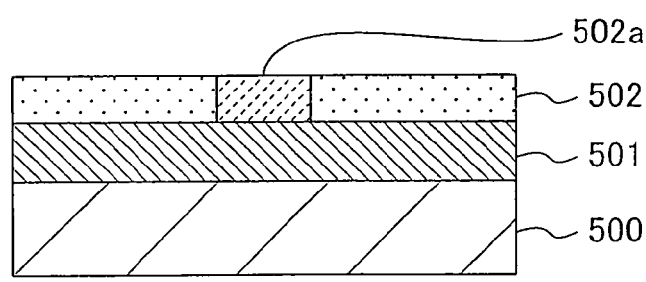

Next, as shown in FIG. 25D, the resist film 502 is developed so as to remove the latent image portion 502a. Thus, a resist pattern 504 having a fine contact pattern is formed.

According to Embodiment 5, since the pattern formation method is carried out by using the present photomask (specifically, the photomask according to Embodiment 1), the same effects as those described in Embodiment 1 can be attained. Specifically, the substrate (wafer) on which the resist is applied is subjected to the oblique incident exposure through the present photomask. At this point, since the phase shifters are arranged on the photomask so as to maximize the depth of focus and the exposure margin, a fine contact pattern with a large depth of focus and a large exposure margin can be formed.

Although the photomask according to Embodiment 1 is used in Embodiment 5, in the case where a photomask according to any of Embodiments 2 through 4 is used instead, the same effects as those described in the corresponding embodiment can be attained.

Although the positive resist process is employed in Embodiment 5, the same effects can be attained by employing the negative resist process instead.

In Embodiment 5, oblique incident illumination (off-axis illumination) is preferably used in the procedure shown in FIG. 25C for irradiating the resist film. Thus, the exposure margin and the focus margin in the pattern formation can be improved. In other words, a fine pattern can be formed with a good defocus characteristic.

Figure 26A:
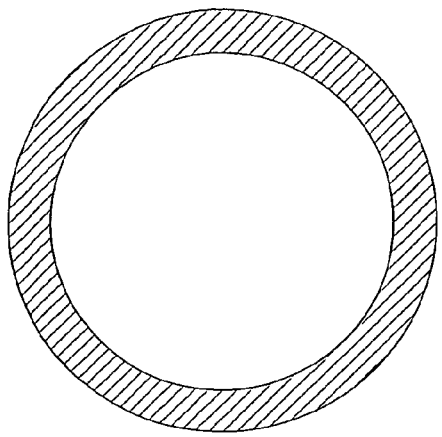
FIG. 26A is a diagram for showing the shape of a general exposure light source and FIGS. 26B, 26C and 26D are diagrams for showing the shapes of oblique incident exposure light sources.
Figure 26B:
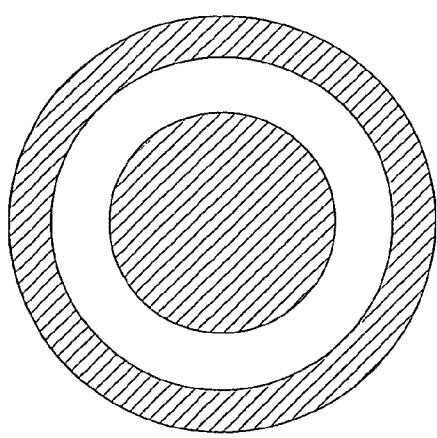
Figure 26C:
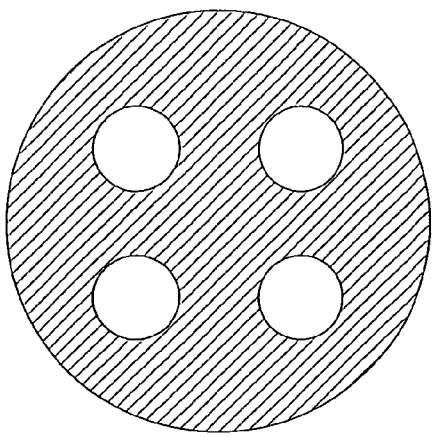
Figure 26D:
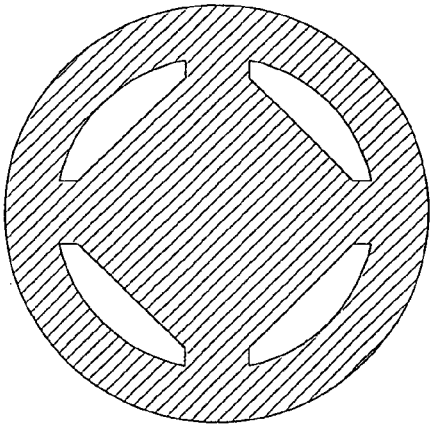

Furthermore, herein, the oblique incident light source means a light source as shown in any of FIGS. 26B through 26D obtained by removing a vertical incident component from a general exposure light source of FIG. 26A. Typical examples of the oblique incident light source are an annular exposure light source of FIG. 26B and a quadrupole exposure light source of FIG. 26C. In the case where a contact pattern is formed, the annular exposure light source is preferably used. Alternatively, in the case where a line-shaped space pattern is formed, the quadrupole exposure light source is preferably used. Furthermore, in the case where a contact pattern and a line-shaped space pattern are both formed, an annular/quadrupole exposure light source of FIG. 26D is preferably used. As a characteristic of this annular/quadrupole exposure light source, assuming the XY coordinate system with the center of the light source (the center of a general exposure light source) corresponding to the origin, the annular/quadrupole exposure light source has a characteristic of the quadrupole exposure light source when portions at the center and on the X and Y axes of the light source are removed, and has a characteristic of the annular exposure light source when the outline of the light source is in a circular shape.

In the case where the annular exposure light source, namely, annular illumination, is employed, the light source preferably has an outer diameter of 0.7 or more. Herein, the illumination radius of a reduction projection aligner is indicated by using a unit normalized by the numerical aperture NA. This is a value corresponding to interference in the general illumination (the general exposure light source). Now, the reason why the light source with the outer diameter of 0.7 or more is preferably used will be described in detail.

FIGS. 27A through 27E are diagrams for explaining the dependency, obtained through simulation, of an exposure characteristic of the present photomask on the diameter of the annular illumination.

Figure 27A:
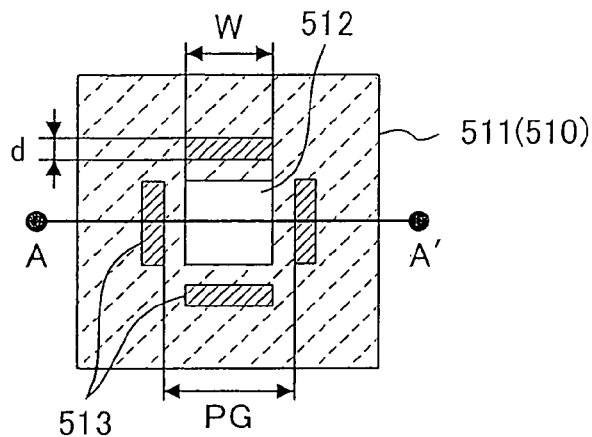
FIGS. 27A, 27B, 27C, 27D and 27E are diagrams for explaining a result of simulation performed for obtaining the dependency of an exposure characteristic of the photomask of this invention on the diameter of annular illumination.

FIG. 27A is a plan view of a photomask used in the simulation. As shown in FIG. 27A, a semi-shielding portion 511 is formed on a transparent substrate 510 so as to cover a sufficiently large area. In the semi-shielding portion 511, an opening pattern corresponding to a transparent portion 512 is formed in a position corresponding to a desired contact pattern to be formed on a wafer through the exposure. Also, auxiliary patterns corresponding to phase shifters 513 are provided around the transparent portion 512, for example, so as to be parallel to respective sides of the transparent portion 512 in a square shape or a rectangular shape.

It is assumed that the transparent portion 512 has a side dimension W of 130 nm, that each phase shifter 513 has a width d of 40 nm and that a distance PG between a pair of phase shifters 513 sandwiching the transparent portion 512 is 220 nm. Also, the exposure is performed in the simulation under conditions of the exposure wavelength λ of 193 nm and the numerical aperture NA of 0.7. In other words, various values are set in the simulation so as to obtain an optimum photomask for the illumination system.

Figure 27C:
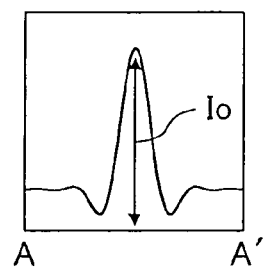
Figure 27B:
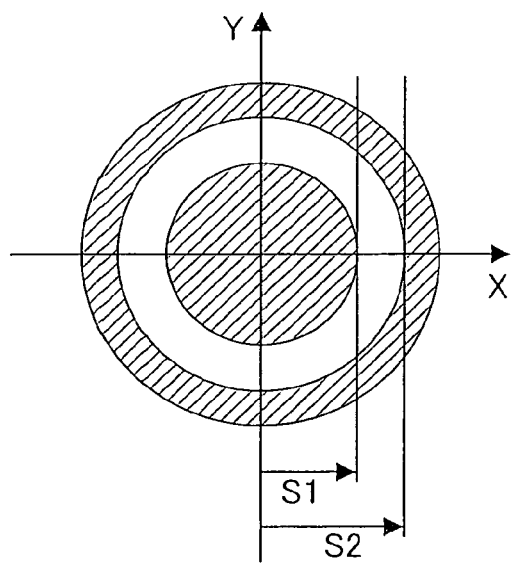

FIG. 27B shows the annular illumination (annular exposure light source) used in the exposure using the photomask of FIG. 27A. As shown in FIG. 27B, the inner diameter of the annular illumination is indicated by S1 and the outer diameter thereof is indicated by S2, whereas the diameters S1 and S2 are expressed by using values normalized by the numerical aperture NA.

FIG. 27C shows a light intensity distribution formed on a wafer (in a position corresponding to line AA' of FIG. 27A) through the exposure using the photomask of FIG. 27A performed by using the annular illumination of FIG. 27B. As shown in FIG. 27C, a peak value of the light intensity obtained in a position corresponding to the opening (transparent portion 512) of the photomask of FIG. 27A is indicated by Io. As the peak intensity Io is higher, an optical image with higher contrast can be formed.

Figure 27D:
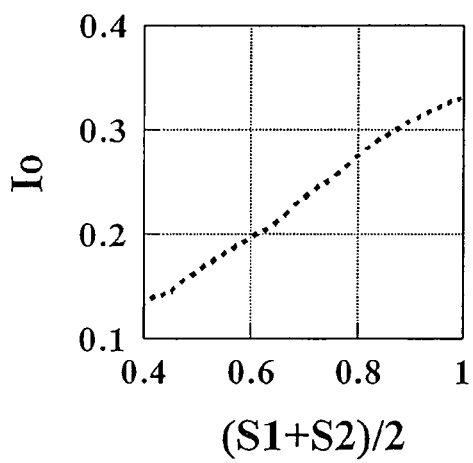

FIG. 27D is a graph obtained by plotting the values of the peak intensity Io obtained through simulation in which a value S2−S1 is fixed to 0.01 and a value (S1+S2)/2 is changed from 0.4 to 0.95 in the annular illumination of FIG. 27B. As shown in FIG. 27D, in the present photomask, as an illumination region (light source region) of the annular illumination is distributed in an area farther from the center of the illumination system (light source), the contrast is higher.

Figure 27E:
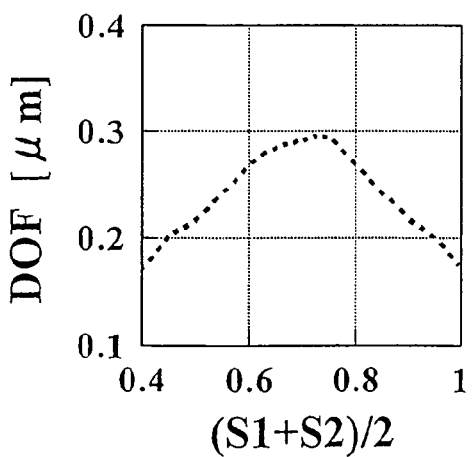

FIG. 27E is a graph obtained by plotting the values of the depth of focus (DOF) obtained through simulation in which a contact hole pattern with a dimension of 100 nm is formed by using the photomask of FIG. 27A with the value (S2−S1) fixed to 0.01 and the value (S1+S2)/2 changed from 0.4 to 0.95 in the annular illumination of FIG. 27B. As shown in FIG. 27E, in the present photomask, when the illumination region of the annular illumination is distributed in an area away from the center of the illumination system by 0.7 or more, the depth of focus is the maximum.

Specifically, it is understood from the results shown in the graphs of FIGS. 27D and 27E that the illumination region of the annular illumination preferably includes a region away from the center of the illumination system by 0.7 or more in order to simultaneously attain high contrast and a large depth of focus.

EMBODIMENT 6

A mask data creation method according to Embodiment 6 of the invention will now be described with reference to the accompanying drawings. In this embodiment, mask data for a photomask according to any of Embodiments 1 through 4 (hereinafter referred to as the present photomask) is created.

Before describing a specific flow of the mask data creation method, conditions for realizing highly accurate pattern dimension control by using the present photomask will be described.

In the present photomask, a dimension of a pattern to be formed after exposure, namely, a CD (critical dimension), depends upon both a phase shifter (auxiliary pattern) and a transparent portion. However, when either of the transparent portion and the phase shifter is fixed, a possible pattern dimension is determined.

Figure 28:
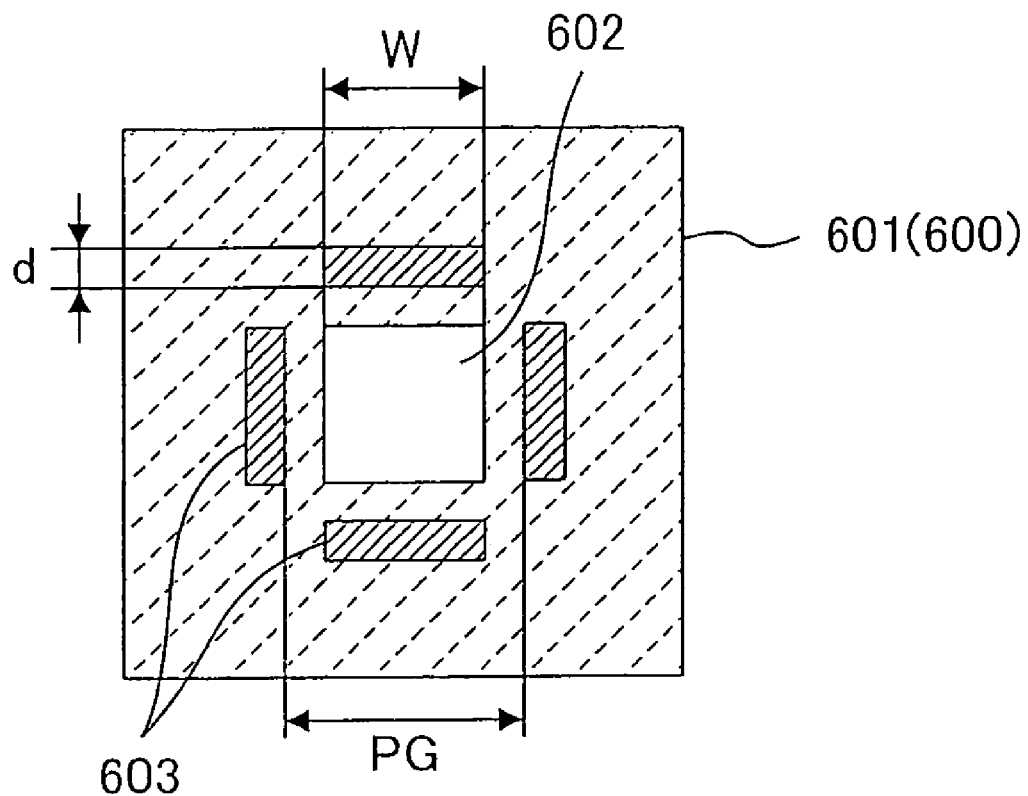
FIG. 28 is a plan view of a photomask used in explanation of a mask data creation method according to Embodiment 6 of the invention.

The following description is given by exemplifying a photomask shown in FIG. 28. As shown in FIG. 28, a semi-shielding portion 601 is formed on a transparent substrate 600 so as to cover a sufficiently large area. An opening pattern corresponding to a transparent portion 602 is provided in a position in the semi-shielding portion 601 corresponding to a desired contact pattern to be formed on a wafer through the exposure. Also, auxiliary patterns corresponding to phase shifters 603 are provided around the transparent portion 602 with the semi-shielding portion 601 sandwiched therebetween, for example, so as to be parallel to respective sides of the transparent portion 602 in a square shape or a rectangular shape. It is assumed that the transparent portion 602 has a width W. Also, in this embodiment, among the phase shifters 603 surrounding the transparent portion 602, phase shifters 603 paring with each other with the transparent portion 603 sandwiched therebetween are designated as outline shifters, and a distance (between the inner sides) of the outline shifters is designated as an internal distance PG of the outline shifters.

In such a photomask, when the internal distance PG is fixed to a value PGC, the maximum CD realizable by this photomask is determined. In this photomask, the CD is changed in proportion to the width W, and the width W never exceeds the value PGC. Accordingly, a CD attained when the width W is the value PGC is the possible maximum CD. Herein, the maximum CD determined when the internal distance PG of the outline shifters is determined is designated as the allowable maximum CD.

On the contrary, when the width W is fixed to a value WC in the photomask, the minimum CD realizable by the photomask is determined. In this photomask, the CD is changed in proportion to the internal distance PG, and the internal distance PG never becomes smaller than the value WC. Accordingly, a CD attained when the internal distance PG is the value WC is the possible minimum CD. Herein, the minimum CD determined when the width W is determined is designated as the allowable minimum CD.

Accordingly, in this embodiment, the internal distance PG is determined at the first stage so that the maximum allowable CD obtained based on a desired CD can be larger than the desired CD, and thereafter, the width W for realizing the desired CD is highly accurately calculated in consideration of an accurate close relationship between patterns. In this manner, it is possible to realize a mask data creation method in which a pattern dimension can be highly accurately controlled.

Now, the flow of the mask data creation method of this embodiment will be described in detail.

Figure 29:
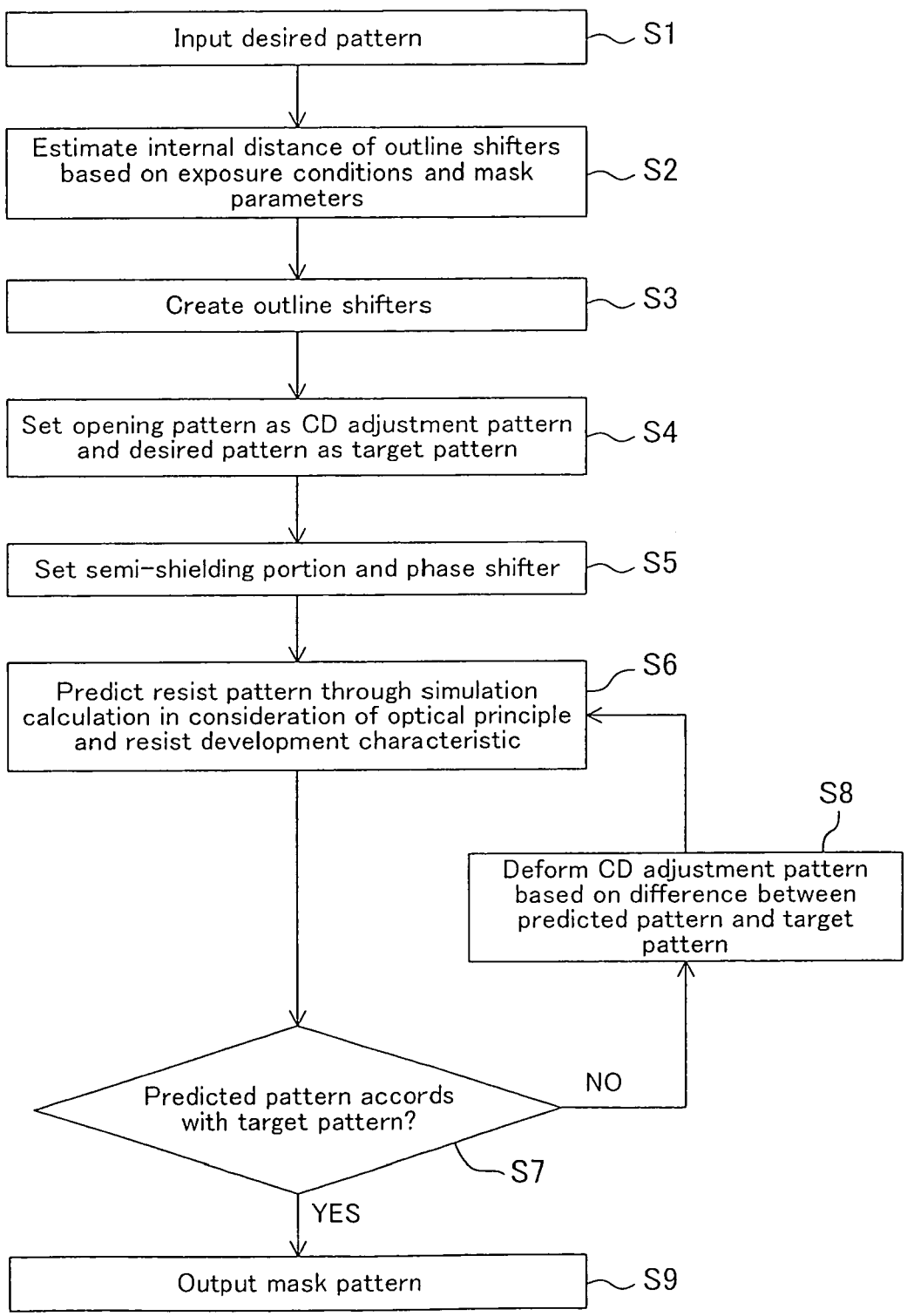
FIG. 29 is a flowchart of the mask data creation method of Embodiment 6.

FIG. 29 is a basic flowchart for the mask data creation method of this embodiment. Also, FIGS. 30A through 30C, 31A and 31B are diagrams of exemplified mask patterns formed in respective procedures of the mask data creation method of this embodiment.

Figure 30A:
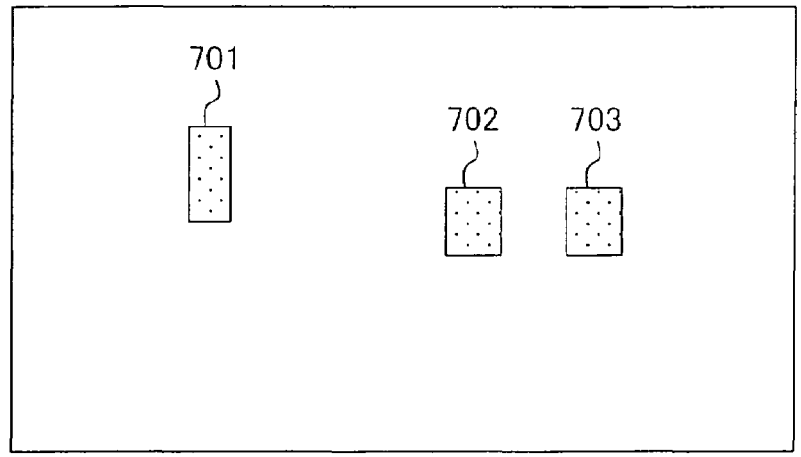
FIGS. 30A, 30B and 30C are diagrams for showing specific examples of mask patterns obtained in respective procedures in the mask data creation method of Embodiment 6.
Figure 30B:
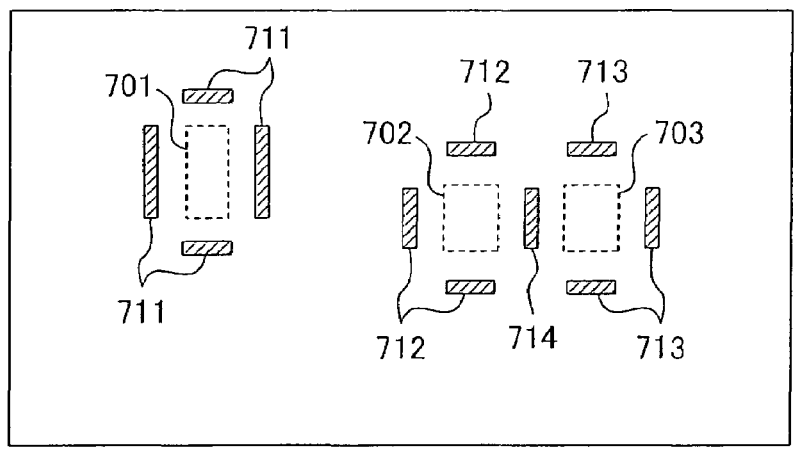

FIG. 30A shows a desired pattern to be formed by the present photomask, and more specifically, shows an example of a design pattern corresponding to transparent portions (openings) of the present photomask. Specifically, patterns 701 through 703 shown in FIG. 30A are patterns corresponding to regions of a resist to be sensitized through the exposure using the present photomask.

It is noted that the positive resist process is assumed to be employed in the pattern formation of this embodiment unless otherwise mentioned. In other words, the description is given on the assumption that an exposed region of a resist is removed through development and an unexposed region of the resist remains as a resist pattern. Accordingly, when the negative resist process is employed instead of the positive resist process, the description can be similarly applied by assuming that an exposed region of a resist remains as a resist pattern and an unexposed region is removed.

First, in step S1, the desired patterns 701 through 703 of FIG. 30A are input to a computer used for the mask data creation. At this point, the transmittances of a phase shifter and a semi-shielding portion used in the mask pattern are respectively set.

Next, in step S2, the internal distance of outline shifters necessary for each of the desired patterns 701 through 703 is estimated on the basis of exposure conditions and mask parameters such as the transmittances of the phase shifter and the semi-shielding portion. At this point, the internal distance of each pair of outline shifters is preferably set with respect to each pattern (i.e., each desired exposed region in the resist) in consideration of the close relationship between the respective patterns (hereinafter referred to as the pattern close relationship). However, the necessary condition is that the allowable maximum CD determined correspondingly to the internal distance of the outline shifters is larger than the desired CD and therefore, the internal distance of the outline shifters can be set, for example, by uniformly increasing the desired CD, whereas the desired CD should be increased by a value exceeding the CD that changes depending upon the pattern close relationship.

Next, in step S3, the outline shifters are created. At this point, the internal distance PG of the outline shifters is one determined in step S2. Also, at this point, the width of each outline shifter is preferably changed in accordance with the pattern close relationship, but the width may be uniformly set if the margin of a pattern formation characteristic falls within an allowable range. However, in the case where a distance between outline shifters (i.e., phase shifters) respectively corresponding to adjacent patterns is as small as an allowable value or less of a mask processing characteristic, these outline shifters may be combined to create one phase shifter. Specifically, as shown in, for example, FIG. 30B, outline shifters 711 through 714 are created correspondingly to the desired patterns 701 through 703. In this case, the outline shifters 711 through 713 are outline shifters respectively peculiar to and corresponding to the desired patterns 701 through 703. Also, the outline shifter 714 is created by combining outline shifters respectively corresponding to the desired patterns 702 and 703. In other words, the outline shifter 714 is an outline shifter shared between the desired patterns 702 and 703.

Figure 30C:
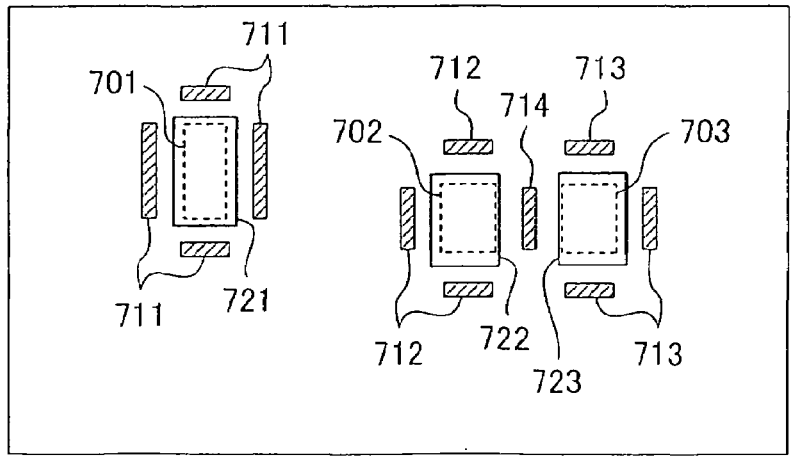

Next, in step S4, preparation is made for processing for adjusting the dimension of the mask pattern so that a pattern with a desired dimension can be formed correspondingly to the opening pattern (the transparent portion) of the photomask through the exposure using the present photomask (namely, OPC processing). In this embodiment, since the phase shifters (outline shifters) have been determined in step S3, the dimensions of the transparent portions alone are adjusted in the OPC processing, thereby creating photomask data for realizing the desired CD. Therefore, for example, as shown in FIG. 30C, opening patterns 721 through 723 corresponding to the transparent portions are set on the insides of the outline shifters 711 through 714 created in step S3, and the opening patterns 721 through 723 are set as CD adjustment patterns. At this point, the desired patterns 701 through 703 are set as target patterns to be formed. Also, the outline shifters 711 through 714 are not deformed for the CD adjustment but are set as patterns present on the mask and as reference patterns to be referred to in CD prediction.

Figure 31A:
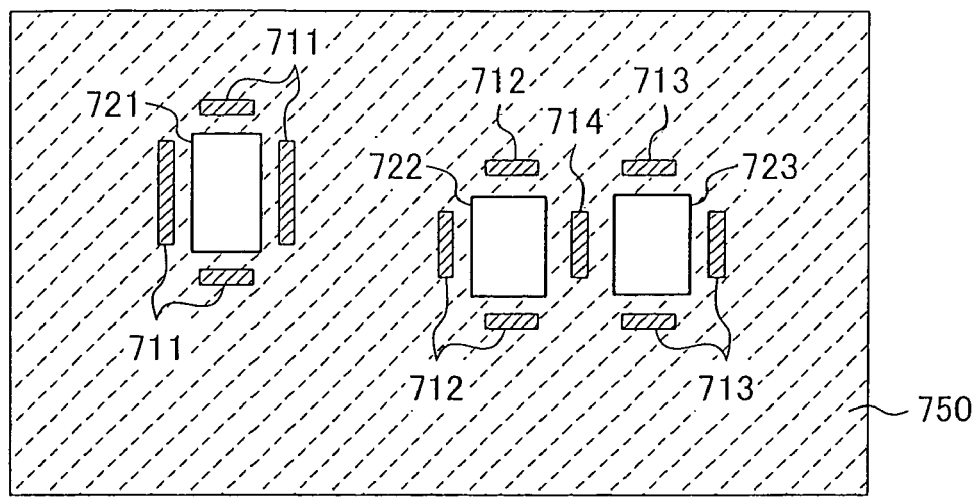
FIGS. 31A and 31B are diagrams for showing specific examples of mask patterns obtained in respective procedures in the mask data creation method of Embodiment 6.

Next, in step S5, as shown in FIG. 31A, a semi-shielding portion 750 for partially transmitting exposing light in the identical phase with respect to the opening patterns 721 through 723 is set as the background of the photomask, namely, on the outsides of the opening patterns 721 through 723 and the outline shifters 711 through 714. It is noted that the outline shifters 711 through 714 are set as phase shifters for transmitting the exposing light in the opposite phase with respect to the opening patterns 721 through 723.

Subsequently, in steps S6, S7 and S8, the OPC processing (such as model base OPC processing) is carried out. Specifically, in step S6, a dimension of a resist pattern (more strictly, a dimension of an exposed region of the resist) formed by using the present photomask is predicted through simulation performed in consideration of the optical principle, a resist development characteristic, and an etching characteristic or the like if necessary. Subsequently, in step S7, it is determined whether or not the predicted dimension of the pattern accords with the dimension of the desired target pattern. When the predicted dimension does not accord with the desired dimension, the CD adjustment pattern is deformed in step S8 on the basis of a difference between the predicted dimension and the desired dimension, so as to deform the mask pattern.

Figure 31B:
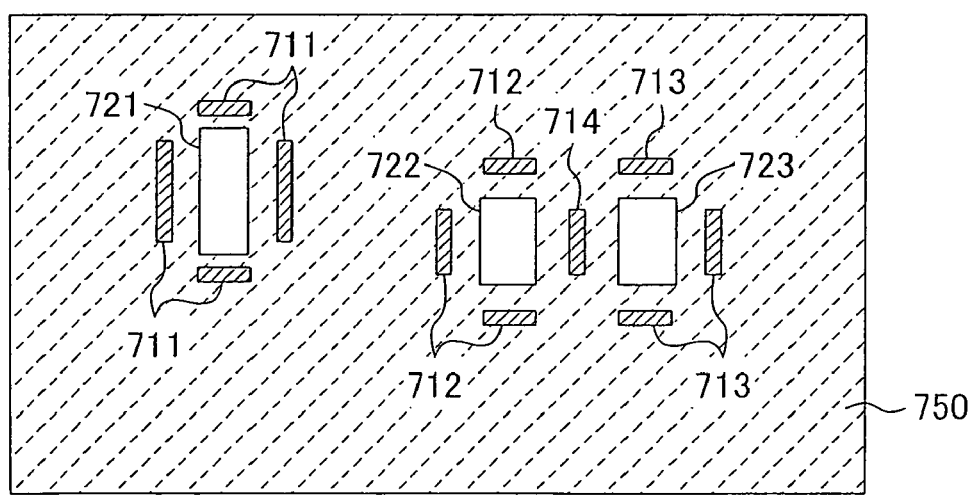

As a characteristic of this embodiment, the outline shifters for realizing the desired CD are previously determined in step S3, and the CD adjustment patterns set in step S4 alone are deformed in steps S6 through S8, so as to obtain the mask pattern for forming the pattern with the desired dimension. Specifically, the procedures in steps S6 through S8 are repeated until the predicted dimension of the pattern accords with the desired dimension, so that the mask pattern for forming the pattern with the desired dimension can be ultimately output in step S9. FIG. 31B shows an example of the mask pattern output in step S9.

When the present photomask having the mask pattern created by the mask data creation method of Embodiment 6 is used in the exposure of a wafer on which a resist has been applied, contrast of light passing through the opening patterns is emphasized by the outline shifters provided around the opening patterns. Therefore, fine space patterns can be formed in regions of the resist corresponding to the opening patterns.

Furthermore, since an outline enhancement mask that can definitely realize a desired CD can be created in Embodiment 6, a fine space pattern can be accurately formed in a desired dimension.

In step S2 of this embodiment, the internal distance of the outline shifters is set by uniformly increasing the desired CD. However, as described in Embodiment 3, in order to attain a good pattern formation characteristic, a distance from the center of an opening pattern to a phase shifter is preferably changed in accordance with the pattern close relationship. Specifically, in Embodiment 3, the preferable position of a phase shifter is defined by using a distance from the center of the opening pattern to the center line of the phase shifter. Accordingly, in this embodiment, when the internal distance of the outline shifters is calculated on the basis of this distance, mask pattern data of a photomask exhibiting a better fine pattern formation characteristic can be created.

Furthermore, in step S3 of this embodiment, the widths of the outline shifters provided around the respective desired patterns are uniformly set. However, as described in Embodiment 2, the widths of the outline shifters are more preferably changed in accordance with the pattern close relationship. Specifically, also in this embodiment, when the width of each outline shifter, namely, each phase shifter, is changed in accordance with the distance to an adjacent outline shifter as described in Embodiment 2, mask pattern data of a photomask exhibiting a better fine pattern formation characteristic can be created.

Although the width of the phase shifter is determined after determining the internal distance of the outline shifters in Embodiment 6, the internal distance of the outline shifters may be determined after determining the width of the phase shifter instead.

Moreover, in Embodiment 6, the description is given with respect to a transmission photomask, which does not limit the invention. The present invention is applicable to a reflection mask by replacing the transmission phenomenon of exposing light with the reflection phenomenon by, for example, replacing the transmittance with reflectance.

What is claimed is:

1. A pattern formation method using a photomask, comprising the steps of:
   (a) forming a resist film on a substrate;
   (b) irradiating said resist film with the exposing light through said photomask, and
   (c) forming a resist pattern by developing said resist film after irradiation with the exposing light,
   wherein said photomask comprises, on a transparent substrate:
   a semi-shielding portion having a transmitting property against exposing light;
   a transparent portion surrounded with said semi-shielding portion and having a transmitting property against the exposing light; and
   an auxiliary pattern surrounded with said semi-shielding portion and provided around said transparent portion,
   wherein part of said semi-shielding portion is interposed between said transparent portion and said auxiliary pattern,
   said transparent portion is smaller than a rectangle with a side of $(0.8 \times \lambda \times M)/NA$,
   said auxiliary pattern is a rectangular pattern and has a center line thereof in a position away from the center of said transparent portion by a distance not less than $(0.3 \times \lambda \times M)/NA$ and not more than $(0.5 \times \lambda \times M)/NA$,
   said semi-shielding portion and said transparent portion transmit the exposing light in an identical phase with respect to each other,
   said auxiliary pattern transmits the exposing light in an opposite phase with respect to said semi-shielding portion and said transparent portion and is not transferred through exposure, and
   $\lambda$ indicates a wavelength of the exposing light, and M and NA respectively indicate magnification and numerical aperture of a reduction projection optical system of a projection aligner.

2. The pattern formation method of claim 1,
   wherein in said photomask, said auxiliary pattern has a width not less than $(0.05 \times \lambda \times M)/(NA \times T^{0.5})$ and not more than $(0.2 \times \lambda \times M)/(NA \times T^{0.5})$, wherein T indicates relative transmittance of said auxiliary pattern to said transparent portion.

3. The pattern formation method of claim 1,
   wherein in said photomask, said auxiliary pattern has a center line thereof in a position away from the center of said transparent portion by a distance not less than $(0.365 \times \lambda \times M)/NA$ and not more than $(0.435 \times \lambda \times M)/NA$.

4. The pattern formation method of claim 1,
   wherein in said photomask, said transparent portion has a rectangular, polygonal or circular shape.

5. The pattern formation method of claim 1,
   wherein in said photomask, said auxiliary pattern consists of four rectangular patterns.

6. The pattern formation method of claim 1,
   wherein in said photomask, a transmittance of said semi-shielding portion is 3% or more and 15% or less with respect to said exposing light.

7. The pattern formation method of claim 1,
wherein in said photomask, a transmittance of said auxiliary pattern with respect to said exposing light is larger than at least the transmittance of said semi-shielding portion.

8. The pattern formation method of claim 1,
wherein in said photomask, a transmittance of said auxiliary pattern with respect to said exposing light is equivalent to a transmittance of said transparent portion.

9. The pattern formation method of claim 1,
wherein in said photomask,
said transparent portion is formed by exposing said transparent substrate,
said auxiliary pattern is formed by depositing, on said transparent substrate, a first phase shift film that causes, in the exposing light, a phase difference in an opposite phase with respect to said transparent portion, and
said semi-shielding portion is formed by depositing, on said first phase shift film, a second phase shift film that causes, in the exposing light, a phase difference in an opposite phase with respect to said first phase shift film.

10. The pattern formation method of claim 1,
wherein in said photomask,
said transparent portion is formed by exposing said transparent substrate,
said auxiliary pattern is formed by trenching said transparent substrate by a depth for causing, in the exposing light, a phase difference in an opposite phase with respect to said transparent portion, and
said semi-shielding portion is formed by depositing, on said transparent substrate, a semi-shielding film that transmits the exposing light in an identical phase with respect to said transparent portion.

11. The pattern formation method of claim 1,
wherein in said photomask,
said transparent portion is formed by exposing said transparent substrate,
said auxiliary pattern is formed by trenching said transparent substrate by a depth for causing, in the exposing light, a phase difference in an opposite phase with respect to said transparent portion, and
said semi-shielding portion is formed by depositing, on said transparent substrate, a metal thin film that transmits the exposing light in an identical phase with respect to said transparent portion.

12. The pattern formation method of claim 1,
wherein in said photomask,
said auxiliary pattern is formed by exposing said transparent substrate,
said transparent portion is formed by trenching said transparent substrate by a depth for causing, in the exposing light, a phase difference in an opposite phase with respect to said auxiliary pattern, and
said semi-shielding portion is formed by depositing, on said transparent substrate, a phase shift film that causes, in the exposing light, a phase difference in an opposite phase with respect to said auxiliary pattern.

13. The pattern formation method of claim 1,
wherein oblique incident illumination is employed in the step (b).

14. A pattern formation method using a photomask, comprising the steps of:
(a) forming a resist film on a substrate;
(b) irradiating said resist film with the exposing light through said photomask, and
(c) forming a resist pattern by developing said resist film after irradiation with the exposing light,
wherein said photomask comprises, on a transparent substrate:
a semi-shielding portion having a transmitting property against exposing light;
a transparent portion surrounded with said semi-shielding portion and having a transmitting property against the exposing light; and
an auxiliary pattern surrounded with said semi-shielding portion and provided around said transparent portion,
wherein part of said semi-shielding portion is interposed between said transparent portion and said auxiliary pattern,
said transparent portion is in the shape of a line with a width in a short side direction smaller than $(0.65 \times \lambda \times M)/NA$,
said auxiliary pattern is a rectangular pattern and has a center line thereof in a position away from the center of said transparent portion by a distance not less than $(0.25 \times \lambda \times M)/NA$ and not more than $(0.45 \times \lambda \times M)/NA$,
said semi-shielding portion and said transparent portion transmit the exposing light in an identical phase with respect to each other,
said auxiliary pattern transmits the exposing light in an opposite phase with respect to said semi-shielding portion and said transparent portion and is not transferred through exposure, and
$\lambda$ indicates a wavelength of the exposing light, and M and NA respectively indicate magnification and numerical aperture of a reduction projection optical system of a projection aligner.

15. The pattern formation method of claim 14,
wherein in said photomask,
said transparent portion has a longitudinal dimension of $(2 \times \lambda \times M)/NA$ or more.

16. The pattern formation method of claim 14,
wherein in said photomask,
said auxiliary pattern has a width not less than $(0.05 \times \lambda \times M)/(NA \times T^{0.5})$ and not more than $(0.2 \times \lambda \times M)/(NA \times T^{0.5})$, wherein T indicates relative transmittance of said auxiliary pattern to said transparent portion.

17. The pattern formation method of claim 14,
wherein in said photomask, said auxiliary pattern has a center line thereof in a position away from the center of said transparent portion by a distance not less than $(0.275 \times \lambda \times M)/NA$ and not more than $(0.425 \times \lambda \times M)/NA$.

18. The pattern formation method of claim 14,
wherein in said photomask,
said auxiliary pattern is disposed in parallel to said transparent portion along a line direction of said transparent portion, and
said transparent portion has a line end protruded beyond said auxiliary pattern by a given or larger dimension along the line direction.

19. The pattern formation method of claim 14,
wherein oblique incident illumination is employed in the step (b).

20. A pattern formation method using a photomask, comprising the steps of:
(a) forming a resist film on a substrate;
(b) irradiating said resist film with the exposing light through said photomask, and
(c) forming a resist pattern by developing said resist film after irradiation with the exposing light,
wherein said photomask comprises, on a transparent substrate:
a semi-shielding portion having a transmitting property against exposing light;

a first transparent portion surrounded with said semi-shielding portion and having a transmitting property against the exposing light;

an auxiliary pattern surrounded with said semi-shielding portion and provided around said first transparent portion, and a second transparent portion surrounded with said semi-shielding portion and having a transmitting property against the exposing light, wherein part of said semi-shielding portion is interposed between said first transparent portion and said auxiliary pattern, said auxiliary pattern includes a first auxiliary pattern disposed in an area sandwiched between said first transparent portion and said second transparent portion and a second auxiliary pattern disposed in the other area, said semi-shielding portion and said first and second transparent portions transmit the exposing light in an identical phase with respect to each other, and said auxiliary pattern transmits the exposing light in an opposite phase with respect to said semi-shielding portion and said first and second transparent portions and is not transferred through exposure.

21. The pattern formation method of claim 20, wherein in said photomask, said first auxiliary pattern is adjacent to a different auxiliary pattern spaced by a given or smaller distance with said semi-shielding portion sandwiched therebetween, said second auxiliary pattern is not adjacent to a different auxiliary pattern spaced by said given or smaller distance with said semi-shielding portion sandwiched therebetween, and said first auxiliary pattern has a smaller width than said second auxiliary pattern.

22. The pattern formation method of claim 20, wherein in said photomask, said first transparent portion is smaller than a rectangle with a side of $(0.8 \times \lambda \times M)/NA$, wherein $\lambda$ indicates a wavelength of the exposing light, and M and NA respectively indicate magnification and numerical aperture of a reduction projection optical system of a projection aligner.

23. The pattern formation method of claim 20, wherein in said photomask, said first transparent portion is in the shape of a line with a width in a short side direction smaller than $(0.65 \times \lambda \times M)/NA$, wherein $\lambda$ indicates a wavelength of the exposing light, and M and NA respectively indicate magnification and numerical aperture of a reduction projection optical system of a projection aligner.

24. The pattern formation method of claim 20, wherein oblique incident illumination is employed in the step (b).

* * * * *